(12) United States Patent
Urano et al.

(10) Patent No.: US 8,967,827 B2
(45) Date of Patent: Mar. 3, 2015

(54) LEAD FRAME, WIRING BOARD, LIGHT EMITTING UNIT, AND ILLUMINATING APPARATUS

(75) Inventors: Yoji Urano, Osaka (JP); Ryoji Yokotani, Osaka (JP); Ikko Kuzuhara, Niigata (JP); Kenichiro Tanaka, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 80 days.

(21) Appl. No.: 13/641,483

(22) PCT Filed: Apr. 26, 2011

(86) PCT No.: PCT/JP2011/060193
§ 371 (c)(1),
(2), (4) Date: Oct. 16, 2012

(87) PCT Pub. No.: WO2011/136236
PCT Pub. Date: Nov. 3, 2011

(65) Prior Publication Data
US 2013/0070452 A1 Mar. 21, 2013

(30) Foreign Application Priority Data

Apr. 26, 2010 (JP) .................. 2010-101182
May 31, 2010 (JP) .................. 2010-125097
Mar. 29, 2011 (JP) .................. 2011-072772
Mar. 29, 2011 (JP) .................. 2011-072773
Mar. 29, 2011 (JP) .................. 2011-072774

(51) Int. Cl.
*F21S 4/00* (2006.01)
*F21V 21/00* (2006.01)
(Continued)

(52) U.S. Cl.
CPC .............. *H05K 1/0203* (2013.01); *F21K 9/17* (2013.01); *F21K 9/30* (2013.01); *F21K 9/90* (2013.01);
(Continued)

(58) Field of Classification Search
CPC ............. F21V 9/00; F21V 9/08; F21V 29/00; F21V 29/18; F21V 21/00; H01L 29/18; H01L 2924/00; H01L 2924/00014; H01L 2924/12041; H01L 2224/45124; H01L 2224/48137; H01L 2224/45144; H01L 2224/48091; H05K 2201/10106; F21Y 2101/02
USPC ......... 362/249, 373, 218, 547, 235, 221–222, 362/249.02, 800; 174/250–268
See application file for complete search history.

(56) References Cited

U.S. PATENT DOCUMENTS 5,660,461 A  8/1997 Ignatius et al.
(Continued)

FOREIGN PATENT DOCUMENTS

JP  10-502772  3/1998
JP  11-162233  6/1999
(Continued)

OTHER PUBLICATIONS

International Search Report Issued on Jun. 21, 2011.

*Primary Examiner* — Jason Moon Han
(74) *Attorney, Agent, or Firm* — Greenblum & Bernstein, P.L.C.

(57) ABSTRACT

Provided is lead frame in which a wiring pattern supported by a support piece inside of a one-pitch outer frame section comprises a plurality of base units, each of which comprises a die pad on which a solid-state light emitting element is mounted, a heat sink extending from die pad so as to surround die pad electrically connected to one electrode of the element, and a lead electrically connected to the other electrode of the element. Lead of one base unit among adjacent base units and heat sink of the other base unit are coupled and electrically connected in series. Increase in temperature of the element is inhibited, light output is increased, and cost of a light emitting unit in which a plurality of solid-state light emitting elements connected in series are used is reduced. Also provided are wiring board, light emitting unit, and illuminating apparatus.

12 Claims, 57 Drawing Sheets

(51) Int. Cl.
*H05K 1/02* (2006.01)
*F21K 99/00* (2010.01)
*F21V 19/00* (2006.01)
*H05K 1/18* (2006.01)
*F21V 29/00* (2006.01)
*H01L 25/075* (2006.01)
*H01L 33/48* (2010.01)
*H01L 33/62* (2010.01)
*H05K 1/05* (2006.01)
*H05K 3/20* (2006.01)
*F21Y 101/02* (2006.01)
*F21Y 103/00* (2006.01)
*F21Y 105/00* (2006.01)
*H01L 23/00* (2006.01)

(52) U.S. Cl.
CPC .............. *F21V 19/004* (2013.01); *H05K 1/181* (2013.01); *F21V 29/2256* (2013.01); *H01L 25/0753* (2013.01); *H01L 33/486* (2013.01); *H01L 33/62* (2013.01); *H05K 1/0271* (2013.01); *H05K 1/056* (2013.01); *H05K 3/202* (2013.01); *F21Y 2101/02* (2013.01); *F21Y 2103/003* (2013.01); *F21Y 2105/001* (2013.01); *H05K 2201/10106* (2013.01); *H01L 2224/73265* (2013.01); *H01L 2224/45124* (2013.01); *H01L 2224/45144* (2013.01); *H01L 2224/48091* (2013.01); *H01L 2224/48137* (2013.01); *H01L 2224/48228* (2013.01); *H01L 2224/49113* (2013.01); *H01L 24/45* (2013.01); *H01L 2224/48227* (2013.01); *H01L 2924/12041* (2013.01); *Y10S 362/80* (2013.01)
USPC ...................... 362/249.02; 362/800

(56) References Cited

U.S. PATENT DOCUMENTS

| | | | |
|---|---|---|---|
| 6,489,637 | B1 | 12/2002 | Sakamoto et al. |
| 6,548,832 | B1 | 4/2003 | Sakamoto et al. |
| 6,730,933 | B1 | 5/2004 | Shimizu et al. |
| 7,690,817 | B2* | 4/2010 | Sanpei et al. .................. 362/294 |
| 7,869,675 | B2 | 1/2011 | Urano |
| 7,903,410 | B2* | 3/2011 | Cho et al. ....................... 361/704 |
| 2005/0207165 | A1* | 9/2005 | Shimizu et al. ................ 362/362 |
| 2008/0043444 | A1 | 2/2008 | Hasegawa et al. |
| 2008/0123056 | A1* | 5/2008 | Matsubara ....................... 353/20 |
| 2008/0128739 | A1* | 6/2008 | Sanpei et al. .................... 257/99 |
| 2008/0198552 | A1* | 8/2008 | Cho et al. ....................... 361/704 |
| 2008/0273327 | A1* | 11/2008 | Wilcox et al. .................. 362/267 |
| 2009/0296413 | A1* | 12/2009 | Fukui ............................ 362/373 |
| 2010/0163914 | A1 | 7/2010 | Urano |
| 2011/0169037 | A1 | 7/2011 | Hasegawa et al. |

FOREIGN PATENT DOCUMENTS

| | | |
|---|---|---|
| JP | 2000-353826 | 12/2000 |
| JP | 2001-044512 | 2/2001 |
| JP | 2001-57446 | 2/2001 |
| JP | 2001-203395 | 7/2001 |
| JP | 2006-066631 | 3/2006 |
| JP | 2006-093470 | 4/2006 |
| JP | 2006-147999 | 6/2006 |
| JP | 2007-035890 | 2/2007 |
| JP | 2007-258619 A | 10/2007 |
| JP | 2009-54894 | 3/2009 |
| JP | 2009-076576 | 4/2009 |
| JP | 2009-105379 | 5/2009 |
| JP | 2009-130299 | 6/2009 |
| JP | 2009-130300 | 6/2009 |
| JP | 2009-266432 | 11/2009 |
| KR | 10-0610650 B1 | 8/2006 |
| WO | 2008/078791 | 7/2008 |
| WO | 2009/119461 | 10/2009 |

* cited by examiner

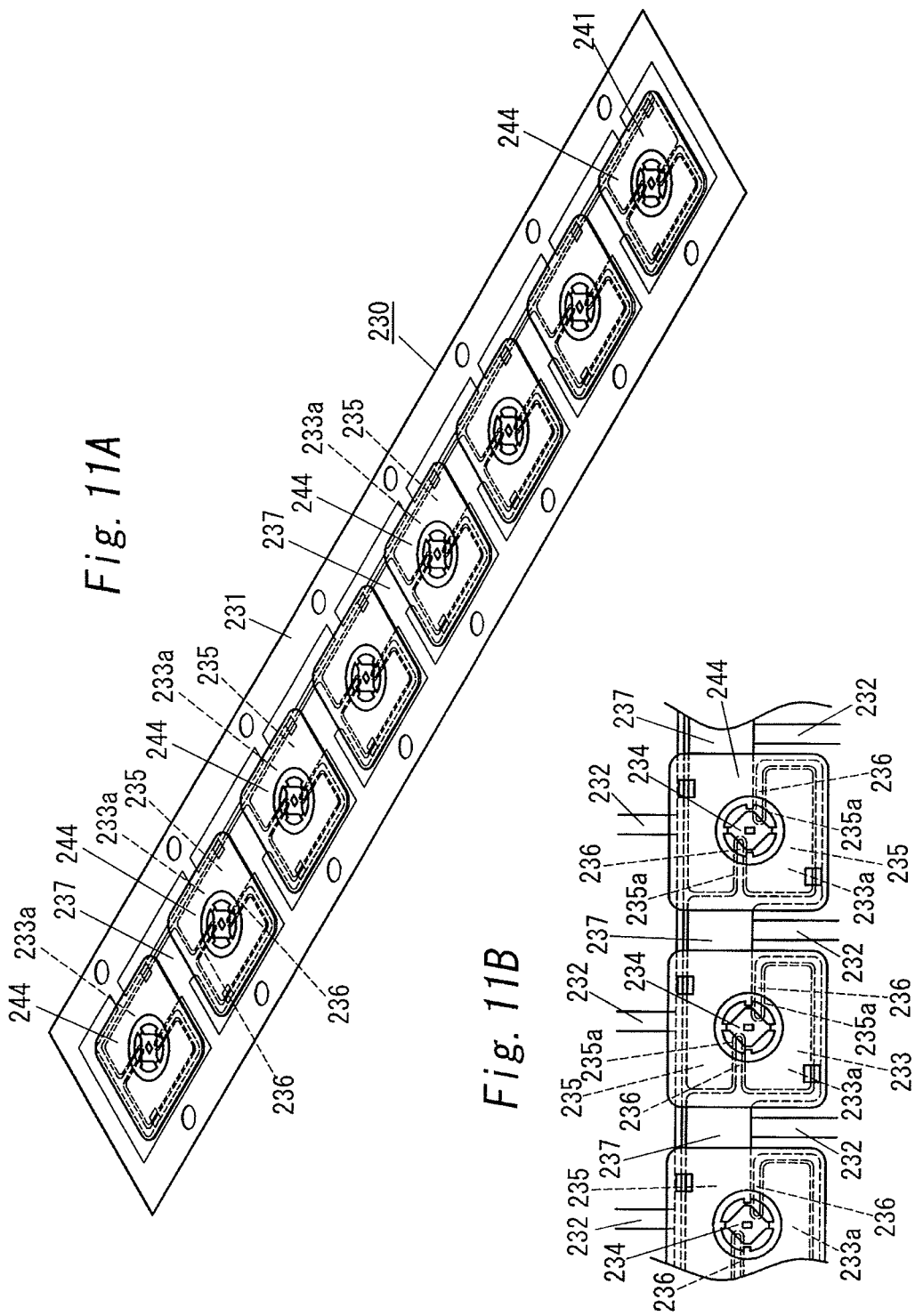

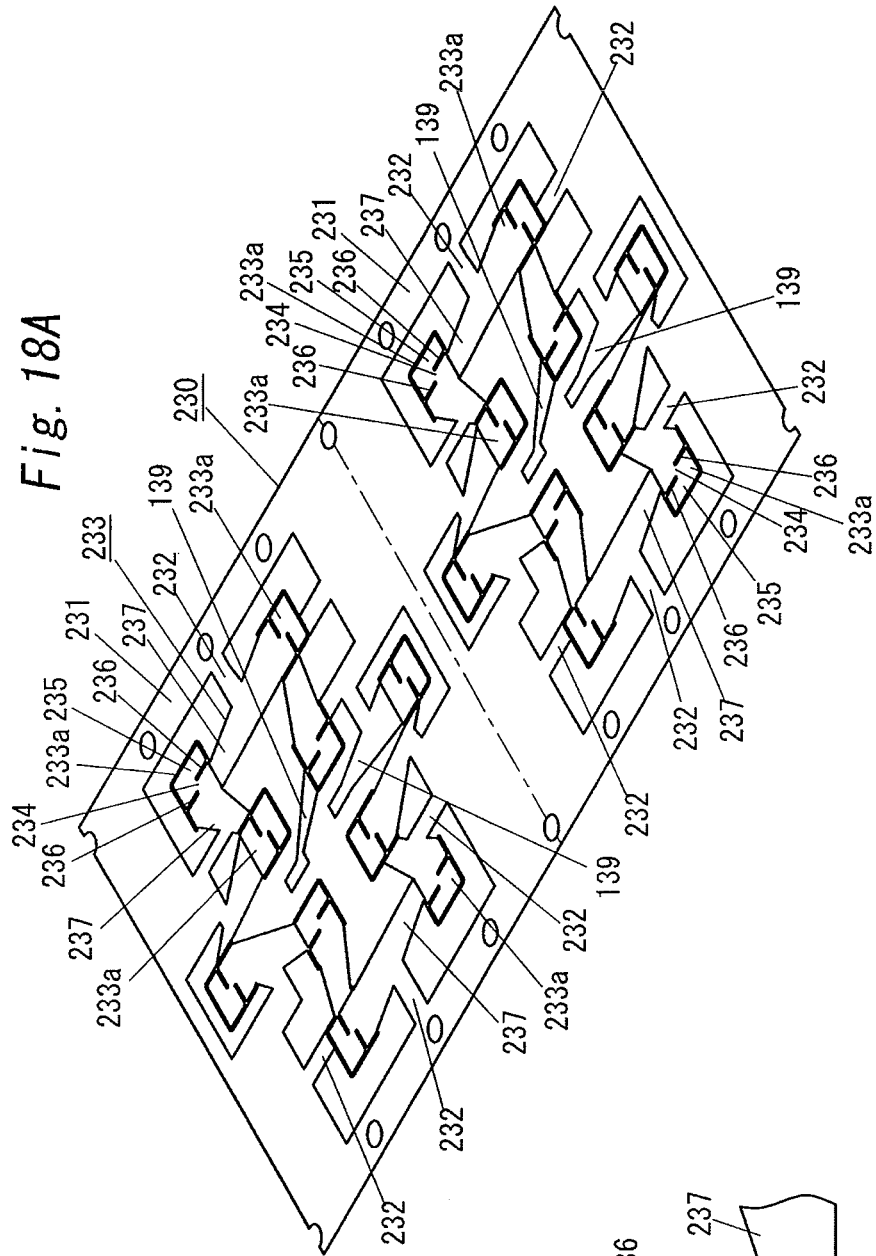

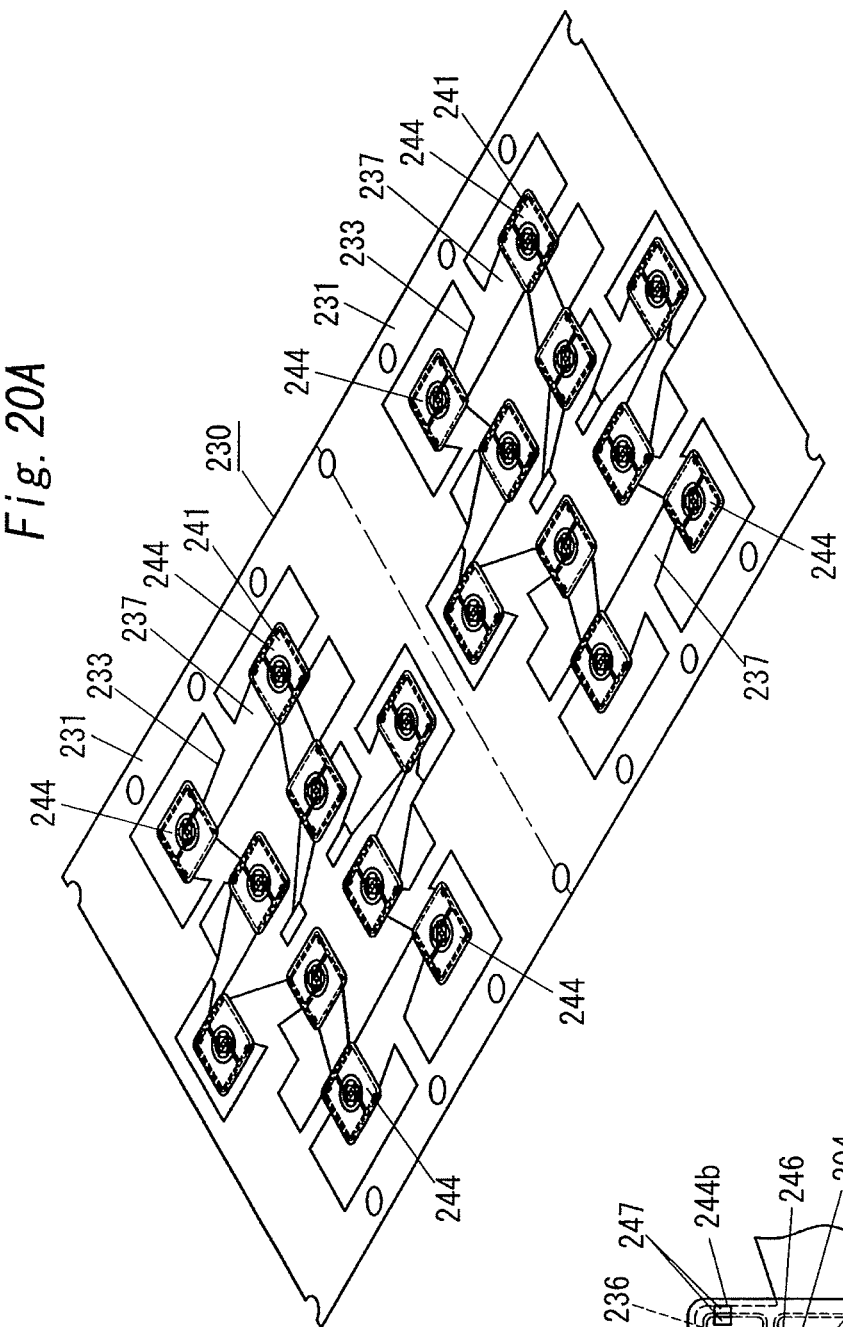
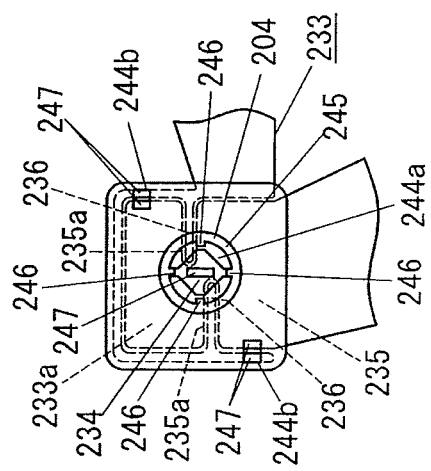
Fig. 20A
Fig. 20B

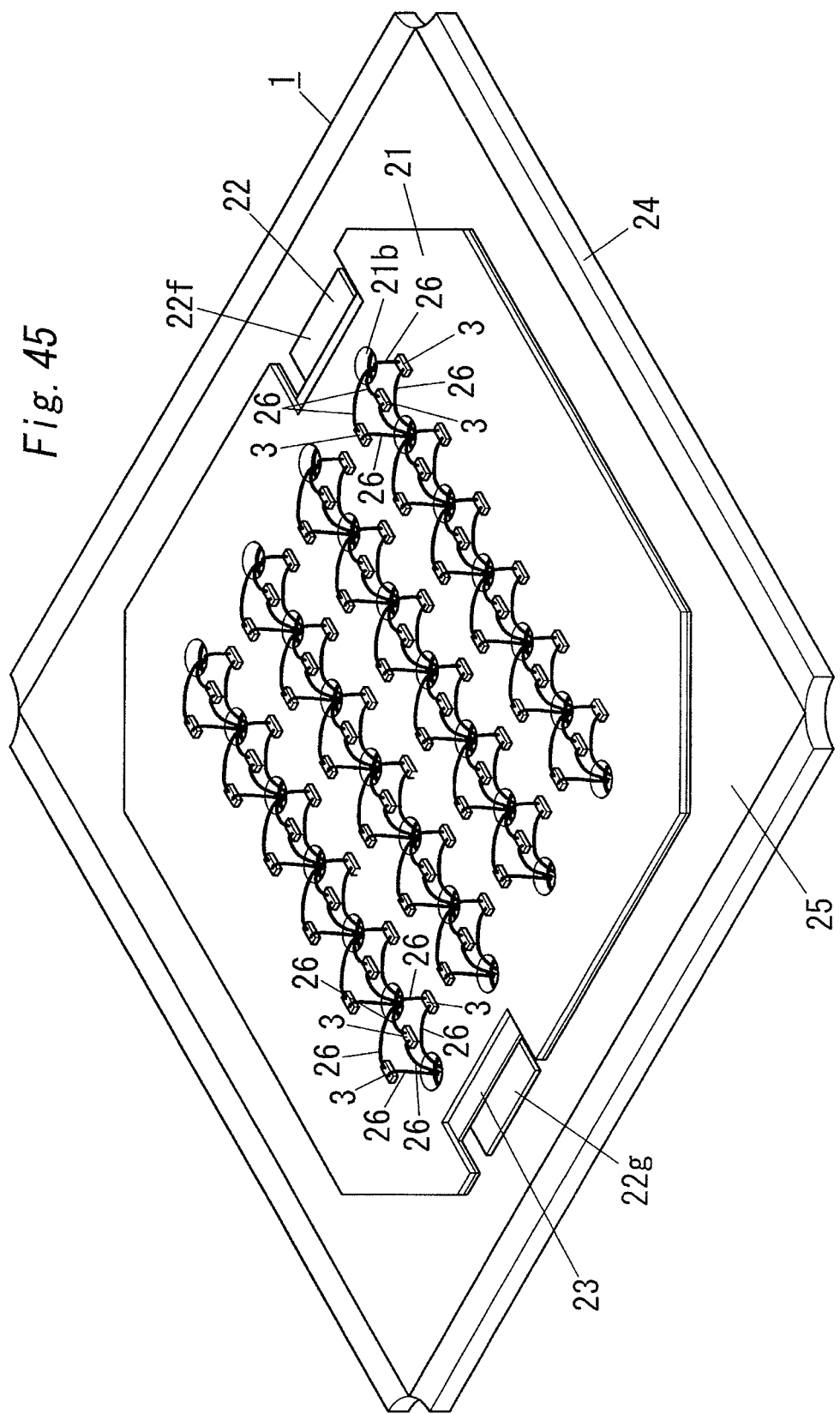

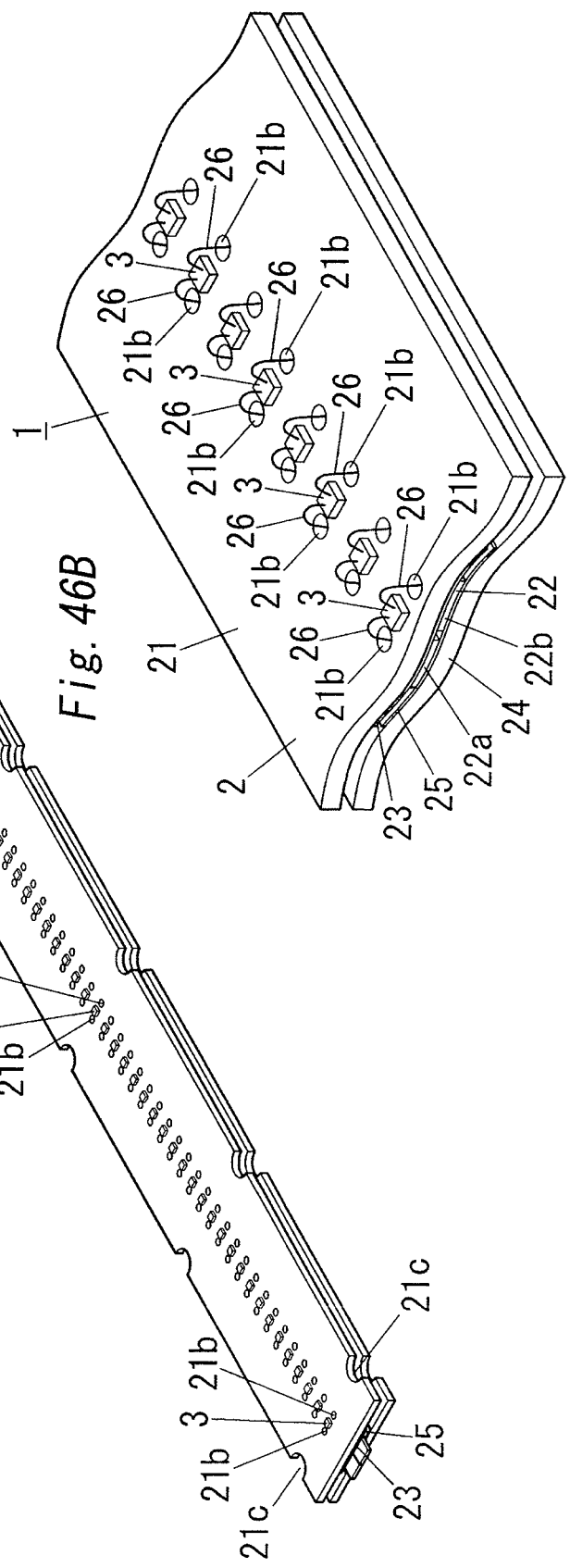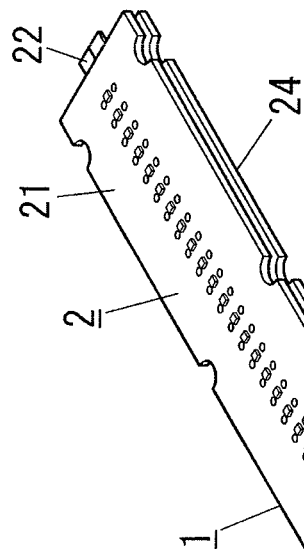

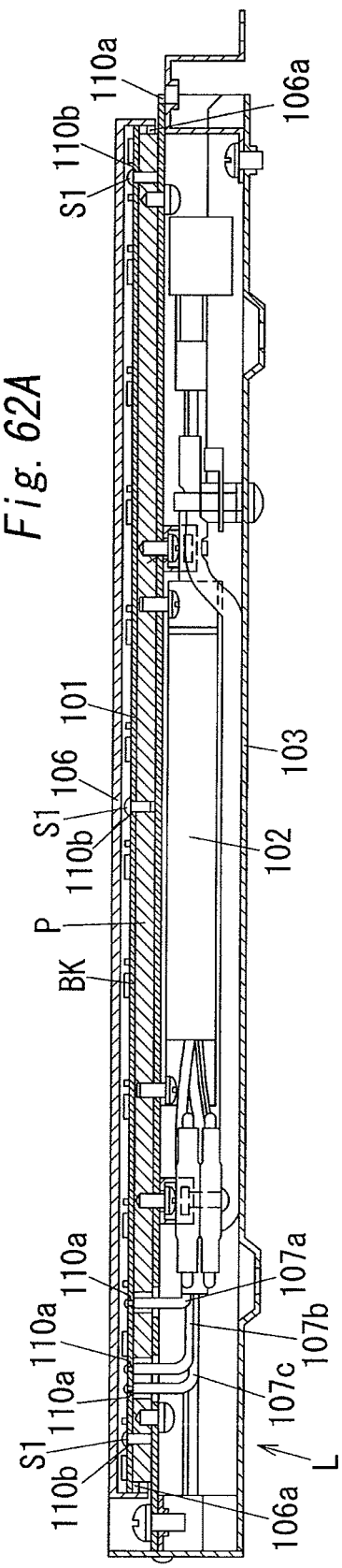
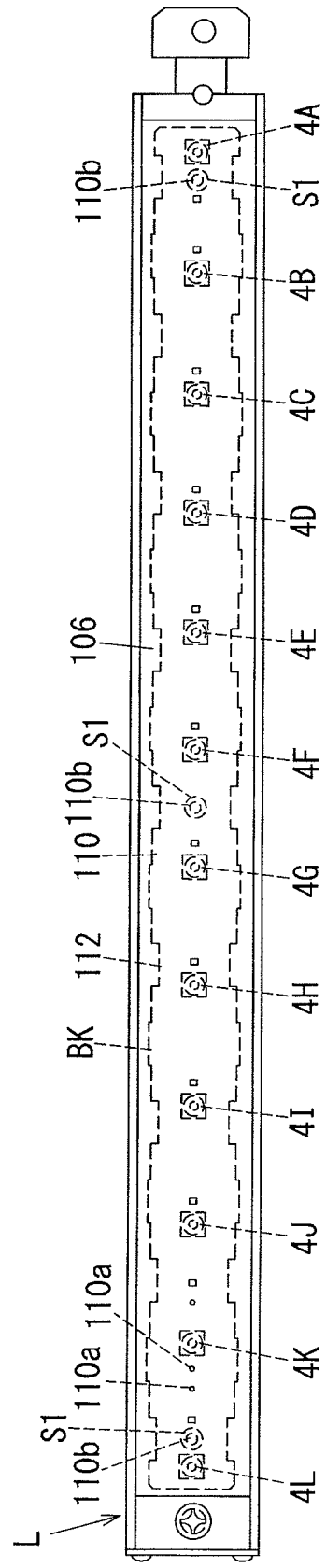

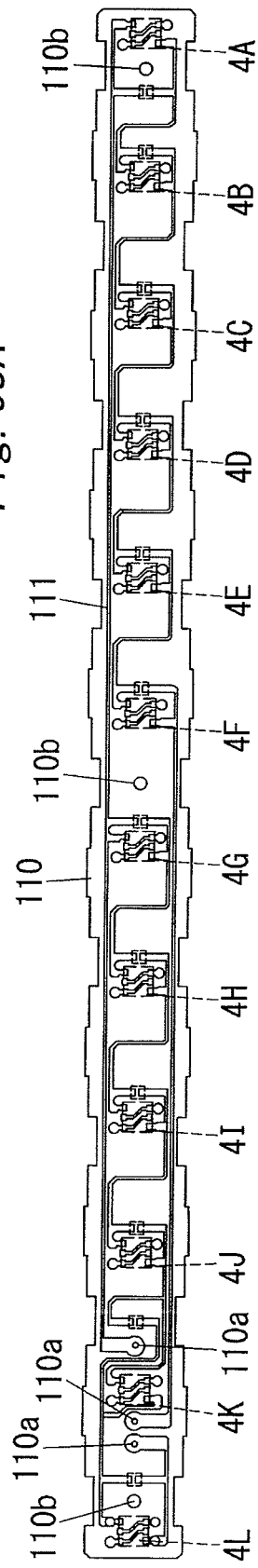
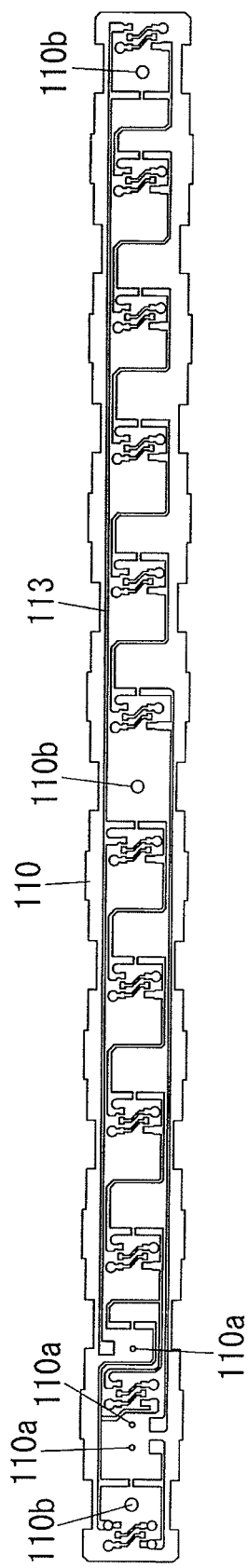
Fig. 63A
Fig. 63B

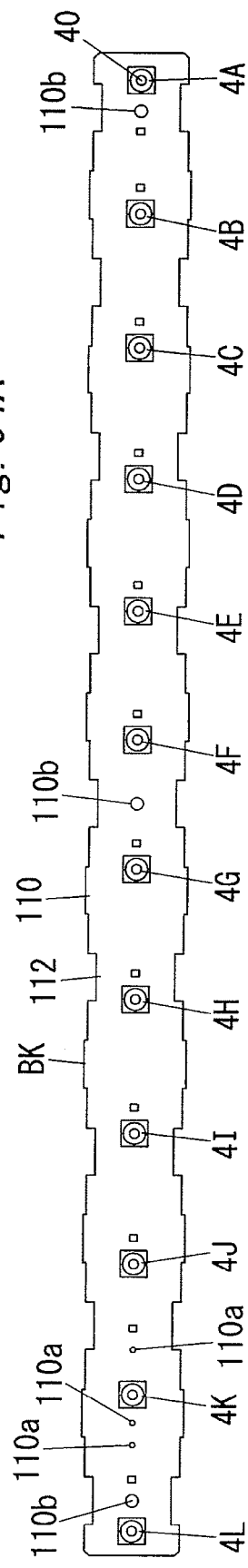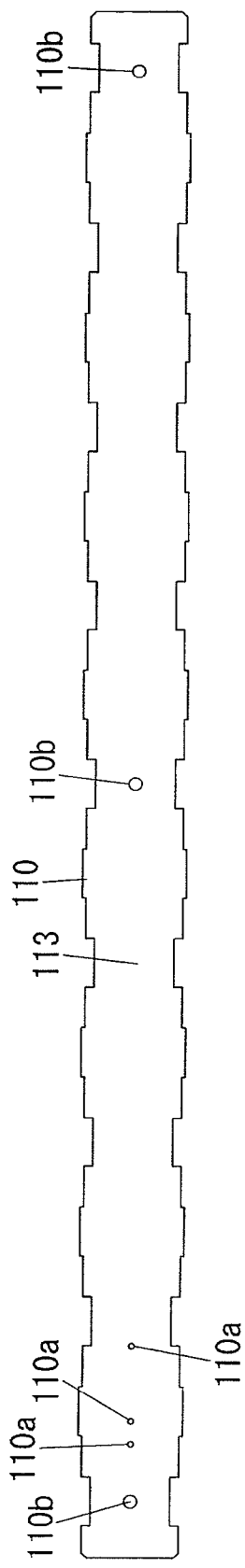

LEAD FRAME, WIRING BOARD, LIGHT EMITTING UNIT, AND ILLUMINATING APPARATUS

TECHNICAL FIELD

The present invention relates to a lead frame, a wiring board, a light emitting unit, and an illuminating apparatus.

BACKGROUND ART

A lead frame for use in the manufacture of a light-emitting device using an LED chip has been suggested (for example, Japanese Patent Application Publication No. 2006-93470; Patent Document 1).

This Patent Document 1 describes, as shown in FIG. 60, a light emitting device 100 including a heat sink 160, an LED chip 161 mounted on the heat sink 160, a pair of lead sections 330 electrically connected by bonding wires 164a, 164b to the LED chip 161 and the heat sink 160, respectively, a resin package 400 that integrally supports the heat sink 100 and the lead sections 330 and allows the LED chip 161 to be exposed on the front surface side, and an attachment lens 560 that is mounted so as to cover the front surface side of the resin package 400 through a light-transmitting resin section 550.

Further, Patent Document 1 also describes the configuration shown in FIG. 61 as the lead frame 300 that is used in the manufacture of the light emitting device 100 shown in FIG. 60. The lead frame 300 is obtained by integrally forming a pair of elongated parallel frame sections 310 that are formed parallel to each other, connection frame sections 320 that are disposed equidistantly in the longitudinal direction of the parallel frame sections 310 and connect the opposing parallel frame sections 310 to each other, a pair of lead sections 330 that extend in the directions such as to approach each other from the center portion of the mutually adjacent connection frame sections 320 and are formed such that the end portions thereof face each other at a predetermined distance from each other, and support frame sections 340 that extend from the pair of parallel frame sections 310 toward the end portions of the respective lead sections 330.

Further, an illumination fixture L has also been suggested which includes, as shown in FIG. 62A and FIG. 62B, a light source device 101, a power supply device 102 that supplies operation power to the light source device 101, and a fixture body 103 that accommodates the light source device and the power supply device (Japanese Patent Application Publication No. 2007-35890; Patent Document 2).

The light source device 101 includes a light source block BK and a case 106 accommodating the light source block BK. The light source block BK, as shown in FIG. 63, is provided with an elongated printed substrate 110 in which a wiring pattern 111 is formed on one surface side (front surface side) and a plurality of light emitting diodes 4A to 4L that are surface mounted by reflow soldering on the wiring pattern 111 of the printed substrate 110.

The light emitting diodes 4A to 4L are high-brightness white light emitting diodes of the so-called surface mounting type in which the front surface is an emission surface provided with an emission port 40 (see FIG. 64A), and the rear surface is a mounting surface where an anode terminal (not shown in the figure) and a cathode terminal (not shown in the figure) are exposed. Patent Document 2 indicates that the light emitting diodes 4A to 4L are provided substantially equidistantly in the longitudinal direction of the printed substrate 110 as shown in FIG. 64A, and used as pseudo-linear light sources.

As shown in FIG. 63A and FIG. 63B, the printed substrate 110 is a one-surface mounting substrate formed in an elongated rectangular shape. Three through holes 110a for connection to output power supply lines 107a to 107c (see FIG. 62A) of the power supply device 102 to the wiring pattern 111 are provided through the printed substrate at the left end side. Further, screw holes 110b for screwing fixing screws S1 (see FIG. 62) serving to fix the printed substrate 110 to the fixture body 103 are provided at both end portions and a center portion in the longitudinal direction of the printed substrate 110.

A paper-based copper-stretched layer plate such as a paper-based epoxy resin copper-stretched layer plate, a glass cloth-based copper-stretched layer plate such as a glass cloth-based epoxy resin copper-stretched layer plate, and a glass nonwoven fabric-based copper-stretched layer plate such as a glass nonwoven fabric-based epoxy resin copper-stretched layer plate are described as materials for the printed substrate 110.

As shown in FIG. 63A, the wiring pattern 111 to which the light emitting diodes 4A to 4L are connected is formed on the front surface side of the printed substrate 110. The wiring pattern 111 is formed using a conductive material such as a copper foil. In the printed substrate 110, a series circuit of the light emitting diodes 4A to 4F is connected in parallel in the forward direction with a series circuit of the light emitting diodes 4G to 4L.

Further, at the front surface side of the printed substrate 110, only a portion necessary for connection to the light emitting diodes 4A to 4L and the like is exposed in the wiring pattern 111, and a solder resist 112 (see FIG. 64A) for preventing the solder from adhering to the portions that are not necessary for connection is formed in the wiring pattern 111.

Meanwhile, a warping preventing section 113 is formed on the other surface side (rear surface side) of the printed substrate 110. The warping preventing section 113 is formed in a shape substantially identical to that of the wiring pattern 111 by using a copper foil, as shown in FIG. 63B. In other words, the warping preventing section 113 is a dummy wiring pattern of a shape substantially identical to that of the wiring pattern 111.

The light emitting diodes 4A to 4L are surface mounted on the printed substrate 110, and this mounting is performed by reflow soldering. When the printed substrate 110 is passed through a reflow furnace, since the thermal expansion coefficient of the wiring pattern 111 is lower than that of the printed substrate 110, thermal expansion on the front surface side of the printed substrate 110 is inhibited due to the difference in these thermal expansion coefficients, and a force causing warping toward the front surface side is generated in the printed substrate 110. However, since the warping preventing section 113 of a shape substantially identical to that of the wiring pattern 111 is formed on the rear surface side of the above-described printed substrate 110, thermal expansion is also inhibited on the rear surface side of the printed substrate 110 due to the difference in thermal expansion coefficient between the warping preventing section 113 and the printed substrate 110, and a force causing warping toward the rear surface side is generated in the printed substrate 110. As a result, thermal expansion in the printed substrate 110 is inhibited at both surfaces (front surface and rear surface). As a result, the warping caused by the difference in thermal expansion coefficient between the wiring pattern 111 and the printed substrate 110 and the warping caused by the difference in thermal expansion coefficient between the warping preventing section 113 and the printed substrate 110 are mutually compensated and eliminated, and warping of the printed substrate 110 is reduced. After the printed substrate has passed through the reflow furnace, warping is also caused by temperature variations occurring when the temperature of the printed substrate 110 drops, but warping of the printed substrate 110 is reduced for the same reasons as described hereinabove.

The case 106 where the light source block BK is accommodated is formed in an elongated box-like shape with an open lower surface by using a light-transmitting synthetic resin such as an acrylic resin. Support pieces 106a, 106a for supporting the printed substrate 110 accommodated inside the case 106 are provided integrally in a protruding condition at the lower end edges at both inner side surfaces in the longitudinal direction of the case.

The interior of the case 106 of the light source device 101 is filled with a sealing material P made of a light-transmitting resin such as a silicon resin and the resin is heated and cured in order to cause the entire case 106 to emit light and to improve heat radiation ability and waterproofing ability of the light source block BK.

Patent Document 2, as shown in FIG. 64B, indicates that a section obtained by coating the ink for silk printing so as to cover the entire surface on the rear surface side of the printed substrate 110 by silk printing (silk screen printing) can be used as an antireflection section 113. Further, Patent Document 2 also indicates that a section formed so as to cover the entire surface on the rear surface side of the printed substrate 110 by using a metal material identical to that of the wiring pattern 111 or having a thermal expansion coefficient substantially identical to that of the wiring pattern 111 may be used as the warping preventing section 113. It is also indicated that in this case, the heat radiation ability of heat-generating parts such as light emitting diodes 4A to 4L mounted on the printed substrate 110 can be increased.

A light source device configured as shown in FIG. 65 has been suggested as a surface light source using a visible light emitting diode chip (visible light LED chip) (Japanese Patent Application Publication No. H11-162233: Patent Document 3).

The light source device configured as shown in FIG. 65 includes a first visible light LED chip 103, a first translucent substrate 161 having the first visible light LED chip 103 mounted thereon, and a first translucent electrode 171 that is provided on the first translucent substrate 161 and supplies power to the first visible light LED chip 103. This light source device also includes a second visible light LED chip 104, a second translucent substrate 162 disposed opposite the mounting surface side of the first translucent substrate 161 and having the second visible light LED chip 104 mounted thereon, and a second translucent electrode 172 provided on the second translucent substrate 162 and supplying power to the second visible light LED chip 104.

In the light source device configured as shown in FIG. 65, the light from the first visible light LED chip 103 can be taken to the outside through the second translucent electrode 172 and the second translucent substrate 162, and the light from the second visible light LED chip 104 can be taken to the outside through the first translucent electrode 171 and the first translucent substrate 161.

An illuminating apparatus 600 incorporating an LED light emitting body 603 as shown in FIG. 66 has also been suggested (Japanese Patent Application Publication No. 2009-266432: Patent Document 4).

A light emitting main body 602 of the illuminating apparatus 600 is provided with a pair of attachment substrates 604, 604 and a spacer 611 that connects and fixes integrally the attachment substrates 604, 604 to each other and forms a gap 610 between the attachment substrates 604, 604. The light emitting main body 602 is also provided with plastic wiring boards 608, 608 for the LED light emitting body 603 that are attached to and integrally installed on the surfaces of the attachment substrates 604, 604, respectively, and light transmitting covers 605, 605 that are attached to the front surface side of the attachment substrates 604, 604. The attachment substrate 604 has an elongated thin band-like shape, and an extruded aluminum material is used therefor. In the wiring board 608, a plurality of LED light emitting bodies 603 are arranged with a predetermined spacing, as shown in FIG. 66 and FIG. 67.

DISCLOSURE OF THE INVENTION

Problems to be Resolved by the Invention

However, when the light-emitting device 100 configured as shown in FIG. 60 is used for applications requiring a comparatively high light output, such as general illumination, the desirable light power cannot be obtained with one light emitting device 100.

Accordingly, a configuration is considered in which a plurality of light emitting devices 100 are mounted on one wiring board and LED units (light emitting unit) are connected, for example, in series. In this case, a metal base printed wiring board can be used as the wiring board in order to inhibit the increase in temperature of the LED chip 161 in the light emitting device 100 and increase the light output. When such an LED unit is manufactured, a pair of lead sections 330 of each light emitting device 100 may be soldered to the wiring pattern formed of a copper foil pattern of the metal base printed wiring board of the wiring board.

However, in such an LED unit, a heat sink 160 should be assembled for each light emitting device 100, a metal base printed wiring board is required, and each light emitting device 100 should be aligned and mounted on the metal base printed wiring board. As a result, the cost is increased.

Further, in a light emitting unit such as the above-described light source block BK, warping of the printed substrate 110 can be reduced. However, in a light emitting unit such as the above-mentioned light source block BK, the heat generated by the light emitting diodes 4A to 4L is radiated through the printed substrate 110. Therefore, for example, when the light output of the entire light source block BK is increased by increasing the light output of each of light emitting diodes 4A to 4L, the increase in temperature of the light emitting diodes 4A to 4L cannot be sufficiently inhibited. As a result, in the above-described light source block BK, there is a possibility that a restriction is placed on the increase in light output.

In the light source device configured as shown in FIG. 65, the heat generated by the first visible light LED chip 103 is radiated mainly through the first translucent electrode 171 and the first translucent substrate 161, and the heat generated by the second visible light LED chip 104 is radiated mainly through the second translucent electrode 172 and the second translucent substrate 162. Therefore, in such a light source device, when the light output of the entire light source device is increased by increasing the light output of the first visible light LED chip 103 and the second visible light LED chip 104, the increase in temperature of the first visible light LED chip 103 and the second visible light LED chip 104 cannot be sufficiently inhibited. As a result, in the light source device configured as shown in FIG. 65, there is a possibility that a restriction is placed on the increase in light output.

Further, in the light emitting unit body 602 and the illuminating apparatus 600 configured as shown in FIG. 66, the heat generated by the LED light emitting body 603 is apparently mainly radiated through the wiring board 608 and the attachment substrate 604. Therefore, in the light emitting unit body 602 and the illuminating apparatus 600, when the light output of the entire light emitting unit body 602 and the entire illuminating apparatus 600 is increased by increasing the light output of the LED light emitting body 603, the increase in temperature of the LED light emitting body 603 cannot be sufficiently inhibited. As a result, in the above-mentioned light emitting unit body 602 and illuminating apparatus 600, there is a possibility that a restriction is placed on the increase in light output.

The present invention has been created to resolve the above-described problems and it is an object thereof to provide a lead frame and a wiring board that make it possible to increase the light output and reduce cost of a light emitting unit in which a plurality of solid-state light emitting elements connected in series are used and also to provide a light emitting unit and an illuminating apparatus that make it possible to increase the light output.

Means of Solving the Problems

A lead frame of the present invention is formed using a metal sheet and in the lead frame, a predetermined wiring pattern is supported inside of a one-pitch outer frame section through a support piece, wherein the wiring pattern comprises a plurality of base units, each of which comprises a die pad on which a solid-state light emitting element is mounted, a heat sink that extends from the die pad so as to surround the die pad and that is electrically connected to one electrode of the solid-state light emitting element, and a lead that is electrically connected to the other electrode of the solid-state light emitting element, the lead of one base unit among adjacent base units and the heat sink of the other base unit being coupled and electrically connected in series.

It is preferred that in the lead frame, the lead be disposed inside a cut-in groove formed toward the die pad from an outer circumferential edge of the heat sink.

It is preferred that in the lead frame, the plurality of base units are arranged along a lengthwise direction of the outer frame section.

It is preferred that in the lead frame, the wiring pattern be provided with a wiring that is located lateral to the heat sink across the plurality of base units, and the wiring be connected and electrically connected to the lead of the base unit provided at one end in the lengthwise direction of the outer frame section.

It is preferred that in the lead frame, the pattern be provided with a wiring that is located lateral to the heat sink across the plurality of base units, and the wiring be coupled to and electrically connected to the lead of the base unit provided at one end in the lengthwise direction of the outer frame section.

It is preferred that in the lead frame, the wiring pattern be provided with a wiring that is located lateral to the heat sink across the plurality of base units.

It is preferred that in the lead frame, the plurality of base units be disposed so as to surround a center of a region surrounded by the outer frame section.

A wiring board in accordance with the present invention comprises: a module that is formed using a first metal plate and has a wiring pattern to which a plurality of solid-state light emitting elements disposed on a main front surface side of the wiring pattern can be connected in series; a second metal plate disposed on a rear surface side of the module; and an insulating layer that has electric insulation ability and thermal conductivity and is interposed between the module and the second metal plate to join thermally the wiring pattern and the second metal plate, wherein the wiring pattern is provided with a plurality of base units, each of which comprises a die pad on which the solid-state light emitting element is mounted, a heat sink that extends from the die pad so as to surround the die pad and that is electrically connected to one electrode of the solid-state light emitting element, and a lead that is electrically connected to the other electrode of the solid-state light emitting element, the lead of one base unit among adjacent base units and the heat sink of the other base unit being coupled and electrically connected in series, and the module is provided with, for each of the plurality of base units, a holding section formed of an insulating material and holding the die pad, the heat sink, and the lead.

It is preferred that in the wiring board, the module be provided with, at a side edge of the wiring pattern, a relief structure section that increases adhesion to the holding section.

It is preferred that in the wiring board, a first plated layer that is formed of a metal material superior in oxidation resistance and corrosion resistance to the first metal plate and that increases adhesion to the insulating layer be formed on a rear surface of the wiring pattern.

It is preferred that in the wiring board, a second plated layer that is formed of a metal material superior in oxidation resistance and corrosion resistance to the first metal plate be formed on a main front surface of a zone electrically connected to the die pad and the solid-state light emitting element.

It is preferred that in the wiring board, the material for the first metal plate be Cu, and the second plated layer be formed of a laminated film of a Ni film, a Pd film, and an Au film.

It is preferred that the wiring board further comprises a connection piece that connects the lead of the one base unit of the adjacent base units with the heat sink of the other base unit, wherein a space is present between the connection piece and the insulating layer, and the connection piece is provided with a stress relieving section that is bent so as to relieve stresses induced by a difference in linear expansion coefficient between the first metal plate and the second metal plate and acting upon the wiring pattern.

In a light emitting unit in accordance with the present invention, the solid-state light emitting element is mounted on each of the die pads of the wiring board, the solid-state light emitting element is provided with the one electrode on one surface side of the solid-state light emitting element in a thickness direction and also provided with the other electrode on the other surface side the solid-state light emitting element, the one electrode is electrically connected, through the die pad, to the heat sink, and the other electrode is electrically connected, through a wire, to the lead.

In a light emitting unit in accordance with the present invention, the solid-state light emitting element is mounted on each of the die pads of the wiring board, the solid-state light emitting element is provided with the one electrode and the other electrode on one surface side of the solid-state light emitting element in a thickness direction, the one electrode is electrically connected, through a first wire, to the heat sink, and the other electrode is connected, through a second wire, to the lead.

It is preferred that the light emitting unit comprises, for each of the base units: a dome-shaped optical member that controls distribution of light emitted from the solid-state light emitting element and accommodates the solid-state light emitting element between the wiring board and the optical member; a sealing section that is formed of a first translucent material, is loaded into a space surrounded by the optical member and the wiring board, and seals the solid-state light emitting element; and a dome-shaped color conversion member that is formed of a second translucent material and a fluorescent material that emits light of a color different from an emission color of the solid-state light emitting element when excited by light that has been emitted from the solid-state light emitting element and transmitted by the sealing section and the optical member, the color conversion member being provided in the form of surrounding the optical member, wherein the holding section of the wiring board is provided, on the outer side of the optical member, with a protruding annular barrier section that blocks the first translucent material oozing out when the optical member is fixedly attached to the wiring board, and the barrier section is provided with a plurality of hook sections located at intervals in a circumferential direction, extending inward from an inner circumferential surface of the barrier section, and aligning a center of the barrier section and a center axis of the optical member, the barrier section also serving as an alignment section for the color conversion member.

The present application also includes an invention relating to a light emitting unit that makes it possible to increase heat radiation ability and also increase the light output. In this case, it is preferred that the light emitting unit comprises a mounting substrate; and a plurality of solid-state light emitting elements disposed on one surface side of the mounting substrate, wherein the mounting substrate is provided with a heat transfer plate which is formed of a first metal plate and in which the solid-state light emitting elements are mounted on one surface side of the heat transfer plate, a wiring pattern which is formed of a second metal plate and disposed on the other surface side of the heat transfer plate and to which the solid-state light emitting elements are electrically connected, and an insulating layer interposed between the heat transfer plate and the wiring pattern.

It is preferred that in the light emitting unit, the insulating layer include a filler in a thermosetting resin, the filler having a thermal conductivity higher than that of the thermosetting resin.

It is preferred that in the light emitting unit, the solid-state light emitting elements are LED chips.

It is preferred that in the light emitting unit, in the heat transfer plate, the first metal plate be an aluminum plate, an aluminum film with a purity higher than that of the aluminum plate be laminated on a side of the aluminum plate that is opposite to the insulating layer, and a reflection increasing film formed of dielectric films of two types that differ in refractive index be laminated on the aluminum film.

It is preferred that the light emitting unit comprises a color conversion unit that includes a translucent material and a fluorescent material that emits light of a color different from an emission color of the LED chip when excited by light emitted from the LED chip, wherein the color conversion unit is in contact with the heat transfer plate.

It is preferred that in the light emitting unit, each of the LED chips be provided with a first electrode and a second electrode on one surface side of each of the LED chips in a thickness direction, the first electrode and the second electrode be electrically connected, through wires, to the wiring pattern, and the heat transfer plate be formed with through holes for passing the respective wires therethrough.

It is preferred that in the light emitting unit, the heat transfer plate have an elongated shape, the solid-state light emitting elements be arranged along a longitudinal direction of the heat transfer plate, and an elongated base substrate be provided that has a smaller difference in linear expansion coefficient with the first metal plate than with the second metal plate and is disposed on a side of the wiring pattern that is opposite to the heat transfer plate.

It is preferred that in the light emitting unit, the base substrate be formed of a resin substrate in which a filler is mixed with a resin, the filler having a thermal conductivity higher than that of the resin.

It is preferred that in the light emitting unit, the base substrate be formed of a third metal plate made of the same material as that of the first metal plate, and a second insulating layer made of the same material as that of a first insulating layer, which is the insulating layer, be interposed between the base substrate and the wiring pattern.

The present application also includes an invention relating to an illuminating apparatus that makes it possible to increase heat radiation ability and also increase the light output. In this case, the illuminating apparatus includes the aforementioned light emitting unit.

The present application also includes an invention relating to a light emitting unit and an illuminating apparatus that make it possible to increase heat radiation ability and also increase the light output. In this case, the light emitting unit comprises a pair of heat transfer plates formed of a first metal plate and disposed at a distance from each other in a thickness direction; solid-state light emitting elements mounted on one surface sides of the pair of heat transfer plates, being on the side opposite to surface sides of the pair of heat transfer plates that face each other; a wiring pattern which is formed of a second metal plate and disposed between the pair of heat transfer plates and to which the solid-state light emitting elements are electrically connected; and a pair of insulating layers, each of which is interposed between the wiring pattern and each of the pair of heat transfer plates.

It is preferred that in the light emitting unit, the solid-state light emitting elements are LED chips.

It is preferred that in the light emitting unit, in each of the pair of heat transfer plates, the first metal plate be an aluminum plate, an aluminum film with a purity higher than that of the aluminum plate be laminated on a side of the aluminum plate that is opposite to the insulating layer, and a reflection increasing film formed of dielectric films of two types that differ in refractive index be laminated on the aluminum film.

It is preferred that the light emitting unit further comprises a color conversion unit that includes a translucent material and a fluorescent material that emits light of a color different from an emission color of a corresponding LED chip of the LED chips when excited by light emitted from the corresponding LED chip of the LED chips, wherein the color conversion unit is in contact with a corresponding heat transfer plate of the pair of heat transfer plates.

It is preferred that in the light emitting unit, each of the LED chips be provided with a first electrode and a second electrode on one surface side of each of the LED chips in a thickness direction, the first electrode and the second electrode be electrically connected, through wires, to the wiring pattern, and each of the pair of heat transfer plates be formed with through holes for passing the respective wires therethrough.

Further, an illuminating apparatus is provided with the light emitting unit.

BRIEF DESCRIPTION OF THE DRAWINGS

FIG. 11A is a schematic perspective view for explaining a method for manufacturing the LED unit in Embodiment 1; and FIG. 11B is a principal schematic planar view for explaining a method for manufacturing the LED unit in Embodiment 1.

FIG. 18A is a schematic perspective view of two pitches of the lead frame in Embodiment 2; and FIG. 18B is a principal schematic planar view of the lead frame in Embodiment 2.

FIG. 20A is a schematic perspective view for explaining a method for manufacturing the LED unit in Embodiment 2; and FIG. 20B is a principal schematic planar view for explaining a method for manufacturing the LED unit in Embodiment 2.

FIG. 45 is a schematic perspective view of the light emitting unit of Embodiment 6.

FIG. 46A is a principal schematic perspective view of a two-face light emitting unit of Embodiment 7; and FIG. 46B is a partially broken principal perspective view of the two-face light emitting unit of Embodiment 7.

FIG. 62A is a partial cross-sectional view of an illumination fixture of the conventional example; and FIG. 62B is a top see-through view of part of the illumination fixture of the conventional example.

FIG. 63A is a front surface view of the printed substrate used in the illumination fixture of the conventional example; and FIG. 63B is a rear surface view of the printed substrate used in the illumination fixture of the conventional example.

FIG. 64A is a front surface view of the printed substrate with a light emitting diode mounted thereon; and FIG. 64B is a rear surface view of the printed substrate illustrating another example.

Figure 1:
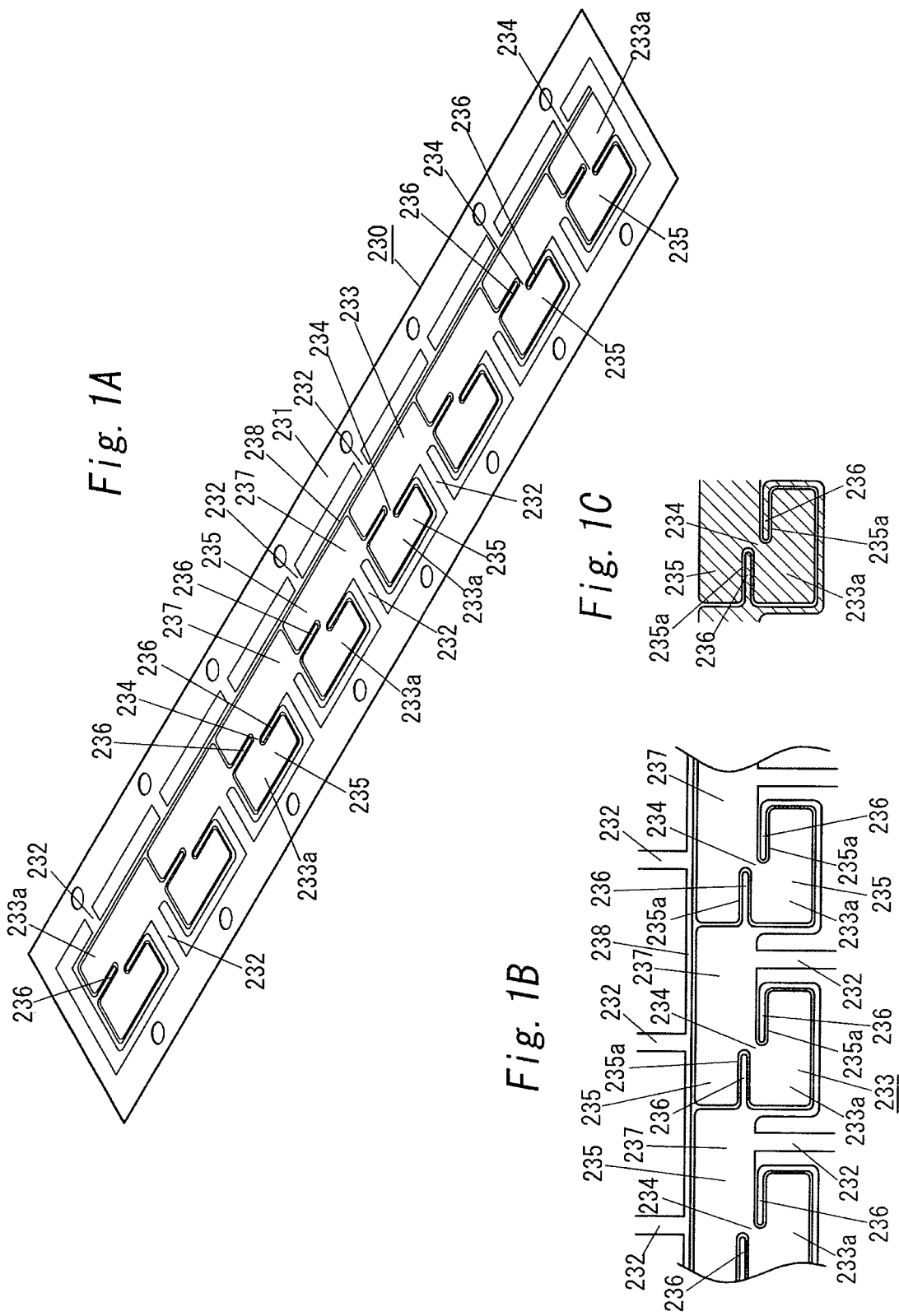
FIG. 1A is a schematic perspective view illustrating one pitch of the lead frame in Embodiment 1.
FIG. 1B is a principal schematic planar view of the lead frame in Embodiment 1.
FIG. 1C is a principal schematic planar view of a base unit of the lead frame in Embodiment 1.

BEST MODE FOR CARRYING OUT THE INVENTION (Embodiment 1)

First, a lead frame is explained with reference to FIG. 1 to FIG. 3.

A lead frame 230 according to the present embodiment is the lead frame 230 in which a predetermined pattern 233 is supported inside of a one-pitch outer frame section 231 through support pieces 232. The lead frame 230 is formed using a band-shaped metal sheet 203 (see FIG. 4). The outer frame section 231 is formed in a rectangular frame shape, and the outer circumferential shape thereof is an elongated rectangle. In the band-shaped metal sheet 203 shown in FIG. 4, only a portion corresponding to one pitch of the lead frame 230 is shown, but this band-shaped metal sheet 203 may be configured of a portion of a metal hoop material. Further, in the present embodiment, the pattern 233 constitutes a wiring pattern.

The pattern 233 of the lead frame 230 is provided with a plurality of base units 233a (in FIG. 1C, only one base unit 233a is shown by hatching), each of which includes a die pad 234 on which an LED chip 210 having a pair of electrodes is mounted (see FIG. 2 and FIG. 3), a heat sink 235 that extends from the die pad 234 so as to surround the die pad 234 and that is electrically connected to one electrode among the pair of electrodes of the LED chip 210, and a lead 236 that is electrically connected to the other electrode among the pair of electrodes of the LED chip 210. The lead 236 of one base unit 233a among the adjacent base units 233a and the heat sink 235 of the other base unit 233a are coupled and electrically connected in series. In the present embodiment, the LED chip 210 constitutes a solid-state light emitting element.

In this case, the lead 236 of one base unit 233a and the heat sink 235 of the other base unit 233a are connected through a connection piece 237 that is wider than the lead 236.

Figure 2:
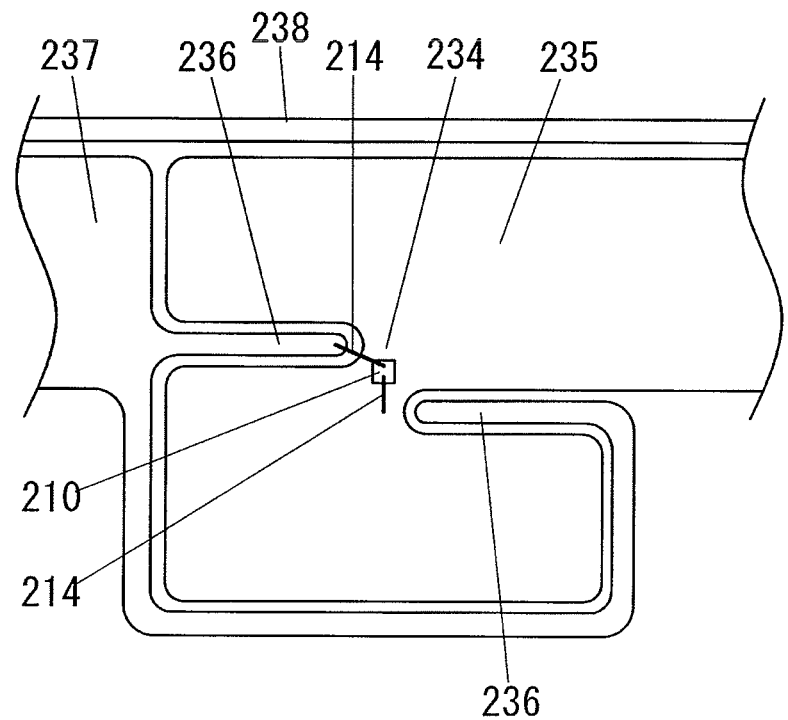
FIG. 2 is a schematic planar view illustrating a mounting example of an LED chip on the lead frame in Embodiment 1.

When an element in which a pair of electrodes is formed on one surface side in the thickness direction of the element is mounted as the LED chip 210 on each base unit 233a of the lead frame 230, for example, as shown in FIG. 2, one electrode of the LED chip 210 may be electrically connected, through a bonding wire 214, to the heat sink 235, and the other electrode of the LED chip 210 may be electrically connected, through a bonding wire 214, to the lead 236. In the case of such LED chip 210, flip-chip mounting is also possible such that the one electrode is electrically connected, through the first bump, to the die pad 234 and the other electrode is connected, through the second bump, to the lead 236. In the present embodiment, the bonding wires 214 constitute the wires.

Figure 3:
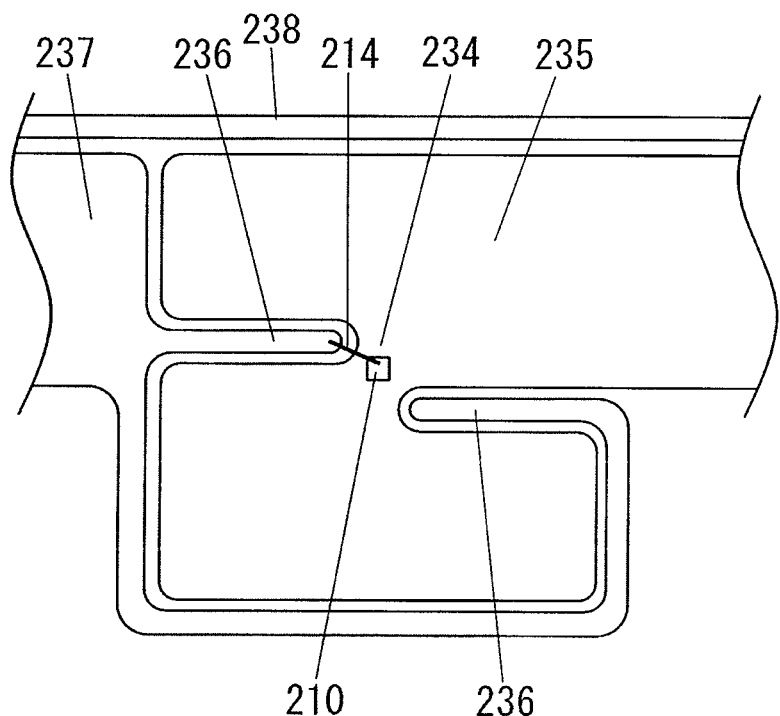
FIG. 3 is a schematic planar view illustrating a mounting example of an LED chip on the lead frame in Embodiment 1.

Further, when an element in which electrodes are provided on both surfaces in the thickness direction of the element is mounted as the LED chip 210, for example, as shown in FIG. 3, one electrode of the LED chip 210 may be electrically connected, through the die pad 234, to the heat sink 235 and the other electrode of the LED chip 210 may be electrically connected, through the bonding wire 214, to the lead 236. In the lead frame 230 of the present embodiment, the number of the base units 233a per one pitch is eight, but this number is not particularly limited, and a plurality of base units may be used.

In the above-described lead frame 230, a plurality of base units 233a are arranged along the lengthwise direction (left-right direction in FIG. 1B) of the outer frame section 231. Further, the pattern 233 of the lead frame 230 is provided with linear wirings 238 located lateral to the heat sink 235 across the plurality of base units 233a. For example, this wiring 238 is coupled to the lead 236 of the base unit 233a at one end (the base unit 233a at the left end in FIG. 1A) in the lengthwise direction (that is, the arrangement direction of the base units 233a) of the outer frame section 231 and electrically connected thereto. Therefore, in a state in which one LED chip 210 is mounted on each base unit 233a and the pattern 233 is separated from the outer frame section 231, power can be fed to a series circuit of all of the LED chips 210 by feeding power between the wiring 238 and the heat sink 235 of the base unit 233a at the other end (the base unit 233a at the right end in FIG. 1A) in the arrangement direction of the plurality of base units 233a.

The above-described lead 236 is disposed inside a cut-in groove 235a formed toward the die pad 234 from the outer circumferential edge of the heat sink 235. Further, in the lead frame 230 shown in FIG. 1, two leads 236 are provided for each base unit 233a, and two cut-in grooves 235a are formed in the heat sink 235 in the directions such as to approach each other and with a shift in the center line positions thereof. One lead 236, from among the two leads 236, is formed in a linear shape and disposed inside one cut-in groove 235a. The other lead 236 is constituted by a linear first portion disposed inside the other cut-in groove 235a and a second part extending from the end on the side opposite to the die pad 234 side in the first portion to the connection piece 237 and disposed along the outer side edge of the heat sink 235.

Copper, which has a comparatively high thermal conductivity among metal materials (thermal conductivity of copper is about 398 W/m·K) is preferred as the material for the metal plate 203 (see FIG. 4) that serves as a base for the lead frame 230, but copper is not a limiting material and, for example, phosphorus bronze may be also used. A copper alloy (for example, 42 Alloy) may be also used as the material for the metal plate 203. Further, preferably, the thickness of the metal plate 203 is, for example, within a range of about 100 μm to about 1500 μm. As the thickness of the metal plate 203 increases, the distance between the inner circumferential surface of the cut-in groove 235a and the outer side edge of the lead 236 increases. Therefore, an upper limit of about 1500 μm is preferred for the thickness of the metal plate 203. In the base unit 233a, the lead 236 may be arranged on the outside of the heat sink 235, without providing the cut-in groove 235a in the heat sink 235. However, in this case, the distance between the LED chip 210 and the lead 236 increases and the total length of the bonding wire 214 also increases. Therefore, for instance as shown in FIG. 1, it is preferred that the cut-in groove 235a be provided in the heat sink 235, and the lead 236 be disposed so as to be introduced into the cut-in groove 235a.

Figure 5:
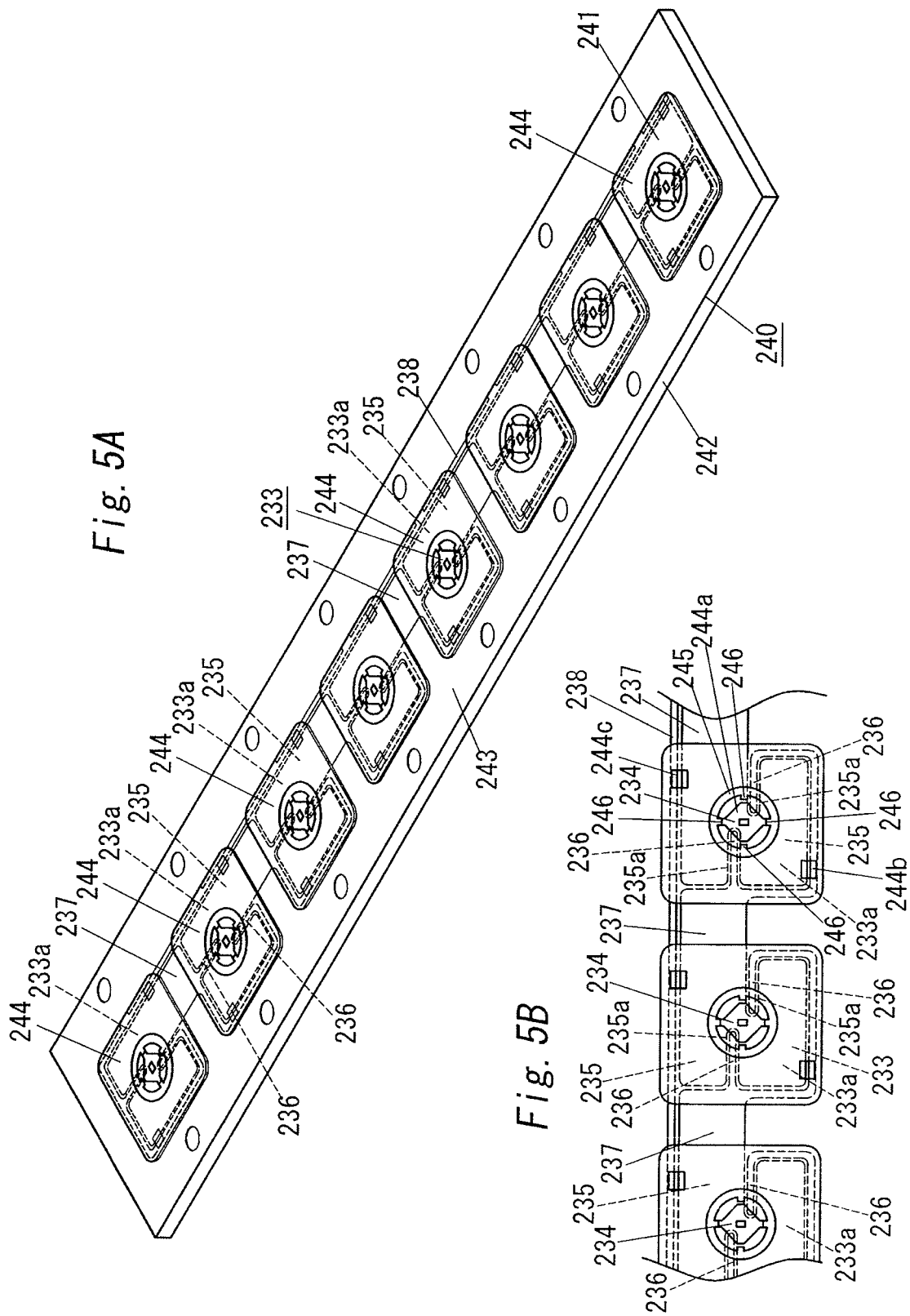
FIG. 5A is a principal schematic planar view of the wiring board in Embodiment 1.
FIG. 5B is a principal schematic planar view of the wiring board in Embodiment 1.
Figure 6:
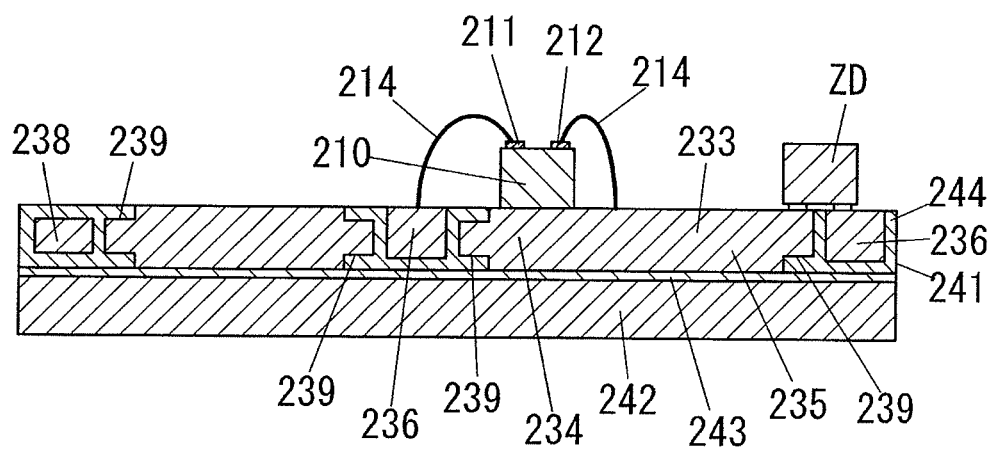
FIG. 6 is a schematic cross-sectional view illustrating a mounting example of an LED chip and a Zener diode on the wiring board in Embodiment 1.
Figure 7:
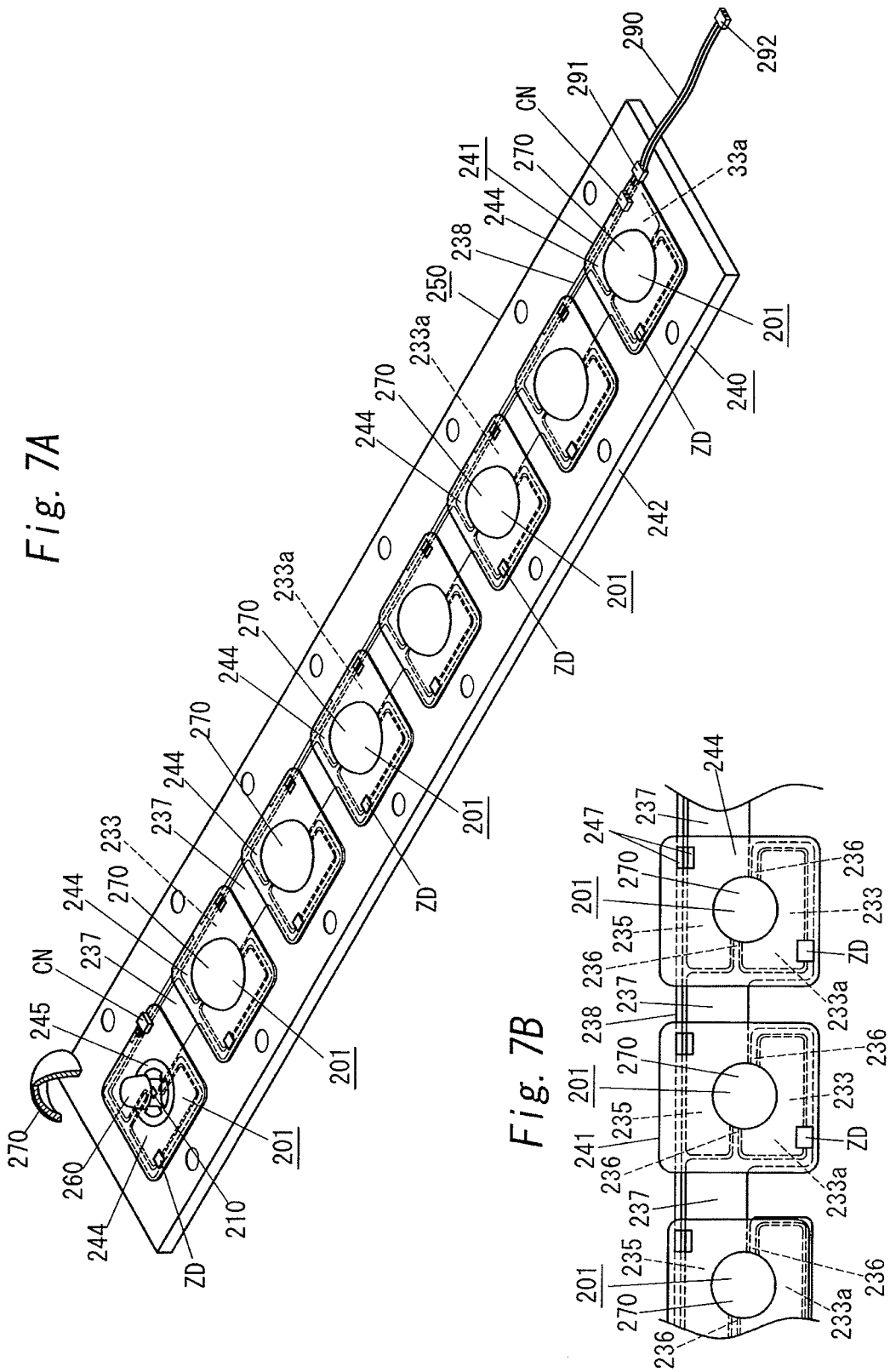
FIG. 7A is a schematic perspective view in which part of the LED unit in Embodiment 1 is disassembled and cross cut.
FIG. 7B is a principal schematic planar view of the same part.

A wiring board 240 manufactured using the above-described lead frame 230 is described below with reference to FIG. 5 and FIG. 6, and an LED unit 250 manufactured using the wiring board 240 is described below with reference to FIG. 7 and FIG. 8. FIG. 6 is a schematic cross-sectional view illustrating the state in which the LED chip 210 and the below-described Zener diode ZD are mounted on the wiring board 240.

The wiring board 240 is provided with a module 241 that is formed using the lead frame 230 and that has a pattern 233 that enables series connection of a plurality of LED chips 210 arranged at the side of the main front surface. Thus, the wiring board 240 has the pattern 233 of the lead frame 230 that is formed using the metal plate 203 (referred to hereinbelow as the first metal plate 203) shown in FIG. 4.

Therefore, the pattern 233 of the wiring board 240 is provided with a plurality of base units 233a, each of which comprises the above-described die pad 234, heat sink 235, and lead 236, and the lead 236 of one base unit 233a among the adjacent base units 233a and the heat sink 235 of the other base unit 233a are coupled and electrically connected in series. The module 241 of the wiring board 240 is provided with a holding section 244 formed of an insulating material and surrounding and holding the die pad 234, the heat sink 235, and the lead 236 in each base unit 233a. The holding section 244 is formed to cover the surface of the pattern 233, except the respective portions of the die pad 234, lead 236, heat sink 235, and wiring 238, but it is also possible to expose the entire surface of the pattern 233, as shown in FIG. 6. In short, as shown in FIG. 6, the holding section 244 may be provided in a form such as to expose at least the rear surface of the pattern 233 and the mounting zones of the electronic components (LED chip 210, Zener diode ZD, the below-described connector CN, and the like).

The above-described holding section 244 is formed by injection molding. A material with a small difference in linear expansion coefficient with the first metal plate 203 is preferred as the insulating material for the holding section 244. A liquid crystal polymer is used therefor, but this material is not limited, and for example, other resin materials such as polyamide resins and epoxy resins or ceramics such as alumina may be used. A white material having a high reflectance with respect to the light emitted from the LED chip 210 is preferred as the insulating material for the holding section 244.

Further, in addition to the above-descried module 241, the wiring board 240 comprises a second metal plate 242 disposed on the rear surface side of the module 241 and an insulating layer 243 interposed between the module 241 and the second metal plate 242. In this case, the insulating layer 243 has electric insulation ability and thermal conductivity and also has a function of thermally joining the pattern 233 and the second metal plate 242. The second metal plate 242 functions as a heat radiating plate (heat transfer plate), and a metal material with a high thermal conductivity, such as copper and aluminum, is preferred as the material for the second metal plate 242. The thickness of the second metal plate 242 may be set, for example, within a range of about 0.5 mm to about 10 mm. The thermal conductivity of aluminum is about 237 W/m·K.

The above-described insulating layer 243 is formed by thermally curing an epoxy resin layer of a thermosetting sheet-shaped adhesive (for example, an adhesive sheet TSA manufactured by Toray Industries, Inc.) in which a plastic film (PET film) is laminated with a B-stage epoxy resin layer including a filling material formed of a filler such as silica or alumina and having a property of reducing the viscosity and increasing the flowability under heating. In this case, the epoxy resin layer of the sheet-shaped adhesive features electric insulation ability, a high thermal conductivity, high flowability under heating, and high ability to adhere to a rough surface. Therefore, it is possible to prevent the appearance of gaps between the insulating layer 243, the pattern 233, and the second metal plate 242, adhesion reliability is increased, and the increase in thermal resistance or the appearance of spread caused by insufficient adhesion can be inhibited. In this case, thermal resistance from each LED chip 210 to the second metal plate 242 can be reduced, spread in thermal resistance can be also reduced, heat radiation ability can be increased and the increase in temperature of the junctions of the LED chips 210 can be inhibited, compared with the case where a heat radiating sheet in the form of a rubber sheet such as SARCON (registered trade name) is sandwiched between the pattern 233 and the second metal plate 242. Therefore, the input power can be increased and the light output can be increased. The thickness of the aforementioned epoxy resin layer is set to 100 μm, but this value is merely exemplary and not limited. For example, the thickness of the epoxy resin layer may be set, as appropriate, within a range of about 50 μm to about 150 μm. The thermal conductivity of the aforementioned epoxy resin layer is preferably equal to or higher than 4 W/m·K. Prior to laminating the module 241 and the second metal plate 242, the plastic film of the sheet-shaped adhesive is peeled off from the epoxy resin layer. In short, the plastic film is peeled off after one surface on the side opposite to the plastic film in the epoxy resin layer has been fixedly attached to the object.

In this case, when the insulating layer 243 is formed, a pressure may be applied, as appropriate, in a state in which the second metal plate 242, the epoxy resin layer, and the module 241 are laminated. Depending on thermal capacity of the second metal plate 242, when the epoxy resin layer is cured by raising the heating temperature thereof to about 170° C., the ability of the module 241 and the second metal plate 242 to be fixedly attached to each other can be degraded, and when the curing is performed at a heating temperature reduced to about 150° C., electric insulation between the module 241 and the second metal plate 242 can be degraded. Thus, there is a trade-off relationship between the attachment ability and electric insulation ability. Accordingly, where the requirements relating to both the attachment ability and the electric insulation ability are not satisfied because of large thermal capacity of the second metal plate 242, for example, the epoxy resin layers of two sheet-shaped adhesives may be laminated, one epoxy resin layer may be cured at 170° C. to ensure electric insulation ability and thermal conductivity, and then the other epoxy resin layer may be cured at 150° C. to ensure the attachment ability and thermal conductivity. More specifically, after one epoxy resin layer has been attached to one surface of the second metal plate 242, which is the object, at 170° C., the other epoxy resin layer and the module 241 may be laminated and this other epoxy resin layer may be cured at 150° C.

The outer dimensions that determine the outer circumferential shape of the insulating layer 243 and the second metal plate 242 match the outer dimensions of the outer frame section 231 of the lead frame 230, but such matching is not always necessary.

Further, in the wiring board 240, a first plated layer (not shown in the figure) that is formed of a metal material superior in oxidation resistance and corrosion resistance to the first metal plate 203 and that has high adhesion to the insulating layer 243 is formed on the rear surface of the pattern 233. In this case, where the material for the first metal plate 203 is Cu, for example, Ni or the like may be used as the material for the first plated layer. Since the first plated layer is formed on the rear surface of the pattern 233 in the wiring board 240, the oxidation and corrosion of the pattern 233 can be inhibited and the degradation of the attachment ability of the pattern 233 and the insulating layer 243 can be also inhibited. As a result, thermal resistance between the die pad 234 and the heat sink 235 and the second metal plate 242 can be prevented from changing with time.

In the module 241, a relief structure section 239 (see FIG. 6) that increases the adhesion to the holding section 244 is provided on the side edge of the pattern 233. In short, in the abovementioned lead frame 230, the relief structure section 239 is formed at the side edge of the pattern 233 during the manufacturing process. The relief structure section 239 is formed by providing steps that reduce the thickness on at least either of both surfaces in the thickness direction of the lead frame 230. For example, a pressing method or an etching method may be used, as appropriate, for forming such relief structure section 239. In any case, the lead frame 230 is formed by patterning the first metal plate 203 through pressing or etching.

In the abovementioned module 241, the adhesion between the pattern 233 and the holding section 244 can be improved by providing the relief structure section 239 at the side edge of the pattern 233. Therefore, when the module 241 is cut off from the lead frame 230, the holding section 244 can be prevented from peeling off or dropping off from the pattern 233. Further, since the relief structure section 239 is provided at the side edge of the pattern 233 in the wiring board 240, the creeping distance between the second metal plate 242 and the LED chip 210 mounted on the die pad 234 can be increased.

Further, in the pattern 233 of the wiring board 240, a second plated layer 247 (see FIG. 10B) formed of a metal material superior in oxidation resistance and corrosion resistance to the first metal plate 203 is formed on the respective main surfaces of a zone electrically connected to the die pad 234 and the LED chip 210 (the distal end portion of the lead 236 to which the bonding wire 214 can be joined), a zone where a Zener diode ZD can be mounted, and a zone where the below-described connector CN for power supply can be mounted. Therefore, the decrease in adhesion to the LED chip 210, Zener diode ZD, and connector CN caused by the oxidation of the pattern 233 and the decrease in attachment ability of the LED chip 210, Zener diode ZD, and connector CN caused by the corrosion of the pattern 233 can be inhibited. When the material for the first metal plate 203 is Cu, where the second plated layer 247 is constituted, for example, by a laminated film of a Ni layer, a Pd layer, and an Au layer, part of the light emitted from the LED chip 210 can be reflected by the second plated layer 247 and the efficiency of taking the light out to the outside is increased.

Further, in the wiring board 240, a third plated layer (not shown in the figure) constituted by a Ni film formed simultaneously with the Ni film that is the lowermost layer of the second plated layer 247 is formed on the zone on the main surface side of the pattern 233 where the second plated layer 247 has not been formed.

The second metal plate 242 is formed in the elongated plate shape. Here, the second metal plate 242 may be provided with a plurality of fins on the side opposite to the module 241. The fins in this case may be formed along the longitudinal direction of the second metal plate 242 and may be arranged with the same pitch in the lateral direction of the second metal plate 242.

In the LED unit 250, the LED chip 210 is mounted on each die pad 234 of the above-described wiring board 240. The LED chip 210 is provided with a pair of electrodes 211, 212 (see FIG. 6) at one surface side in the thickness direction. One electrode 211 is electrically connected to the lead 236 through the bonding wire 214, and the other electrode 212 is electrically connected to the heat sink 235 through the bonding wire 214. However, the electrodes may be also formed on both surfaces of the LED chip 210 in the thickness direction. In this case, one electrode may be electrically connected to the heat sink 235 through the die pad 234, and the other electrode may be electrically connected to the lead 236 through the bonding wire (see FIG. 3).

In order to prevent an overvoltage from being applied to the LED chips 210 in the wiring board 240 of the LED unit 250, a Zener diode ZD of a surface mounting type for overvoltage prevention is disposed across the heat sink 235 and the lead 236 that is not bonded by the bonding wire 214. In this case, the Zener diode ZN is electrically connected to the heat sink 235 and the lead 236. The Zener diode ZD is electrically connected by joining a pair of outer connection electrodes of the Zener diode ZD, through soldering or the like, to the second plated layers 247 of the heat sink 235 and the lead 236.

In the LED unit 250, an optical member 260 that controls the distribution of light emitted from the LED chip 210 is provided for each base unit 233a of the pattern 233. The optical member 260 is formed in a dome-like shape from a translucent material and fixedly attached to the main front surface side of the wiring board 240 in the form such that the LED chip 210 is accommodated between the wiring board 240 and the optical member.

The LED chip 210 and a sealing section 255 formed of a first translucent material and sealing the bonding wire 214 electrically connected to the LED chip 210 are loaded into the space surrounded by the optical member 260 and the wiring board 240. In this case, it is preferred that the sealing section 255 uses, for example, a silicone resin as the first translucent material and is in the form of a gel.

The LED unit 250 is also provided with a fluorescent material that is excited by the light emitted from the LED chip 210 and transmitted by the sealing section 255 and the optical member 260 and emits light of a color different from that of the light emitted by the LED chip 210, and a dome-shaped color conversion member 270 formed of a second translucent material. In this case, the color conversion member 270 is provided in the form of surrounding the LED chip 210 and the like between the wiring board 240 and the color conversion member on the main front surface side of the wiring board 240. More specifically, the color conversion member 270 is provided such that an air layer 280 is formed between the color conversion member and the light outgoing surface 260b of the optical member 260 at the abovementioned one surface side of the wiring board 240. Further, in the holding section 244 of the wiring board 240, an annular barrier section 245 that blocks the first translucent material that oozes out when the optical member 260 is fixedly attached to the wiring board 240 is provided in a protruding condition on the outer side of the optical member 260 at the abovementioned one surface.

Further, in the barrier section 245, a plurality of (four in the present embodiment) hook sections 246 that extend inward from the inner circumferential surface of the barrier section 245 and that align the center of the barrier section 245 and the center axis of the optical member 260 are arranged at a distance from each other in the circumferential direction and also serve as alignment sections for the color conversion member 270.

The above-described LED unit 250 comprises the base unit 233a, the holding section 244, the LED chip 210, and the light-emitting device 201 constituted by the sealing section 255, the optical member 260, and the color conversion member 270 for each base unit 233a, and the light emitting devices 201 adjacent in the arrangement direction of the base units 233a are coupled to each other through the connection piece 237 and electrically connected in series.

Each constituent element is described below in greater detail.

The LED chip 210 is a GaN blue LED chip emitting blue light. This chip is fabricated by epitaxially growing a light emitting section formed of a GaN compound semiconductor material on the main front surface side of a crystal growth substrate and formed of a laminated structural section having, for example, a double-hetero structure, then fixedly attaching a support substrate (for example, a Si substrate or the like) that will support the light emitting section to the light emitting section, and then removing the crystal growth substrate. The structure of the LED chip 210 is not particularly limited. For example, a configuration may be used in which the light emitting section is provided on the main front surface side of the crystal growth substrate formed of an n-type SiC substrate or an n-type GaN substrate and electrodes are provided on both surfaces in the thickness direction. Each electrode is constituted, for example, by a laminated film of a Ni film and an Au film, but those materials are not particularly limited, and any material with good ohmic characteristic may be used. For example, aluminum may be used.

When the LED chip 210 is provided with a support substrate such as the above-mentioned Si substrate, or when a SiC substrate or a GaN substrate is used, thermal resistance from the light emitting section to the die pad 234 can be reduced by comparison with the case in which a sapphire substrate, which is an electric insulator, is used and left as the crystal growth substrate. The light emitted from the LED chip 210 is not limited to the blue light and may be, for example, violet light and ultraviolet light.

Figure 8:
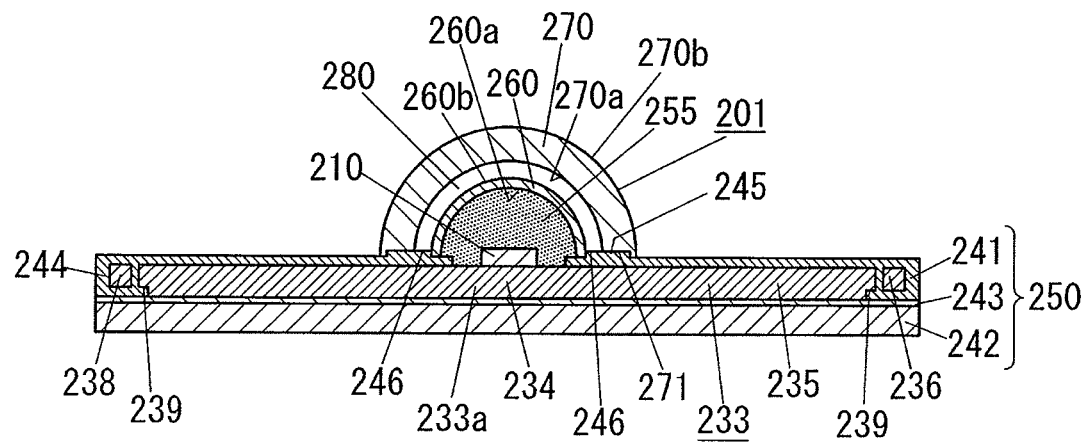
FIG. 8 is a schematic cross-sectional view of the LED unit in Embodiment 1.

As shown in FIG. 8, the LED chip 210 is mounted on the die pad 234 of the wiring board 240. As a result, the heat generated by the LED chip 210 can be radiated via the die pad 234, the insulating layer 243, and the second metal plate 242.

Figure 9:
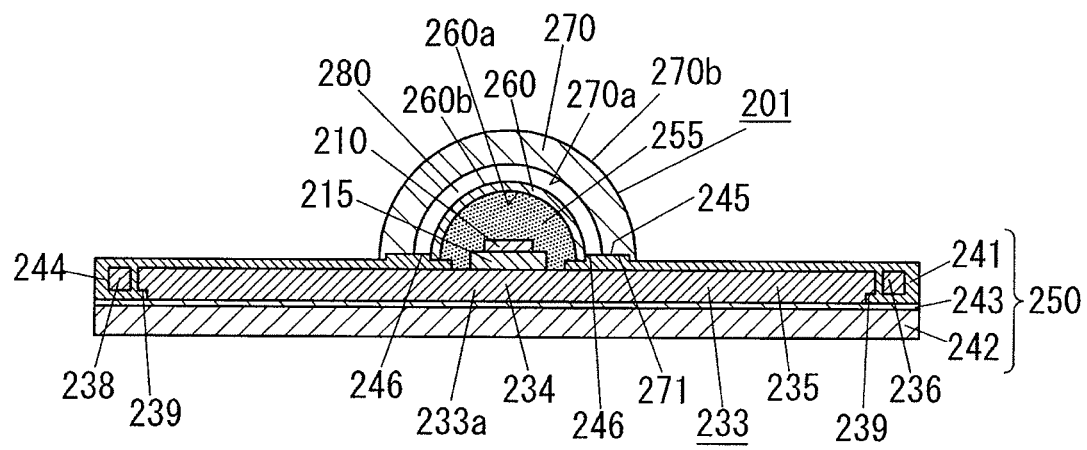
FIG. 9 is a schematic cross-sectional view in another configuration example of the LED unit in Embodiment 1.

However, as shown in FIG. 9, the LED chip 210 may be also mounted on the die pad 234 through a sub-mount member 215 relieving the stresses acting upon the LED chip 210 due to the difference in linear expansion coefficient between the LED chip 210 and the die pad 234. In this case, the sub-mount member 215 is formed in a rectangular plate shape with a planar size larger than the chip size of the LED chip 210.

In addition to the abovementioned function of relieving the stresses, the sub-mount member 215 also has a heat conduction function of causing the conduction of heat generated in the LED chip 210 within a range wider than the chip size of the LED chip 210 in the base unit 233a. Therefore, in the LED unit 250, the heat generated by the LED chip 210 can be efficiently radiated through the sub-mount member 215, the base unit 233a, and the second metal plate 242. Further, by providing the light emitting device 201 with the sub-mount member 215, it is possible to relieve the stresses acting upon the LED chip 210 due to the difference in linear expansion coefficient between the LED chip 210 and the die pad 234.

AlN that has a comparatively high thermal conductivity and electric insulation ability is used as a material for the sub-mount member 215. The LED chip 210 and the sub-mount member 215 may be joined by using, for example, a solder such as SnPb, AuSn, and SnAgCu, or a silver paste, but it is preferred that the joining be performed by using a lead-free solder such as AuSn and SnAgCu. When the sub-mount member 215 is from AlN and joined using AuSn, a pretreatment of forming a metal layer made of Au or Ag should be perfumed in advance on the joining surfaces of the sub-mount member 215 and the LED chip 210. Further, it is preferred that the sub-mount member 215 and the die pad 234 be joined using a lead-free solder such as AuSn and SnAgCu. In this case, when the joining is performed using AuSn, a pretreatment of forming a metal layer made of Au or Ag should be perfumed in advance on the joining surface of the die pad 234.

The material for the sub-mount member 215 is not limited to AlN, and any material with a comparatively small difference in linear expansion coefficient with the LED chip 210 and a comparatively high thermal conductivity can be used. For example, SiC composite, Si, CuW, or the like may be used. The thickness of the sub-mount member 215 is preferably set such that the surface of the sub-mount member 215 is farther from the base unit 233a than the surface of the barrier section 245 of the wiring board 240. Where such thickness of the sub-mount member 215 is set, the light radiated sideways from the LED chip 210 can be prevented from being absorbed by the holding section 244 through the inner circumferential surface of the barrier section 245.

Further, in the sub-mount member 215, a reflective film that reflects light emitted from the LED chip 210 is formed around a jointing section of the LED chip 210 and the sub-mount member 215 (that is, a section that overlaps the LED chip 210) on the surface of the sub-mount member on the side where the LED chip 210 is to be joined. As a result, the absorption of the light emitted from the side surface of the LED chip 210 by the sub-mount member 215 can be prevented and the light take-out efficiency can be further increased. In this case, the reflective film on the sub-mount member 215 may be constituted, for example, by a laminated film of a Ni film and an Ag film, but the material for the reflective film is not particularly limited and may be selected, as appropriate, for example, according to the light emission wavelength of the LED chip 210. When a chip in which electrodes are provided on both surfaces in the thickness direction is used as the LED chip 210, a conductive pattern that is electrically connected to the electrode disposed in the LED chip 210 on the sub-mount member 215 side may be provided at the sub-mount member 215, and the conductive pattern may be electrically connected to the heat sink 235 through a bonding wire formed of a fine metal wire (for example, a fine gold wire or a fine aluminum wire).

Incidentally, as mentioned hereinabove, the holding section 244 of the wiring board 240 is provided for each base unit 233a. A round first opening 244a (see FIG. 5B) through which the die pad 234 and parts of the leads 236 are exposed and a rectangular second opening 244b (see FIG. 5B) through which a zone for mounting the Zener diode ZD is exposed are formed in the center of the holding section 244. The second opening 244b is formed such that part of the lead frame 236 in the zone disposed along the outer circumferential edge of the heat sink 235 and a zone of the heat sink 235 close to this part of the lead frame 236 are exposed. Further, a rectangular third opening 244c (see FIG. 5B) is formed in the holding section 244, and a zone on which the below-described connector CN can be mounted is exposed through the third opening 244c. This third opening 244c is formed such that part of the wiring 238 and a zone of the heat sink 235 close to this part of the wiring 238 are exposed.

In the wiring board 240, a second plated layer 247 formed of a laminated film of a Ni film, a Pd film, and an Au film is also formed on the zones exposed through the second opening 244b and the third opening 244c on the front surface side of the pattern 233. A third plated layer constituted by a Ni film is formed on a zone other than a zone where the second plated layer 247 is formed on the front surface side of the pattern 233.

A silicone resin is used as the first translucent material for the above-described sealing section 255, but the silicone resin is not a limiting material and, for example, an acrylic resin may be used. Glass may be also used as the first translucent material.

The optical member 260 is a molded article from a translucent material (for example, a silicone resin, an acrylic resin, or glass) that is formed in a dome-like shape. In the present embodiment, the optical member 260 is constituted by a molded article from a silicone resin, and therefore the differences in refractive index and linear expansion coefficient between the optical member 260 and the sealing section 255 can be reduced. When the material for the sealing section 255 is an acrylic resin, it is preferred that the optical member 260 be also formed of the acrylic resin.

Incidentally, in the optical member 260, the light outgoing surface 260b is formed in a convex curved shape such that the light falling from a light incidence surface 260a does not undergo total reflection at the boundary of the light outgoing surface 260b and the above-described air layer 280, and the light outgoing surface 260b is disposed such that the optical axes thereof and the LED chip 210 coincide. Therefore, the light that is emitted from the LED chip 210 and falls on the light incidence surface 260a of the optical member 260 easily reaches the color conversion member 270, without undergoing total reflection at the boundary of the light outgoing surface 260b and the air layer 280, and the total light flux can be increased. Further, the light emitted from the side surface of the LED chip 210 propagates through the sealing section 255, the optical member 260, and the air layer 280, reaches the color conversion member 270 and excites the fluorescent material of the color conversion member 270, or is scattered by the fluorescent material, or is transmitted by the color conversion member 270, without colliding with the fluorescent material. The optical member 260 is formed to have a uniform thickness along the normal direction, regardless of the position.

The color conversion member 270 is constituted by a molded article of a mixture prepared by mixing a second translucent material such as a silicone resin with particles of a yellow fluorescent material that emits light of a board yellow system when excited by the blue light emitted from the LED chip 210. Therefore, in the LED unit 250, the blue light emitted from the LED chip 210 and the light emitted from the yellow fluorescent material are emitted through an outer surface 270b of the color conversion member 270 and thereby white light can be obtained. The second translucent material used as the material for the color conversion member 270 is not limited to the silicone resin and may be, for example, an acrylic resin, glass, or an organic-inorganic hybrid material prepared by mixing and bonding organic and inorganic components at a nanometer level or molecular level. Further, the particles of the fluorescent material mixed with the second translucent material used as the material for the color conversion member 270 are not limited to the yellow fluorescent material. For example, white light can be also obtained by mixing a red fluorescent material and a green fluorescent material, and when the red fluorescent material and green fluorescent material are mixed together, color rendering ability can be increased.

In this case, the inner surface 270a of the color conversion member 270 is formed to follow the shape of the light outgoing surface 260b of the optical member 260. Therefore, the distance between the light outgoing surface 260b and the inner surface 270a of the color conversion member 270 in the normal direction is substantially constant, regardless of the position of the light outgoing surface 260b of the optical member 260. Further, the color conversion member 270 is formed such that the thickness thereof in the normal direction is uniform, regardless of the position. The end edge (circumferential edge of the opening) of the color conversion member 270 on the wiring board 240 side may be fixedly attached to the wiring board 240, for example, with an adhesive (for example, a silicone resin, an epoxy resin, or the like).

The barrier section 245 also serves as an alignment section for the color conversion member 270. In this case, the number of the abovementioned hook sections 246 for centering is not limited to four, but it is preferred that the number thereof be at least three. Further, a small width of the hook sections 246 is preferred from the standpoint of increasing the allowed amount of the first translucent material that can remain between the barrier section 245 and the optical member 260. It is also possible to provide an annular concave groove for positioning the color conversion member 270 in the wiring board 240, without providing the barrier section 245.

Further, in the color conversion member 270, a notched section 271 (see FIG. 8) that engages with the barrier section 245 is formed along the entire circumference in the end edge of the color conversion member on the wiring board 240 side. Therefore, in the light emitting device 201 of the present embodiment, the accuracy of positioning the color conversion member 270 with respect to the holding section 244 of the wiring board 240 can be increased and the gap between the color conversion member 270 and the optical member 260 can be reduced. The notched section 271 is open at the end edge side of the color conversion member 270 and at the inner surface 270a side.

A connector CN is mounted on the light emitting device 201 (light emitting device 201 at the left end in FIG. 7A) that is provided with the base unit 233a at the abovementioned one end in the arrangement direction of the plurality of base units 233a, from among the plurality of light emitting devices 201 of the LED unit 250, and further a connector CN is also mounted on the light emitting device 201 (light emitting device 201 at the right end in FIG. 7A) that is provided with the base unit 233a at the above-mentioned other end, from among the plurality of light emitting devices 201 of the LED unit 250. In this case, each connector CN is of a surface mounting type, and one contact from a pair of contacts of each connector CN is joined and electrically connected, through soldering, to the heat sink 235, and the other contact from the pair of contacts is joined and electrically connected, through soldering, to the wiring 238. Therefore, for example, when a pair of electric cables 290 is provided, at one end of the pair of electric cables 290, with a connector (referred to hereinbelow as an output connector) 291 detachably connected to the connector CN of the light emitting device 201 at the right end of the LED unit 250, and a connector (referred to hereinbelow as input connector) 292 provided at the other end of the pair of electric cables 290 is connected to a connector in the output terminal of a lighting device (not shown in the figure), power can be supplied from the lighting device to the series circuit of the LED chips 210 of the LED unit 250 to light up the LED chips 210. In the example shown in FIG. 7, the connector CN of the light emitting device 201 at the right end of the LED unit 250 and the input connector 292 are both female connectors, and the output connector 291 and the connector CN of the light emitting device 201 at the left end of the LED unit 250 are both male connectors, but the male and female configurations may be reversed. Further, since the connector CN can be mounted for each light emitting device 201, only an arbitrary number of the light emitting devices 201 from among a plurality of the light emitting devices 201 (eight in the example shown in FIG. 7) that can be fabricated per one pitch of the lead frame 230 can be cut out when the LED unit 250 is manufactured.

Figure 10A:
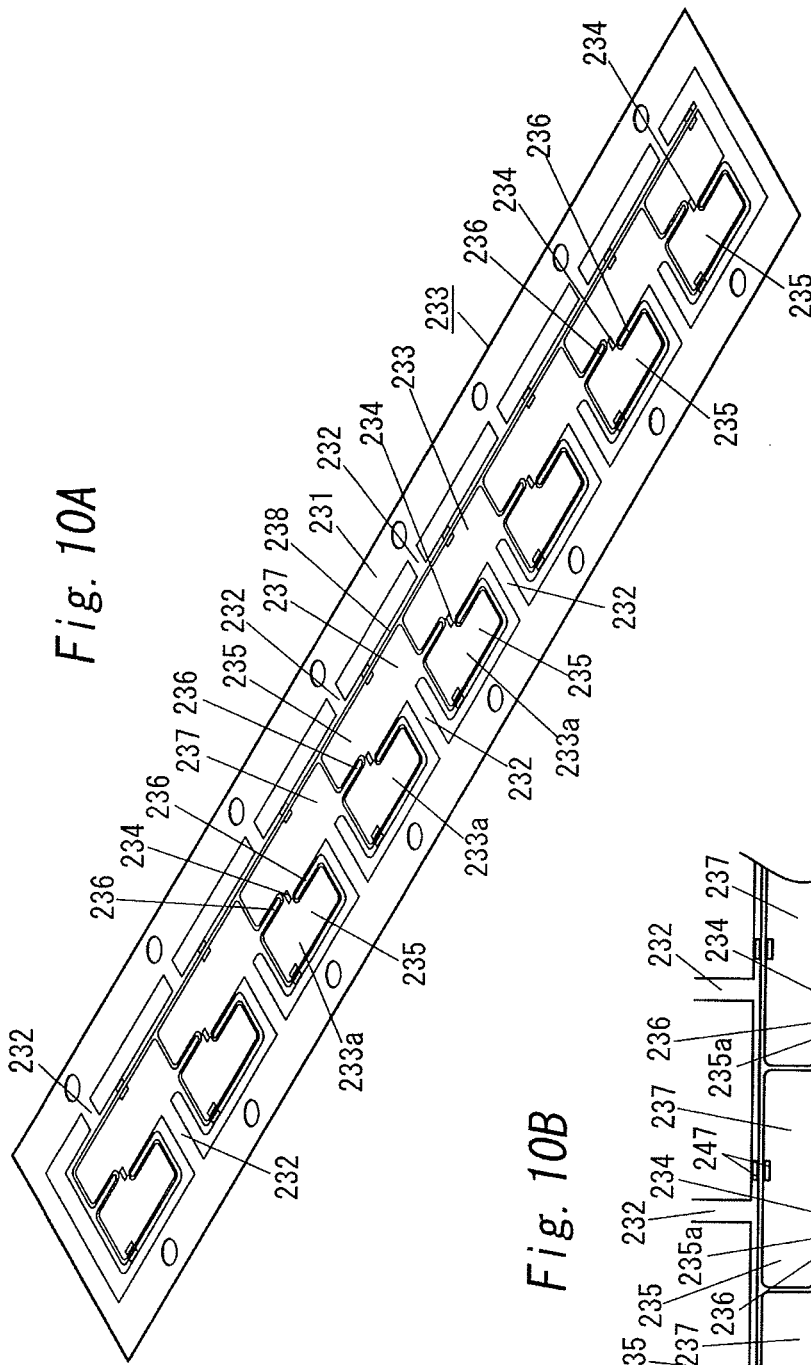
FIG. 10A is a schematic perspective view for explaining a method for manufacturing the LED unit in Embodiment 1.
Figure 10B:
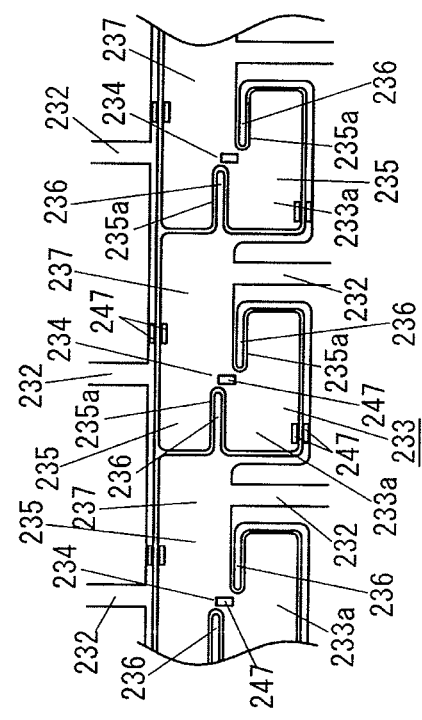
FIG. 10B is a principal schematic planar view for explaining a method for manufacturing the LED unit in Embodiment 1.

The method for manufacturing the LED unit 250 is described below in a simple manner with reference to FIG. 10 to FIG. 12 and also FIG. 5 and FIG. 7.

Figure 4:
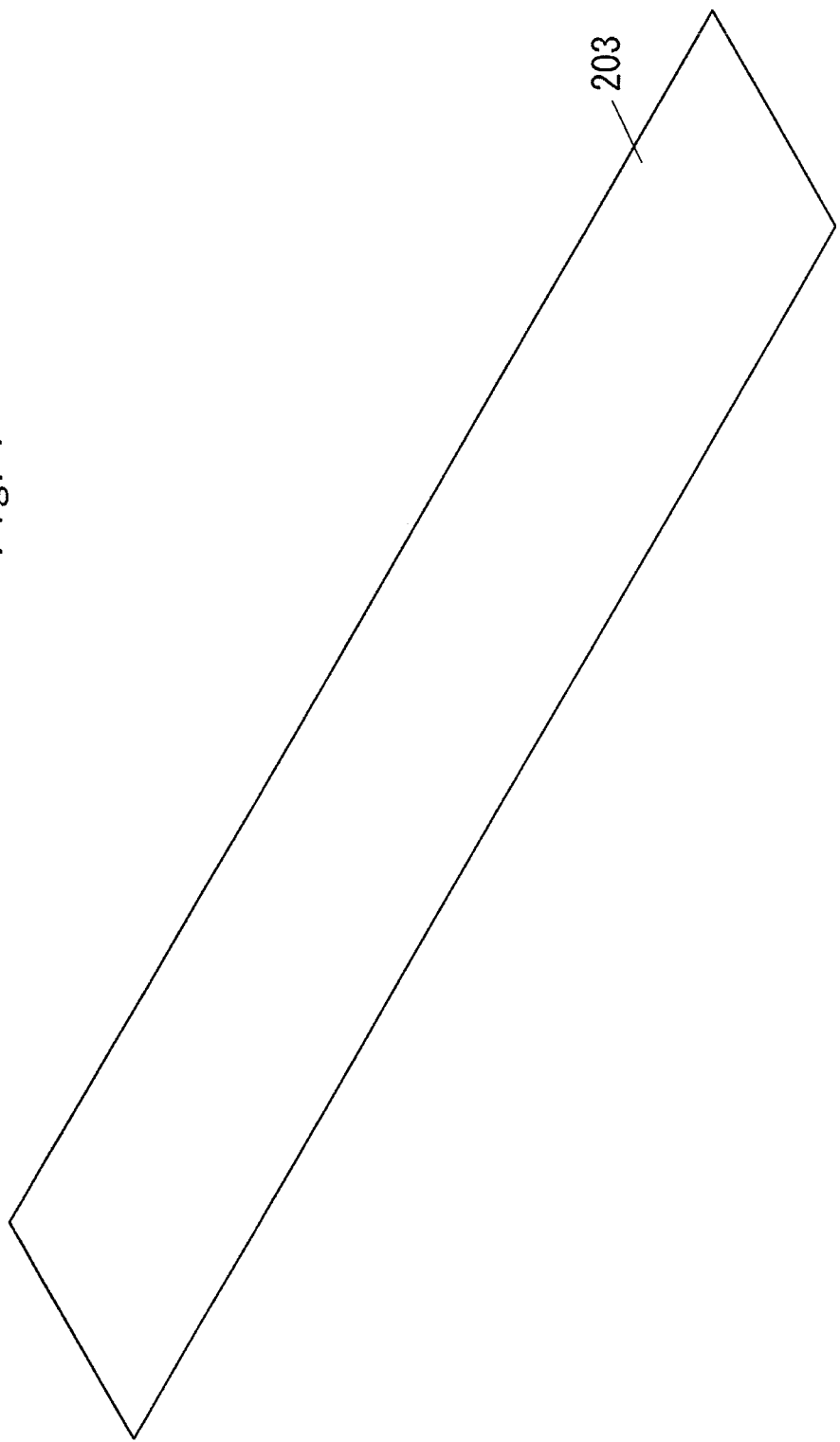
FIG. 4 is a schematic perspective view of a metal sheet used in the manufacture of the lead frame in Embodiment 1.

First a pattern formation step (preliminary step) is performed in which the lead frame 230 shown in FIG. 1 is formed by pressing or etching the first metal plate 203 shown in FIG. 4. Then, a first plating step is performed in which, for example, the first plated layer constituted by a Ni film is formed on the rear surface of the pattern 233, and the third plated layer constituted by a Ni film is formed on the main front surface of the pattern 233. Then, a second plating step of forming the Pd film and the Au film of the second plated layer 247 is performed, thereby obtaining the structure shown in FIG. 10. In the first plating step, the first plated layer and the third plated layer are also formed on the zone of the support piece 232 of the lead frame 230 that is positioned on the inside with respect to the outer circumferential edge of the holding section 244. Further, in the second plating step, the third plated layer is formed by a spot plating method, thereby decreasing the amount of Au used and reducing cost.

After the second plating step, a molding step is performed in which the holding section 244 is formed by injection molding. As a result, the structure shown in FIG. 11 is obtained in which the module 241 is supported by the outer frame section 231 through by the support piece 232.

Figure 12:
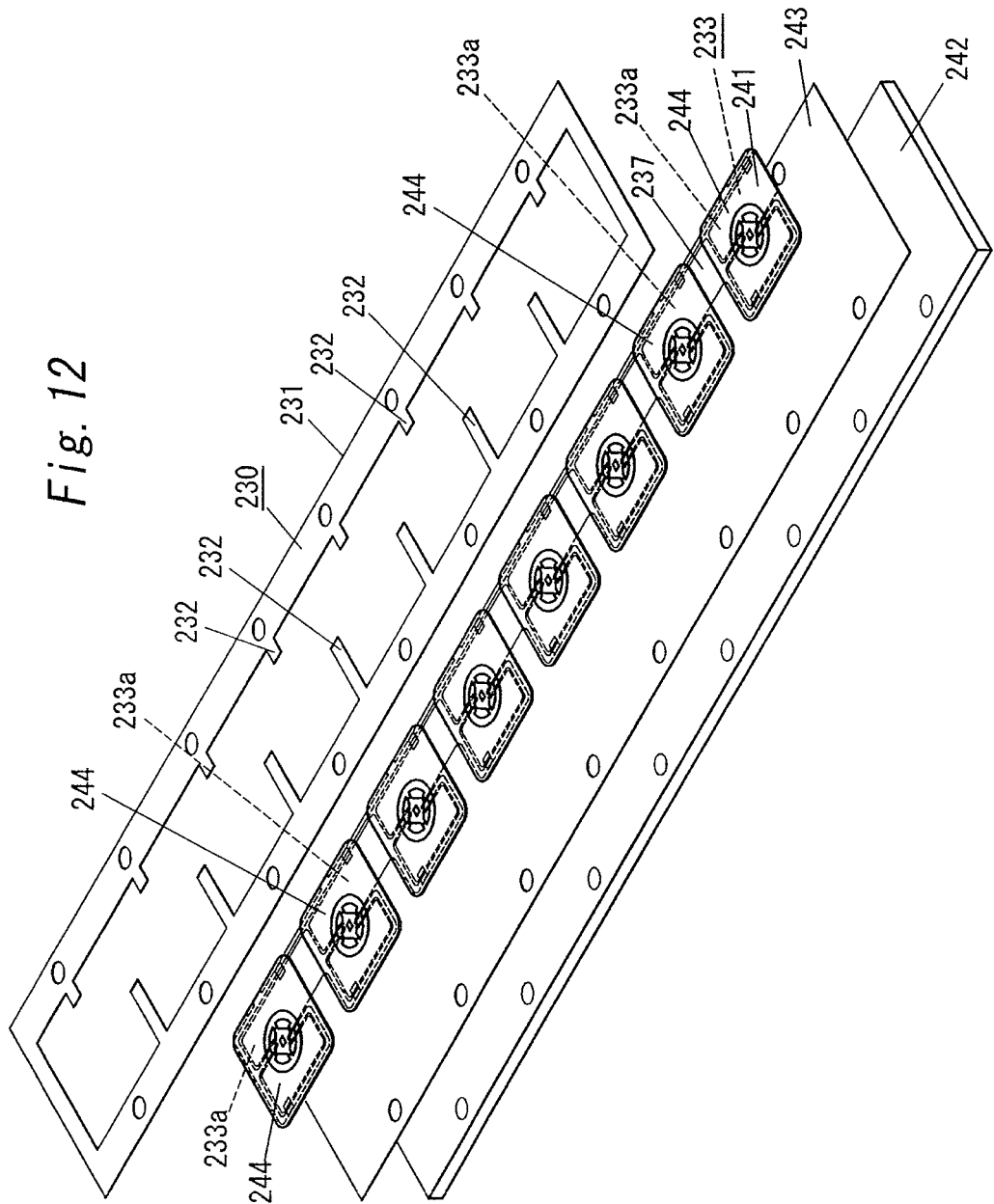
FIG. 12 is a schematic exploded perspective view for explaining a method for manufacturing the LED unit in Embodiment 1.

Then, as shown in FIG. 12, a cutting step is performed in which the module 241 is cut off from the support piece 232 of the lead frame 230, and a joining step is performed in which the module 241 and the second metal plate 242 are joined together through the insulating layer 243. As a result, the wiring board 240 with the structure shown in FIG. 5 is obtained.

A mounting step is then performed in which the LED chip 210 is mounted on the die pad 234 and the Zener diode ZD and the connector CN are mounted and the LED chip 210 is electrically connected, through the bonding wire 214, to the appropriate zones (in the configuration shown in FIG. 2, the lead 236 and the heat sink 235; in the configuration shown in FIG. 3, only the lead 236) of the base unit 233a. Then, a sealing step is performed in which the LED chip 210 and the bonding wire 214 are sealed with the sealing section 255. In the sealing step, initially, the liquid first translucent material (for example, a silicone resin, an acrylic resin, glass, or the like) constituting a portion of the sealing section 255 is injected into the gap between the outer side surface of the LED chip 210 and the inner circumferential surface of the first opening 244a and then is cured. Then, the liquid first translucent material (for example, a silicone resin, an acrylic resin, glass, or the like) constituting the remaining portion of the abovementioned sealing section 255 is injected into the dome-shaped optical member 260. The optical member 260 is then disposed at the predetermined position in the wiring board 240 and the first translucent material is cured, thereby forming the sealing section 255 and, at the same time, fixedly attaching the optical member 260 to the wiring board 240. By injecting a large amount of the liquid first translucent material into the optical member 260 in this sealing step, it is possible to prevent the appearance of bubbles (voids) in the sealing section 255 in the manufacturing process. Further, in the mounting step (first mounting step) preceding the sealing step, only the LED chip 210 may be mounted and then the second mounting step of mounting the Zener diode ZN and connector CN may be performed after the sealing step.

After the above-described LED chip 210, Zener diode ZD, and connector CN have been mounted and the sealing section 255 has been formed, an attachment step of attaching the color conversion member 270 to the wiring board 240 is performed. As a result, the LED unit 250 of the structure shown in FIG. 7 is obtained.

Figure 60:
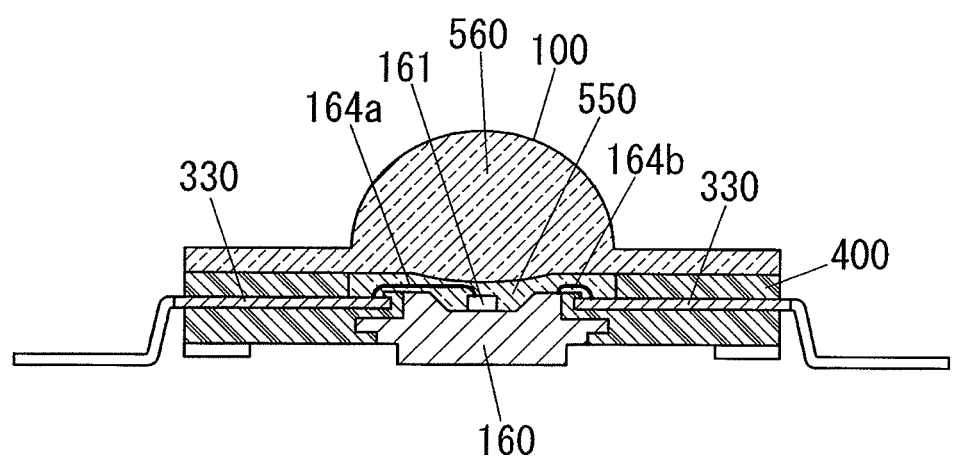
FIG. 60 is a schematic cross-sectional view illustrating the conventional light emitting device.
Figure 61:
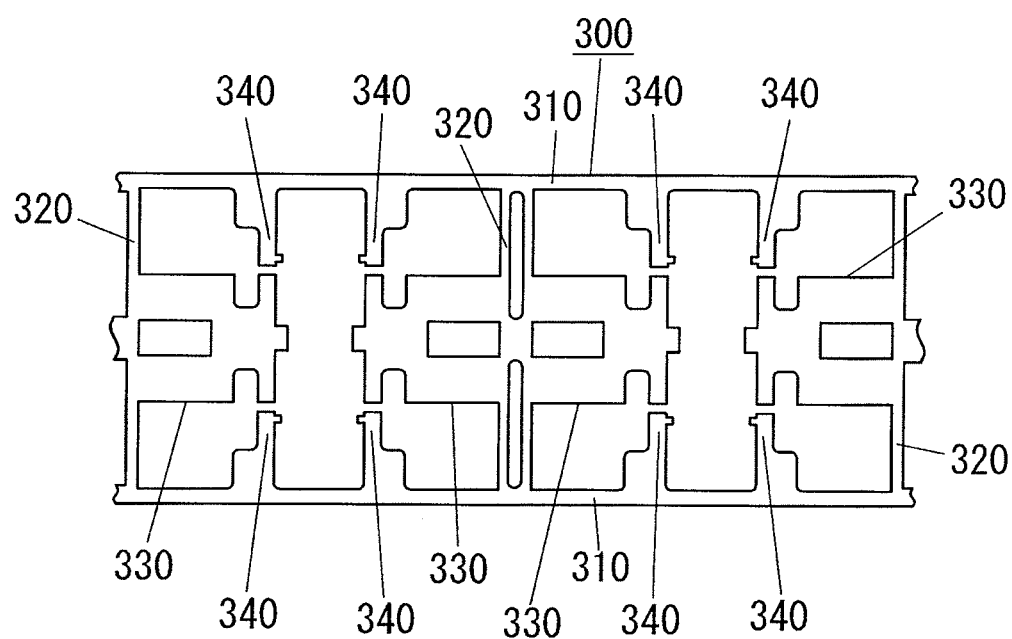
FIG. 61 is a schematic planar view of a lead frame used in the manufacture of the conventional light emitting device.
Figure 65:
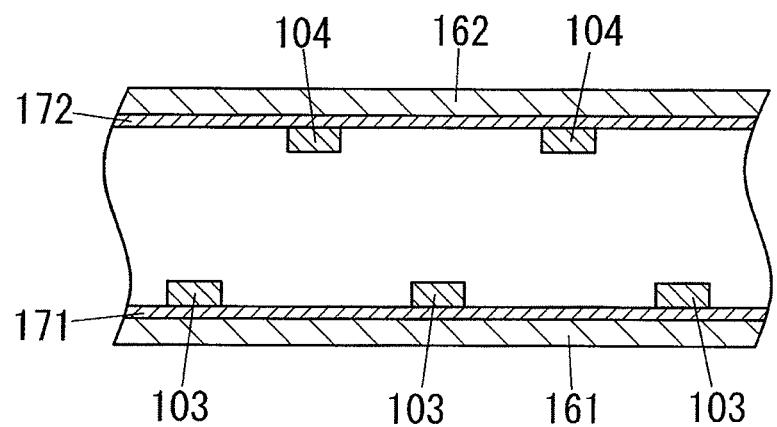
FIG. 65 is a schematic configuration drawing of a light source device of the conventional example.

In the lead frame 230 of the above-described embodiment, the pattern 233 supported by the support piece 232 inside of the one-pitch outer frame section 231 comprises a plurality of base units 233a, each of which comprises the die pad 234 on which the LED chip 210 is mounted, the heat sink 235 that extends from the die pad 234 so as to surround the die pad 234 and that is electrically connected to one electrode 211 of the LED chip 210, and the lead 236 that is electrically connected to the other electrode of the LED chip 210, and the lead 236 of one base unit 233a among the adjacent base units 233a and the heat sink 235 of the other base unit 233a are coupled and electrically connected in series. As a result, in the lead frame 230 of the present embodiment, the increase in temperature of the LED chip 210 is inhibited, the light output is increased, and the LED unit 250 in which the plurality of LED chips 210 are connected and used in series is reduced in cost. For example, the LED unit 250 manufactured by using such lead frame 230 is reduced in cost, compared with the LED unit in which a plurality of light emitting devices 100 configured as shown in FIG. 60 and manufactured using the lead frame 300 shown in FIG. 61 are mounted on the metal base printed wiring board and a plurality of LED chips 161 are connected and used in series.

In the lead frame 230 of the present embodiment, the lead 236 is disposed on the inside of the cut-in groove 235a formed toward the die pad 234 from the outer circumferential edge of the heat sink 235. Therefore, the distance between the die pad 234 and the lead 236 can be reduced. As a result, the distance between the LED chip 210 and the lead 236 can be reduced, the length of the bonding wire 214 that is connected to the LED chip 210 can be reduced and therefore the optical member 260 and the color conversion member 270 can be reduced in size.

Further, in the lead frame 230 of the present embodiment, the plurality of base units 233a are arranged along the lengthwise direction of the outer frame section 231. Therefore, such lead frame can be used in the manufacture of a fine long LED unit 250.

Further, in the lead frame 230 of the present embodiment, the pattern 233 is provided with the wiring 238 that is located lateral to the heat sink 235 across the plurality of the base units 233a, and this wire 238 is coupled to and electrically connected to the lead 236 of the base unit 233a at one end in the lengthwise direction of the outer frame section 231. As a result, when the lead frame 230 is used in a state in which one LED chip 210 is mounted for each base unit 233a and the pattern 233 is separated from the outer frame section 231, as in the above-described LED unit 250, power can be supplied to the series circuit of all of the LED chips 210 by supplying power between the wiring 238 and the heat sink 235 of the base unit 233a at the other end in the arrangement direction of the plurality of base units 233a.

The wiring board 240 of the present embodiment comprises the module 241 that is formed using the first metal plate 203 and that has the pattern 233 to which a plurality of LED chips 210 disposed on the main front surface side thereof can be connected in series, the second metal plate 242 disposed on the rear surface side of the module 241, and the insulating layer 243 that has electric insulation ability and thermal conductivity and that is interposed between the module 241 and the second metal plate 242 to join thermally the pattern 233 and the second metal plate 242. The pattern 233 is cut off from the above-described lead frame 230. The module 241 of the wiring board 240 is provided with the holding section 244 formed of an insulating material and holding the die pad 234, the heat sink 235, and the lead 236 for each base unit 233a of the pattern 233. Therefore, the increase in temperature of the LED chip 210 is inhibited, the light output is increased, and the LED unit 250 in which the plurality of LED chips 210 are connected and used in series is reduced in cost.

In the LED unit 250 of the present embodiment, the LED chip 210 is mounted on each die pad 234 of the abovementioned wiring board 240, and when both electrodes are provided on one surface side in the thickness direction of the LED chip 210, each electrode of the LED chip 210, the lead 236, and the heat sink 235 are electrically connected through the respective bonding wires 214, as shown in FIG. 2. As a result, in the LED unit 250 of the present embodiment, the heat generated by the LED chip 210 can be efficiently radiated from the heat sink 235 and the die pad 234 formed using the above-described lead frame 230 through the second metal plate 242, the increase in temperature of the LED chip 210 is inhibited, the light output is increased, and the cost is reduced.

When the electrodes are provided at both surfaces in the thickness direction of the LED chip 210 in the LED unit 250, one electrode of the LED chip 210 is electrically connected, through the die pad 234, to the heat sink 235, and the other electrode is electrically connected, through the bonding wire 214, to the lead 236, as shown in FIG. 3. With such configuration, it is also possible to inhibit the increase in temperature of the LED chip 210, increase the light output, and reduce the cost.

In each of the light emitting devices 201 of the LED unit 250 of the present embodiment, the air layer 280 is interposed between the dome-shaped color conversion member 270 and the optical member 260. Therefore, in the light that is emitted from the LED chip 210, passes through the sealing section 255 and the optical member 260, falls on the color conversion member 270, and is scattered by the particles of the fluorescent material of the color conversion member 270, the quantity of light that is scattered toward the optical member 260 side and transmitted by the optical member 260 can be reduced and the efficiency of taking the light from each light emitting device 201 to the outside can be increased.

In the LED unit 250 of the present embodiment, the second opening 244b and the third opening 244c are formed in the holding section 244 of the wiring board 240. Therefore, the second plated layer 247 may be formed, through spot plating, on the zones of the lead 236, heat sink 235, and wiring 238 that are exposed in the second opening 244b and the third opening 244c, and the Zener diode ZD and the connector CN can be each mounted with good positional accuracy by taking the second opening 244b and the third opening 244c as the respective marks.

Figure 13:
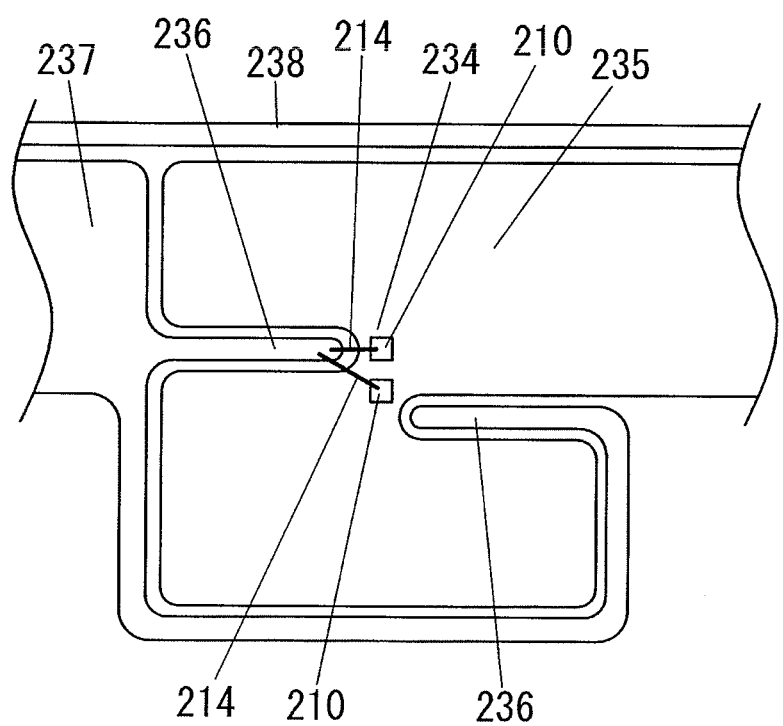
FIG. 13 is a schematic planar view illustrating a mounting example of an LED chip on the lead frame in Embodiment 1.

In the above-described example, one LED chip 120 with a chip size of 1 mm☐ is mounted for one base unit 233a, but the chip size of the LED chip 210 and the number of chips are not particularly limited. For example, an LED chip 210 with a chip size of 0.3 mm☐ may be used, and as shown in FIG. 13, a plurality (two in the example shown in the figure) of LED chips 210 may be mounted for each base unit 233a. In this case, two LED chips 210 are connected in parallel for one base unit 233a, and the parallel circuits of two LED chips 210 that are equal in number to the base units 233a are connected in series. Further, a plurality of LED chips 210 may be mounted on the sub-mount member 215 shown in FIG. 9.

Figure 14A:
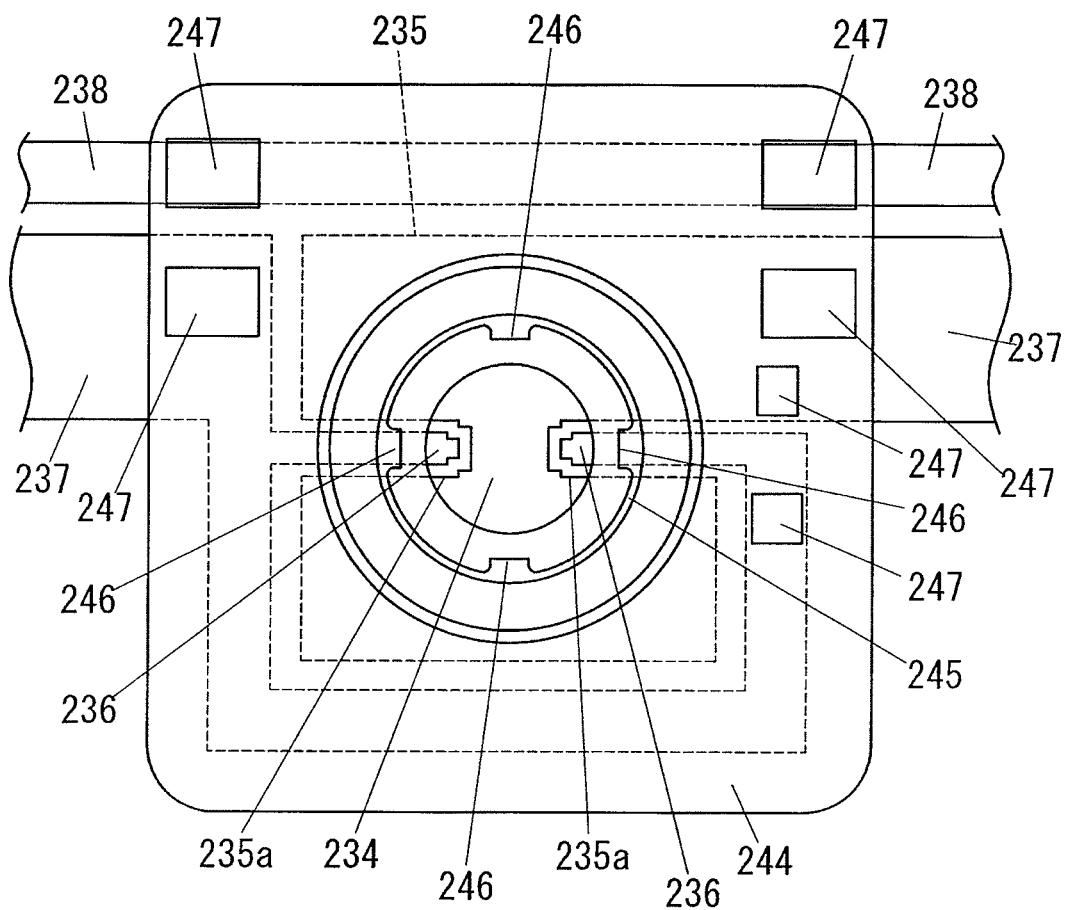
FIG. 14A is a principal schematic planar view illustrating another configuration example of the wiring board in Embodiment 1.
Figure 14B:
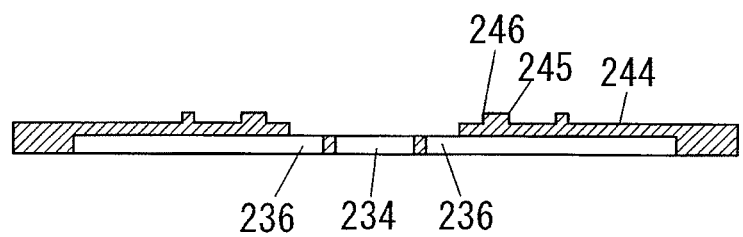
FIG. 14B is a principal schematic cross-sectional view illustrating another configuration example of the wiring board in Embodiment 1.

Further, in the wiring board 240 using the above-described lead frame 230, the pattern 233 is provided with the wiring 238 located lateral to the heat sink 235 across the plurality of base units 233a, and this wiring 238 is coupled to and electrically connected to the lead 236 of the base unit 233a at one end in the lengthwise direction of the outer frame section 231, but such configuration is not limited. For example, the lead frame 230 may be configured such that the wiring 238 could be used as extended connection, without connecting the wiring 238 with the lead 236 of the base unit 233a at the abovementioned one end. When the wiring board 240 using such a lead frame 230 is fabricated, the second plated layers 247 (two second plated layers 247 in the upper left section in FIG. 14A) that have been formed at the lead 236 and the wiring 238 may be exposed, as shown in FIG. 14, so as to enable the mounting of the connector for the extended connection that is provided with contacts electrically and individually connected to the lead 236 and the wiring 238. In this case, a plurality of LED units 250 are arranged in a row on one straight line, and the connector for the extended connection that is connected to the base unit 233a at the abovementioned one end of one LED unit 250 is electrically connected, through a connector cable, to the connector CN mounted on the base unit 233a at the abovementioned other end of the other LED unit 250 between the adjacent LED units 250, and power can be supplied from one lighting device to all of the LED units 250.

Figure 15:
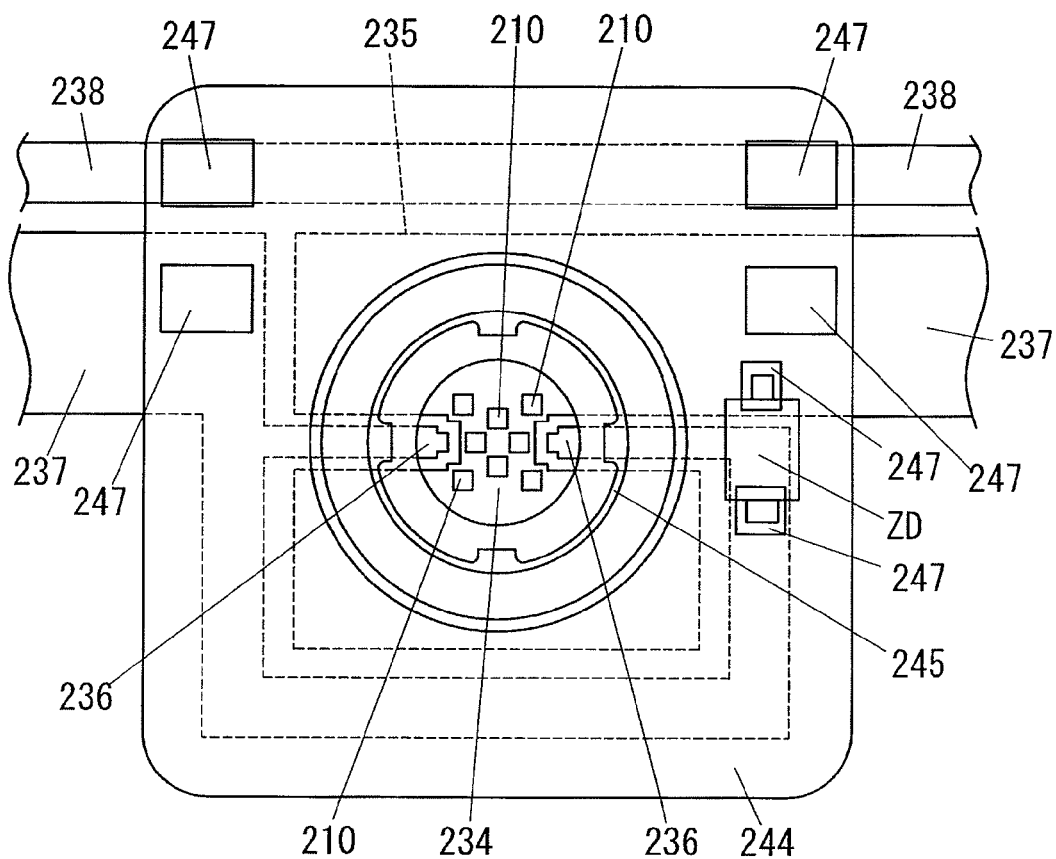
FIG. 15 is a schematic planar view illustrating an example in which an LED chip is mounted on another configuration example of the wiring board in Embodiment 1.

In the lead frame 230 used in the fabrication of the wiring board 240 shown in FIG. 14, two cut-in grooves 235a of the heat sink 235 are oriented so as to approach each other and the center line positions thereof are aligned. Therefore, as shown in FIG. 15, the degree of freedom in arranging the LED chips 210 in the case where a large number of LED chips 210 are mounted on the die pad 234 is increased.

Incidentally, in the wiring board 240 and the LED unit 250 explained hereinabove, the pattern 233 formed using the lead frame 230 is provided with the connection piece 237 that connects the lead 236 of one base unit 233a among the mutually adjacent base units 233a and the heat sink 235 of the other base unit 233a. Therefore, the LED unit 250 can be reduced in cost.

However, in the abovementioned wiring board 240 and the LED unit 250, substantially the entire pattern 233 is connected to the insulating layer 243. Therefore, there is a worry that the pattern 233 is peeled off from the insulating layer 243 by the stresses acting upon the pattern 233 due to a difference in linear expansion coefficient between the first metal plate 203 and the second metal plate 242 in the temperature range of use, for example, in the case where materials with different linear expansion coefficients are used for the first metal plate 203 and the second metal plate 242.

Figure 16:
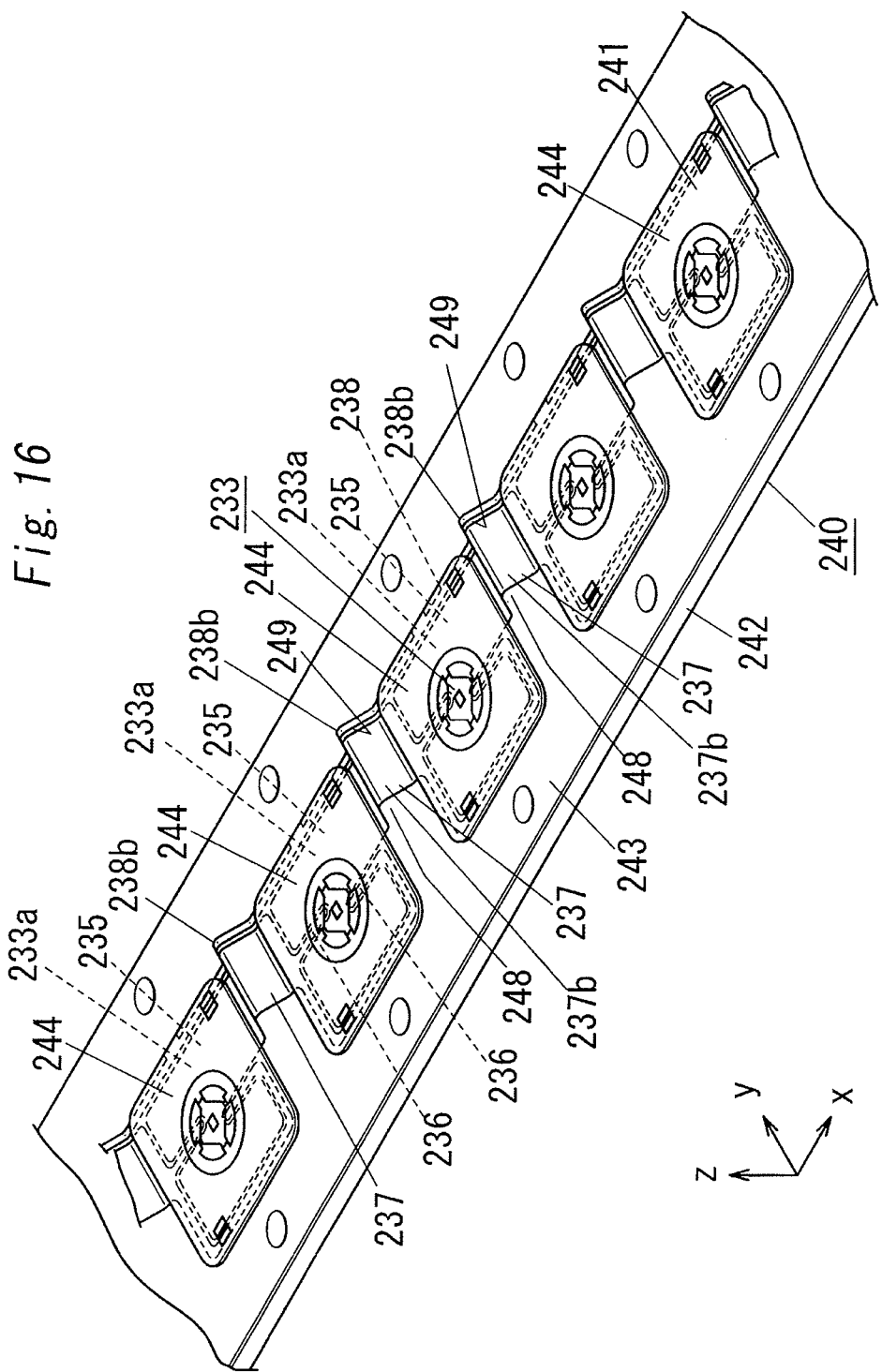
FIG. 16 is a schematic perspective view illustrating yet another configuration example of the wiring board in Embodiment 1.

Accordingly, for example, as shown in FIG. 16, a space 248 may be provided between the connection piece 237 and the insulating layer 243 in the wiring board 240, and the connection piece 237 may be provided with a stress relieving section 237b that is bent so as to absorb the stresses acting on the pattern 233 due to the difference in linear expansion coefficient between the first metal plate 203 and the second metal plate 242. Further, since the pattern 233 of the wiring board 240 shown in FIG. 16 is also provided with the wiring 238, a space 249 may be provided between the wiring 238 and the insulating layer 243, in relation to the zone positioned at the side of the connection piece 237, and the wiring 238 may be also provided with a stress relieving section 238b that is bent so as to absorb the stresses acting on the pattern 233 due to the difference in linear expansion coefficient between the first metal plate 203 and the second metal plate 242. In the example shown in FIG. 16, when the longitudinal direction for the second metal plate 242 (that is, the arrangement direction of the base units 233a) is taken as an x axis direction, the lateral direction of the second metal plate 242 is taken as a y axis direction, and the thickness direction of the second metal plate 242 is taken as a z axis direction, the stress relieving sections 237b, 238b may be formed by performing pressing such that the connection piece 237 and the wiring 238 are bent in the z axis direction before the pattern 233 and the insulating layer 243 are joined together. In this case, the stress relieving sections 237b, 238b shown in FIG. 16 are bent to have an inverted V shape in the cross section (an x-z plane) perpendicular to the y axis direction. With the wiring board 240 such as shown in FIG. 16, since the stress relieving sections 237b, 238b are provided, the pattern 233 can be prevented from being peeled off from the insulating layer 243 by the stresses acting upon the pattern 233 due to a difference in linear expansion coefficient between the first metal plate 203 and the second metal plate 242 even when materials with different linear expansion coefficients are used for the first metal plate 203 and the second metal plate 242.

Figures 17A, 17B:
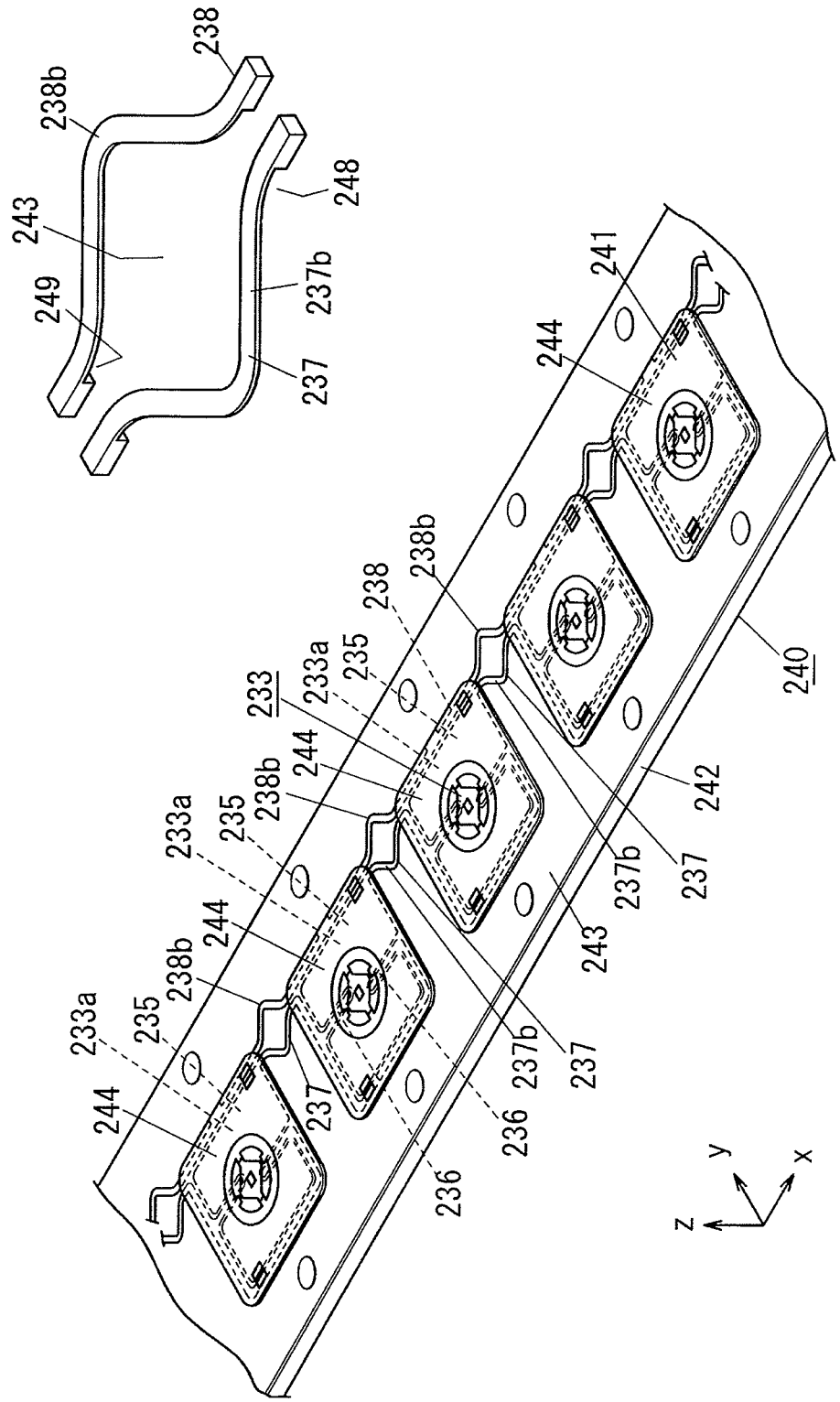
FIG. 17A is a schematic perspective view illustrating another configuration example of the wiring board in Embodiment 1.
FIG. 17B is a principal perspective view illustrating another configuration example of the wiring board in Embodiment 1.

The shapes of the stress relieving sections 237b, 238b are not limited to those of the example shown in FIG. 16 and, for example, may be such as shown in FIG. 17. The stress relieving sections 237b, 238b in FIG. 17 are obtained by bending the connection piece 237 and the wiring 238, respectively, in a V-like shape within the plane (an x-y plane) parallel to the joining plane of the second metal plate 242 with the insulating layer 243. In this case, the stress relieving section 237b of the connection piece 237 and the stress relieving section 238b of the wiring 238 are bent in a manner such that the distance between the central portions of the section 237b and the section 238b is larger than that between the ends of the section 237b and the section 238b at both sides.

The shape of the stress relieving sections 237b, 238b is not particularly limited to the V-like shape and may be different therefrom. Further, in the examples illustrated by FIG. 16 and FIG. 17, the pattern 233 is provided with the wiring 238, but providing the wiring 238 is not always necessary.

(Embodiment 2)

The basic configuration of the lead frame 230 of the present embodiment illustrated by FIG. 18A and FIG. 18B is substantially identical to that of Embodiment 1, the difference therebetween being that a plurality of basic units 233a are disposed so as to surround the center of the region surrounded by the outer frame section 231. The constituent elements same as those of Embodiment 1 are assigned with same reference numerals and the explanation thereof is herein omitted, as appropriate. FIG. 18A is a schematic perspective view of two-pitch sections of the lead frame 230.

In the lead frame 230 of the present embodiment, a plurality (ten in the example shown in the figure) of base units 233a is disposed separately on two concentric virtual circles, and the number of the die pads 234 on the virtual circle positioned relatively outside is larger than the number of the die pads 234 on the virtual circle positioned relatively inside. Therefore, in the wiring board 240 (see FIG. 22) manufactured using such lead frame 230, the arrangement of the die pads 234 is the same as in the lead frame 230. Further, in the LED unit 250 (see FIG. 24) manufactured using the wiring board 240, when the number of the LED chip units 210 (see FIG. 8 and FIG. 9) mounted on each die pad 234 is the same (for example, one), the number of the LED chips 210 on the virtual circle positioned relatively outside is larger than the number of the LED chips 210 on the virtual circle positioned relatively inside, those two virtual circles being taken as a reference.

Further, the pattern 233 of the lead frame 230 is provided with two power feed lines 139 extending from respective heat sinks 235 of two base units 233a for feeding power to the series circuit of the LED chips 210.

Further, in the wiring board 240, second plated layers 247 (see FIG. 22) having a laminated structure of a Ni film, a Pd film, and an Au film are formed on the main front surfaces of the distal portions of the two power feed lines 139. Therefore, power can be supplied to the series circuit of the LED units 210 and the units can be lit up, for example, by connecting an electric cable for power feed from a lighting device (not shown in the figure) to the second plated layers 247 of the two power feed lines 139.

Figure 24:
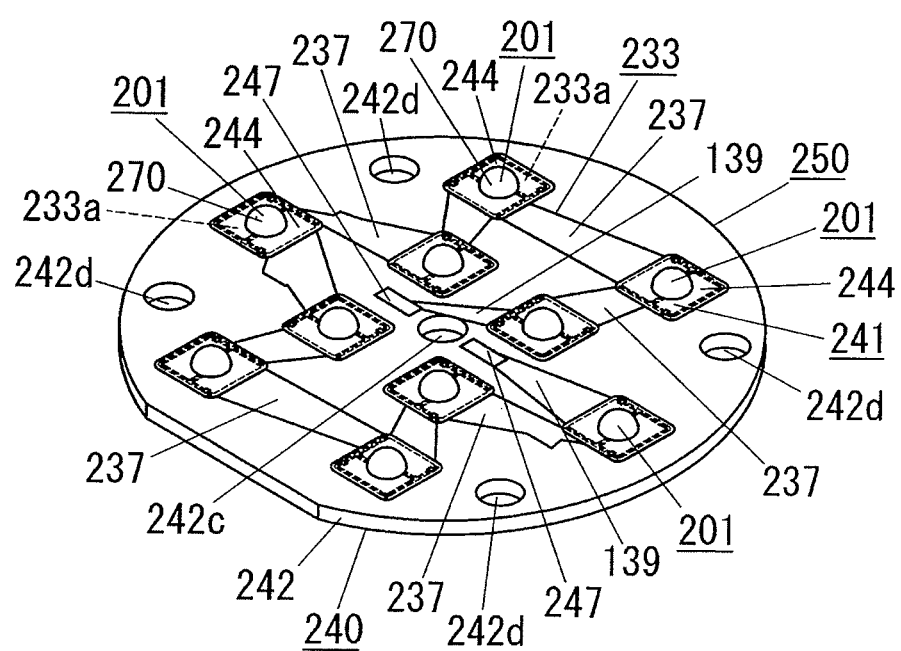
FIG. 24 is a schematic perspective view for explaining a method for manufacturing the LED unit in Embodiment 2.

As shown in FIG. 24, in the wiring board 240 and the LED unit 250, the second metal plate 242 is formed in a round disk shape, and an electric cable insertion hole 242c through which a pair of electric cables for power feed can be inserted is formed in the central portion of the second metal plate 242. Further, a plurality (four in the example shown in the figure) of holes 242d for inserting screws that are used when attaching the LED unit 250 to another member such as a fixture body of an illumination fixture are formed substantially equidistantly in the circumferential direction of the second metal plate 242 in the circumferential section of the second metal plate 242.

A method for manufacturing the LED unit 250 is described below with reference to FIG. 18 to FIG. 22, but the explanation of steps similar to those of Embodiment 1 is omitted, as appropriate.

Figure 19A:
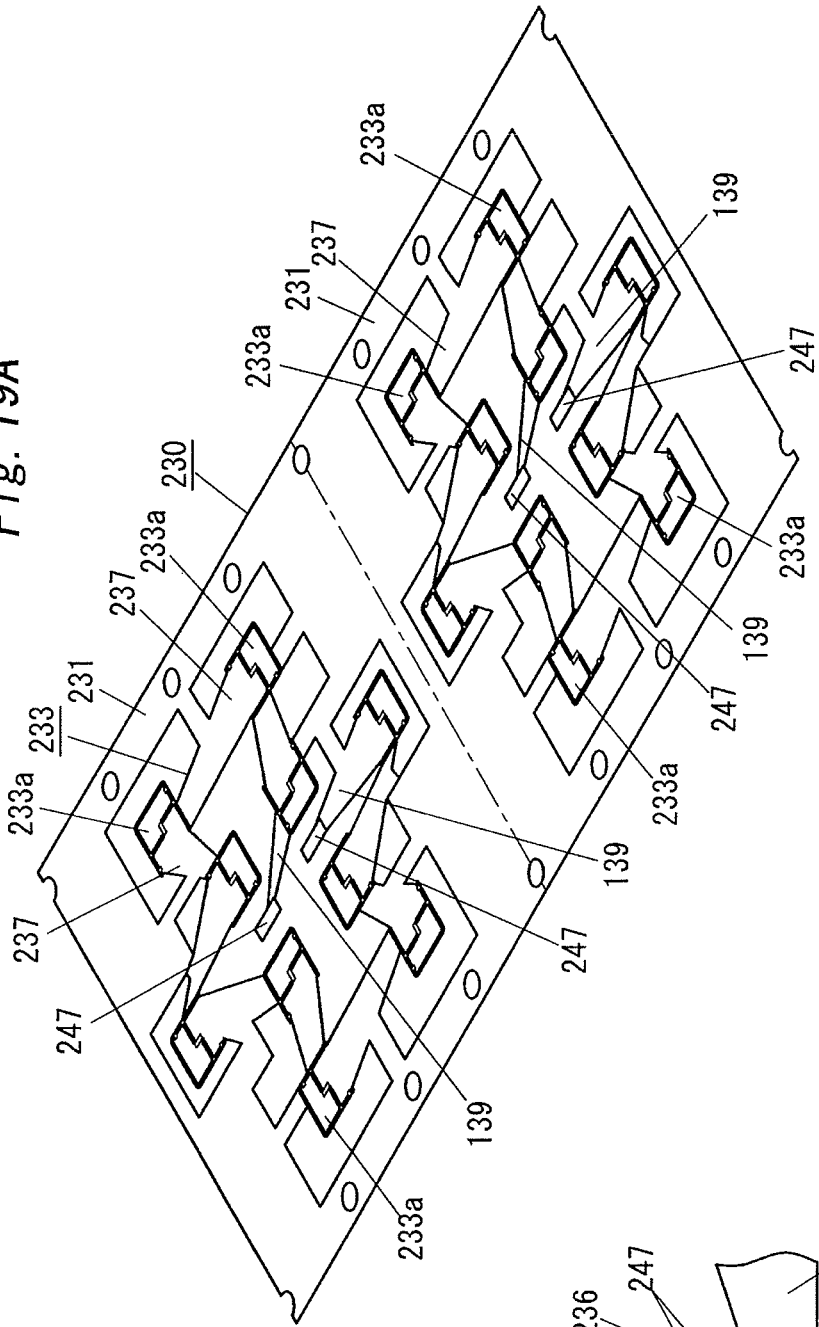
FIG. 19A is a schematic perspective view for explaining a method for manufacturing the LED unit in Embodiment 2.
Figure 19B:
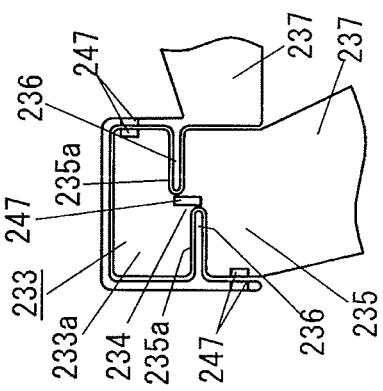
FIG. 19B is a principal schematic planar view for explaining a method for manufacturing the LED unit in Embodiment 2.

Initially, a pattern formation step is performed in which the lead frame 230 shown in FIG. 18 is formed by performing pressing or etching of the first metal plate 203. Then, the first plating step is performed in which, for example, the first plated layer constituted by a Ni film is formed on the rear surface of the pattern 233 and the third plated layer constituted by a Ni film is formed on the main front surface of the pattern 233, and then the second plating step is performed in which a Pd film and an Au film of the second plated layer 247 are formed. As a result, the structure shown in FIG. 19 is obtained.

After the second plating step, a molding step of injection molding the holding section 244 is performed thereby obtaining the structure shown in FIG. 20 in which the module 241 is supported by the outer frame section 231 through the support piece 232.

Figure 21:
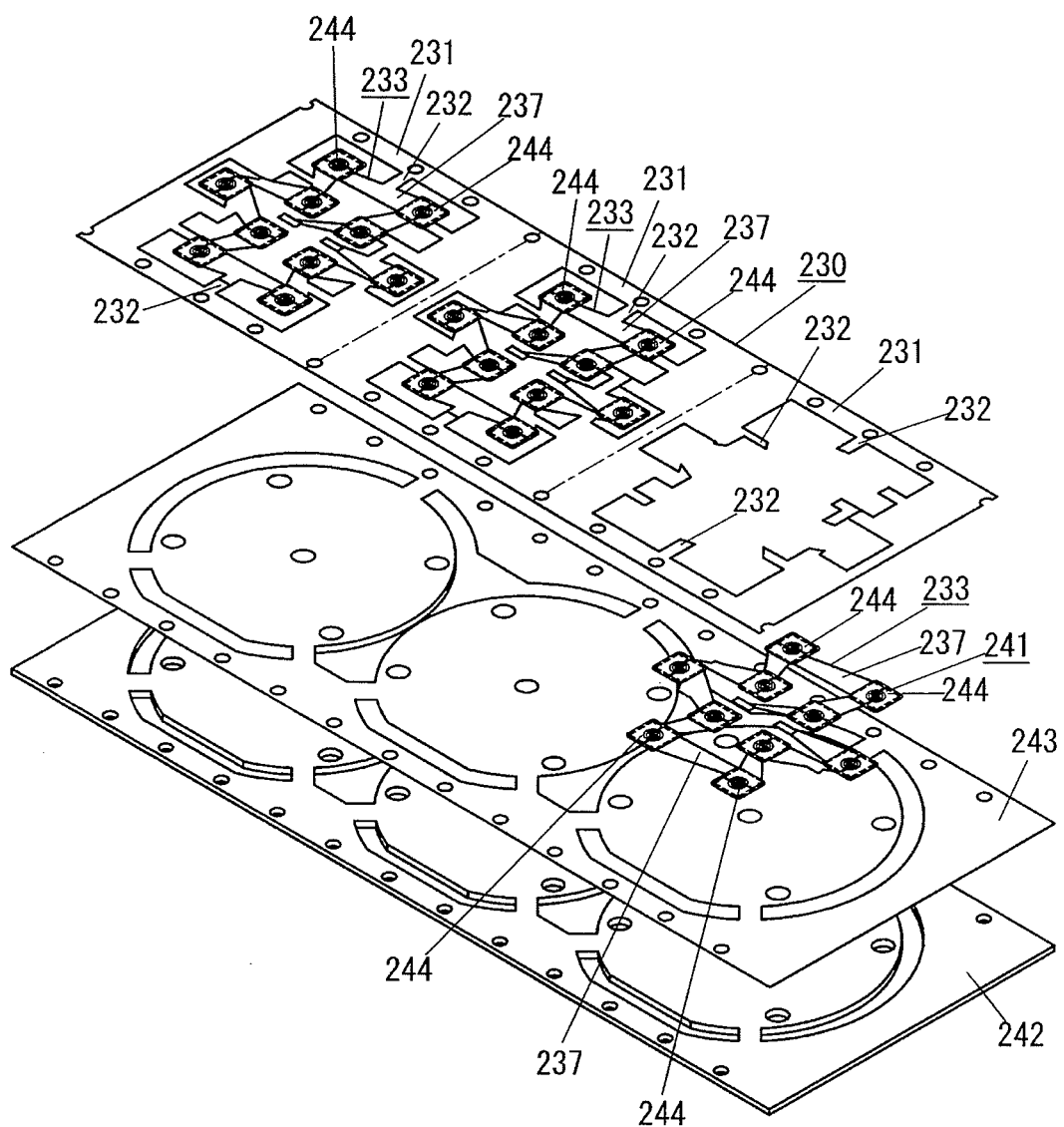
FIG. 21 is a schematic perspective view for explaining a method for manufacturing the LED unit in Embodiment 2.
Figure 22:
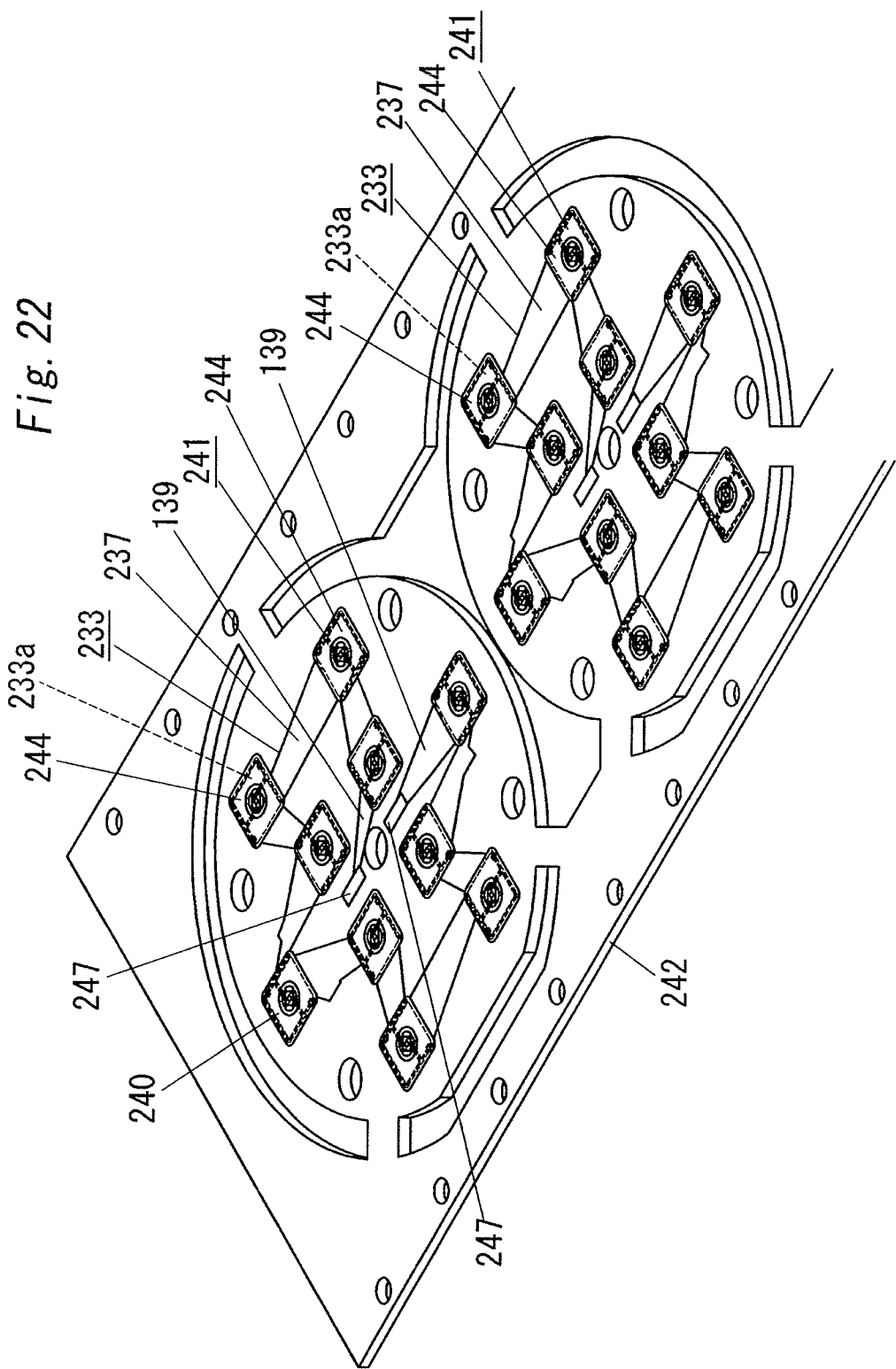
FIG. 22 is a schematic perspective view for explaining a method for manufacturing the LED unit in Embodiment 2.

Then, as shown in FIG. 21, a cutting step is performed of cutting off the module 241 from the support piece 232 of the lead frame 230, and then a joining step is performed in which the module 241 and the second metal plate 242 are joined together through the insulating layer 243. As a result, the wiring board 240 with the structure shown in FIG. 22 is obtained. Here, the second metal plates 242 and the insulating layers 243 enabling multi-cavity are used.

A mounting step is then performed in which the LED chip 210 is mounted on the die pad 234 and the Zener diode ZD (see FIG. 23) is mounted, and the LED chip 210 is electrically connected to the appropriate portions of the base unit 233a through the bonding wire 214. Then, a sealing step is performed in which the LED chip 210 and the bonding wire 214 (see FIG. 2 and FIG. 3) are sealed with the sealing section 255 (see FIG. 8 and FIG. 9). In the sealing step, initially, the liquid first translucent material (for example, a silicone resin, an acrylic resin, glass, or the like) constituting a portion of the sealing section 255 is injected into the gap between the outer side surface of the LED chip 210 and the inner circumferential surface of the first opening 244a (see FIG. 20B) and then is cured. Then, the liquid first translucent material (for example, a silicone resin, an acrylic resin, glass, or the like) constituting the remaining portion of the abovementioned sealing section 255 is injected into the dome-shaped optical member 260 (see FIG. 8, FIG. 9, and FIG. 23). The optical member 260 is then disposed at the predetermined position in the wiring board 240 and the first translucent material is cured, thereby forming the sealing section 255 and, at the same time, fixedly attaching the optical member 260 to the wiring board 240. Further, in the mounting step (first mounting step) preceding the sealing step, only the LED chip 210 may be mounted and then the second mounting step of mounting the Zener diode ZD and connector CN may be performed after the sealing step.

Figure 23:
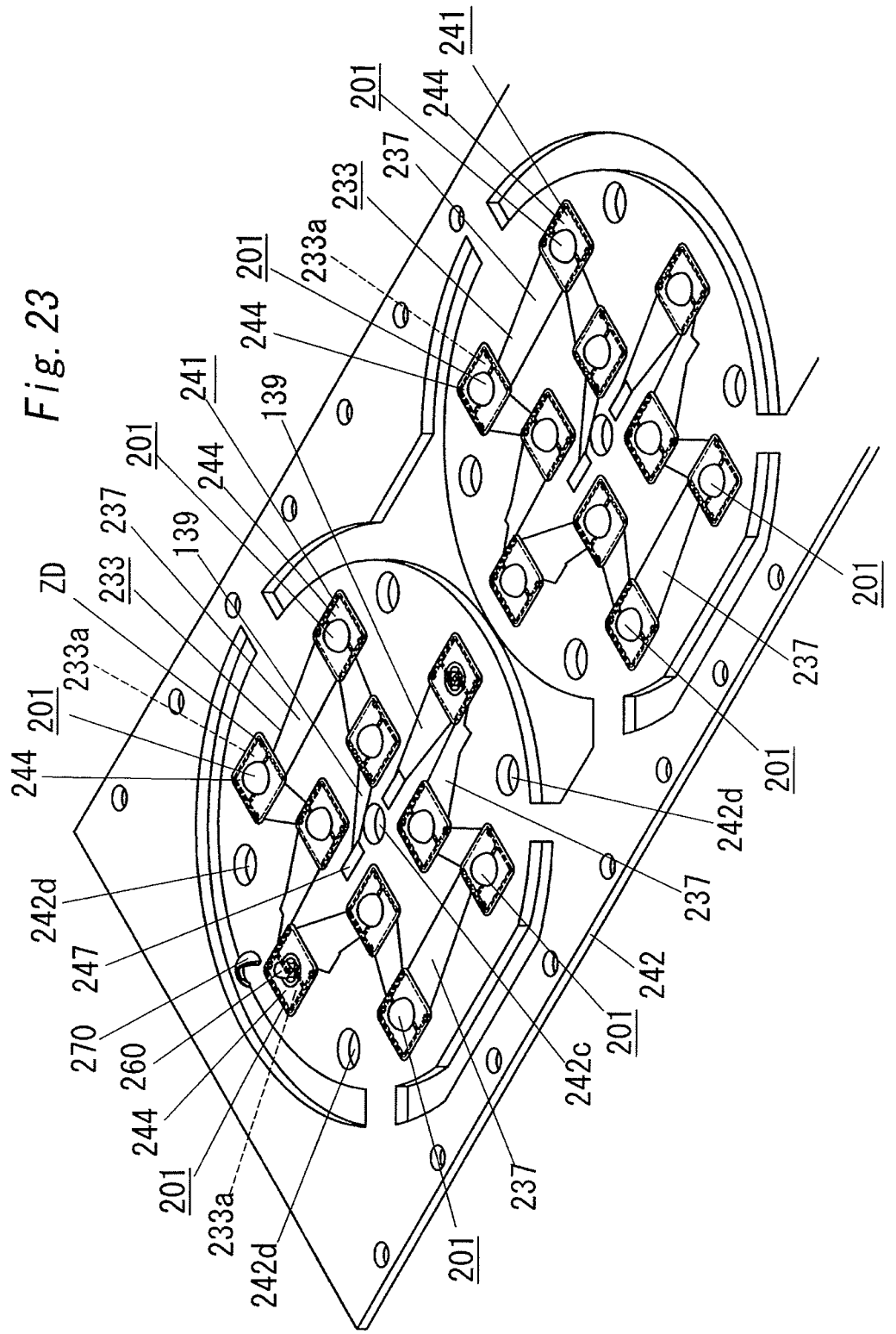
FIG. 23 is a schematic perspective view for explaining a method for manufacturing the LED unit in Embodiment 2.

After the above-described LED chip 210, Zener diode ZD, and connector CN have been mounted and the sealing section 255 has been formed, an attachment step of attaching the color conversion member 270 to the wiring board 240 is performed. As a result, a plurality of LED units 250 are obtained as shown in FIG. 23. Then, the LED unit 250 shown in FIG. 24 is obtained by cutting into individual LED units 250.

In the lead frame 230 of the present embodiment explained above, a plurality of base units 233a are disposed so as to surround the center of the region surrounded by the outer frame section 231. Therefore, the circular LED unit 250 in which a plurality of LED chips 210 are connected and used in series is reduced in cost.

In the wiring board 240 of the present embodiment, similarly to Embodiment 1, the increase in temperature of the LED chip 210 is inhibited, the light output is increased, and the LED unit 250 in which the plurality of LED chips 210 are connected and used in series is reduced in cost.

In the LED unit 250 of the present embodiment, similarly to Embodiment 1, the heat generated by the LED chip 210 can be efficiently radiated from the heat sink 235 and the die pad 234 formed using the above-described lead frame 230 through the second metal plate 242, the increase in temperature of the LED chip 210 can be inhibited, the light output is increased, and the cost is reduced.

The space 248 and the stress relieving section 237b explained hereinabove with reference to FIG. 16 and FIG. 17 may be also provided in the wiring board 240 and the LED unit 250 of the present embodiment.

In the above-described embodiments, the light emitting device 201 is provided with the color conversion member 270, but when the LED chip 210 itself can emit white light or when a fluorescent material is dispersed in the sealing section 255, a structure that is not provided with the above-described color conversion member 270 can be also used.

(Embodiment 3)

A light emitting unit 1 of the present embodiment is explained below with reference to FIG. 25 to FIG. 32.

The light emitting unit 1 comprises a mounting substrate 2 and a plurality of solid-state light emitting elements 3 disposed on one surface side of the mounting substrate 2.

The mounting substrate 2 comprises a heat transfer plate 21 having the solid-state light emitting elements 3 mounted on one surface side of the heat transfer plate 21, a wiring pattern 22 disposed on the other surface side of the heat transfer plate 21 and electrically connected to the solid-state light emitting elements 3, and an insulating layer 23 (first insulating layer 23) interposed between the heat transfer plate 21 and the wiring pattern 22. In this configuration, the heat transfer plate 21 is formed of the first metal plate, and the wiring pattern 22 is formed of a second metal plate with a linear expansion coefficient different from that of the first metal plate. The mounting substrate 2 is provided with a base substrate 24 that has a smaller difference in linear expansion coefficient with the first metal plate than with the second metal plate and is disposed on the side of the wiring pattern 22 that is opposite to the heat transfer plate 21, and a second insulating layer 25 interposed between the wiring pattern 22 and the base substrate 24.

Each constituent element of the light emitting unit 1 is described below in greater detail.

The mounting substrate 2 is formed in an elongated shape, and on the abovementioned one surface side thereof, a plurality of solid-state light emitting elements 3 are disposed along the longitudinal direction of the mounting substrate 2.

The heat transfer plate 21 is formed in an elongated shape (in this configuration, a narrow rectangular plate-like shape). A metal with a high thermal conductivity such as aluminum, copper or the like is preferred as the material for the first metal plate serving as a foundation for the heat transfer plate 21. However, the material for the first metal plate is not limited to the aforementioned metals and may be, for example, stainless steel or steel.

It is preferred that the heat transfer plate 21 have the function of a reflective plate, and it is more preferred that aluminum be used as the material for the first metal plate. It is further preferred that the first metal plate of the heat transfer plate 21 be an aluminum plate, an aluminum film of a purity higher than that of the aluminum plate be laminated on the side of the aluminum plate that is opposite to the first insulating layer 23 side, and a reflection increasing film formed of dielectric films of two types that have different refractive indexes be laminated on the aluminum film. In this case, for example, a SiO2 film and a TiO2 film are preferably used as the dielectric films of two types. When such a heat transfer plate 21 is used, the reflectance with respect to the visible light can be made equal to or greater than 95%. For example, MIRO 2 and MIRO (registered trade marks) manufactured by Alanod Co., can be used as the heat transfer plate 21. An aluminum plate that has been surface treated by anodization may be used as the aforementioned aluminum plate. The thickness of the heat transfer plate 21 may be set, as appropriate, for example within a range of about 0.2 mm to about 3 mm.

An LED chip is used as the solid-state light emitting element 3, but such a selection is not limited and, for example, a packaged LED chip may be also used. For example, a laser diode (semiconductor laser) or an organic EL element may be used as the solid-state light emitting element 3.

Figure 27:
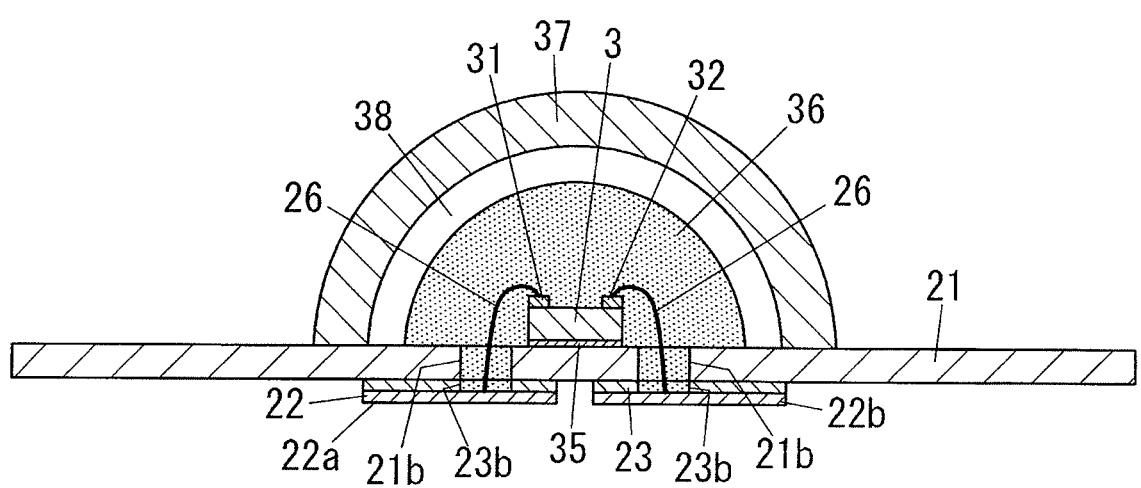
FIG. 27 is a principal schematic cross-sectional view of the light emitting unit of Embodiment 3.

In the solid-state light emitting element 3, as shown in FIG. 27, a first electrode (anode electrode) 31 and a second electrode (cathode electrode) 32 are provided on one surface side in the thickness direction, and the other surface side in the thickness direction is joined, through a joining section 35, to the heat transfer plate 21. In the solid-state light emitting element 3, the first electrode 31 and the second electrode 32 are electrically connected to the wiring pattern 22 through respective wires (bonding wires) 26. In this configuration, through holes 21*b* for passing the wires 26 are formed in the heat transfer plate 21. The through holes 21*b* are formed at both sides of the mounting region of the solid-state light emitting element 3 in the width direction of the heat transfer plate 21. Each through hole 21*b* has a round opening shape. The inner diameter of each through hole 21*b* is set to 0.5 mm, but this value is merely exemplary and is not particularly limited. The shape of each through hole 21*b* is not necessarily round and may be rectangular or elliptical. When the solid-state light emitting element 3 is an LED chip, the joining section 35 may be formed of a die bond material.

The LED chip is a GaN blue LED chip emitting blue light, and a chip provided with a sapphire substrate as the substrate is used. However, the substrate of the LED chip is not limited to the sapphire substrate and, for example, a GaN substrate, a SiC substrate, and a Si substrate may be used. The structure of the LED chip is not particularly limited.

The size of the LED chips is not particularly limited. For example, the chip size may be 0.3 mm□, 0.45 mm□, or 1 mm□.

The material and emission color of the light emitting layer of the LED chip are not particularly limited. For example, the LED chip is not limited to the blue LED chip and, for example, a violet LED chip, an ultraviolet LED chip, a red LED chip, a green LED chip, or the like may be used.

For example, a die bond material of a silicone system, a die bond material of an epoxy system, or a silver paste can be used as the die bond material.

For example, a gold wire, an aluminum wire or the like can be used as the wire 26.

Incidentally, when an LED chip is used as the solid-state light-emitting element 3, it is preferred that the light emitting unit 1 be provided with a sealing section 36 that seals the solid-state light-emitting element 3 and the wire 26 at the abovementioned one surface side of the heat transfer plate 21, as shown for example in FIG. 27. In FIG. 27, a silicone resin that is the first translucent material is used as the material for the sealing section 36. The first translucent material is not limited to the silicone resin and, for example, an epoxy resin, an acrylic resin, glass or the like may be used.

Further, in order to obtain high-output white light when an LED chip is used as the solid-state light-emitting element 3, it is preferred that the light emitting unit 1 be provided with a color conversion unit 37 that has a wavelength converting material that emits light of a color different from the emission color of the LED chip. It is preferred that, for example, a fluorescent material emitting light of a color different from the emission color of the LED chip when excited by the light emitted from the LED chip be used as the wavelength converting material for the color conversion unit 37 and that a fluorescent material and a second translucent material be included.

The light emitting unit 1 uses, for example, a blue LED chip as the LED chip, and when a yellow fluorescent material is used as the fluorescent material for the color conversion unit 37, white light can be obtained. Thus, in the light emitting unit 1, the blue light emitted from the LED chip and the light emitted from the yellow fluorescent material are emitted through the front surface of the color conversion unit 37 and thereby white light can be obtained. The second translucent material used as the material for the color conversion member 37 is not limited to the silicone resin and may be, for example, an acrylic resin, glass, or an organic-inorganic hybrid material prepared by mixing and bonding organic and inorganic components at a nanometer level or molecular level. Further, the fluorescent material used as the material for the color conversion member 37 is not limited to the yellow fluorescent material. For example, color rendering ability can be increased by using a yellow fluorescent material and a red fluorescent material, or a red fluorescent material and a green fluorescent material. Further, the fluorescent material used as the material for the color conversion unit 37 is not limited to the yellow fluorescent material of one type, and yellow fluorescent materials of two types that have different emission peak wavelengths may be used.

Further, when white light can be radiated by an LED chip itself, when a fluorescent material is dispersed in the sealing section 36, or when the color of light which is wished to be obtained in the light emitting unit 1 is same as the color of light emitted by the LED chip, a configuration can be used that is not provided with the color conversion unit 37.

Figure 33:
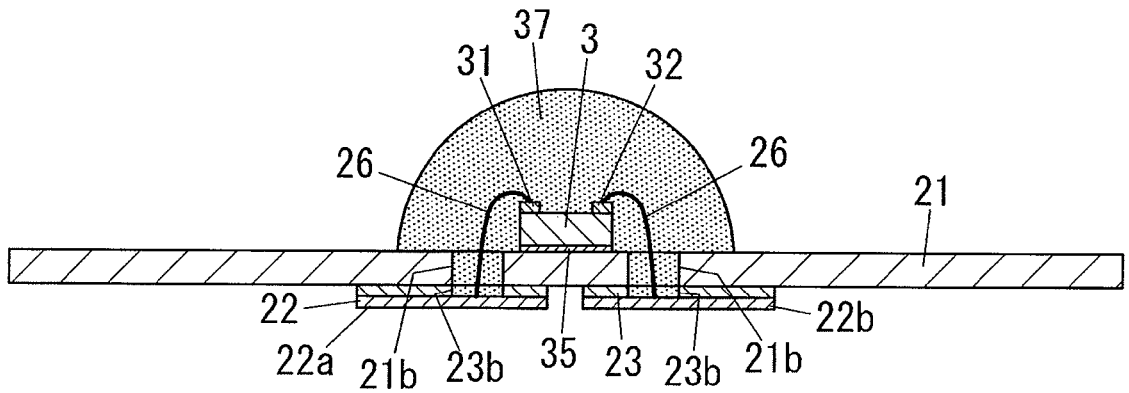
FIG. 33 is a principal schematic cross-sectional view of another configuration example of the light emitting unit of Embodiment 3.
Figure 34:
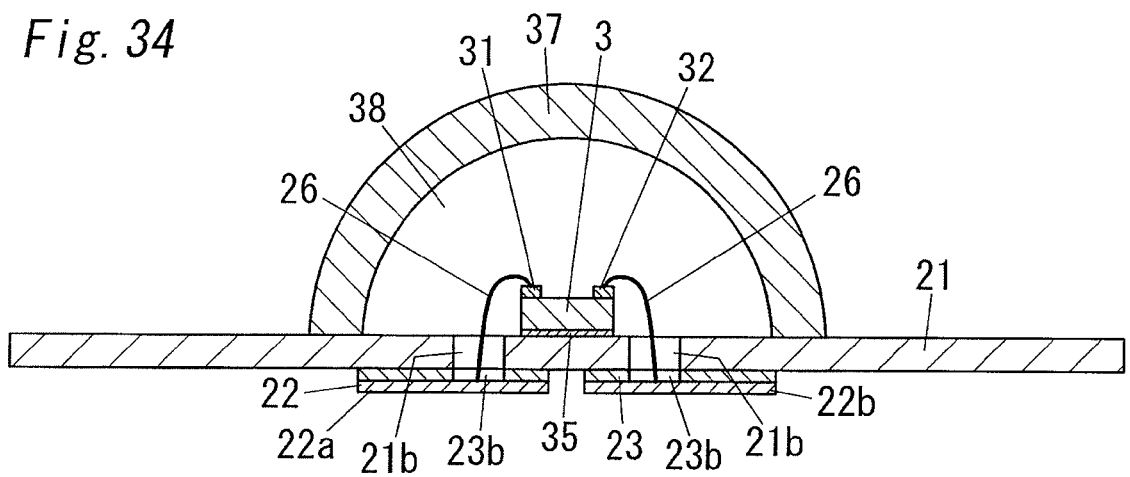
FIG. 34 is a principal schematic cross-sectional view of yet another configuration example of the light emitting unit of Embodiment 3.
Figure 35:
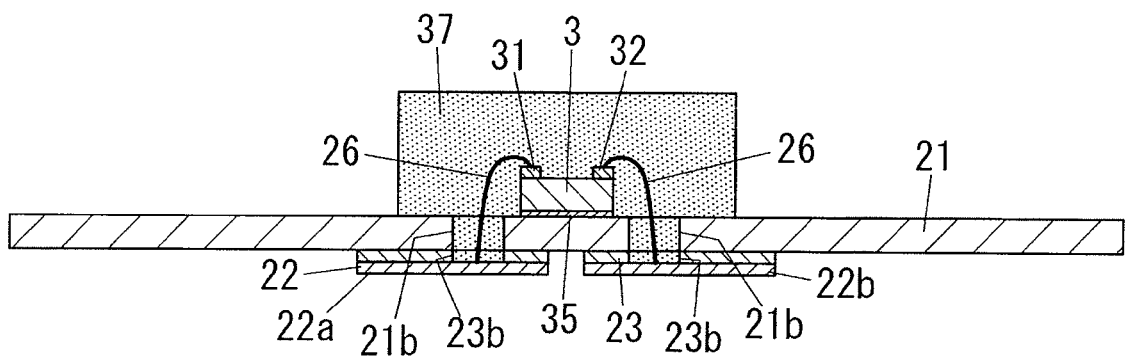
FIG. 35 is a principal schematic cross-sectional view of another configuration example of the light emitting unit of Embodiment 3.

In the light emitting unit 1, the light conversion unit 37 is preferably in contact with the heat transfer plate 21. As a result, in the light emitting unit 1, not only the heat generated by the LED chip, but also the heat generated by the color conversion unit 37 can be radiated through the heat transfer plate 21 and the light output can be increased. In the example shown in FIG. 27, the color conversion unit 37 is formed in a semicylindrical shape and provided, in a form such as to surround the LED chip and the sealing section 36, between the color conversion unit and the heat transfer plate 21 at the abovementioned one surface side of the heat transfer plate 21. More specifically, the color conversion unit 37 is provided such that a gas layer (for example, an air layer) 38 is formed between the color conversion unit and the sealing section 36 at the abovementioned one surface side of the heat transfer plate 21. As shown in FIG. 33, in the light emitting unit 1, the color conversion unit 37 may have a semispherical shape, and the LED chip, which is the solid-state light emitting element 3, and the wire 26 may be sealed by the color conversion unit 37. Further, as shown in FIG. 34, in the light emitting unit 1, the color conversion unit 37 may have a dome-like shape, and the LED chip, which is the solid-state light emitting element 3, and the wire 26 may be sealed by the color conversion unit 37. Further, as shown in FIG. 35, in the light emitting unit 1, the color conversion unit 37 may be shaped as a layer, and the LED chip, which is the solid-state light emitting element 3, and the wire 26 may be sealed by the color conversion unit 37. The color conversion unit 37 such as shown in FIG. 27 or FIG. 34 may be used in a molded form, and the end edge of the color conversion unit 37 (circumferential edge of the opening) on the heat transfer plate 21 side may be fixedly attached to the heat transfer plate 21 by using, for example, an adhesive (for example, a silicone resin or an epoxy resin). The color conversion unit 37 such as shown in FIG. 33 can be formed, for example, by a molding method. The color conversion unit 37 such as shown in FIG. 35 can be formed, for example, by a coating method using a dispenser or a screen printing method.

The wiring pattern 22 is formed of the second metal plate that has a linear expansion coefficient different from that of the heat transfer plate 21, as mentioned hereinabove. In this case, the second metal plate uses the lead frame 120 (see FIG. 32C) formed by punching a metal hoop material with a press.

Copper, which has a comparatively high thermal conductivity among the metals (thermal conductivity of copper is about 398 W/m·K) is preferred as a material for the second metal plate, but copper is not a limiting material and, for example, phosphorus bronze or a copper alloy (for example, 42 Alloy) may be used. It is also preferred that the thickness of the second metal plate be set, for example, within a range of from about 100 µm to about 1500 µm.

Figure 32A:
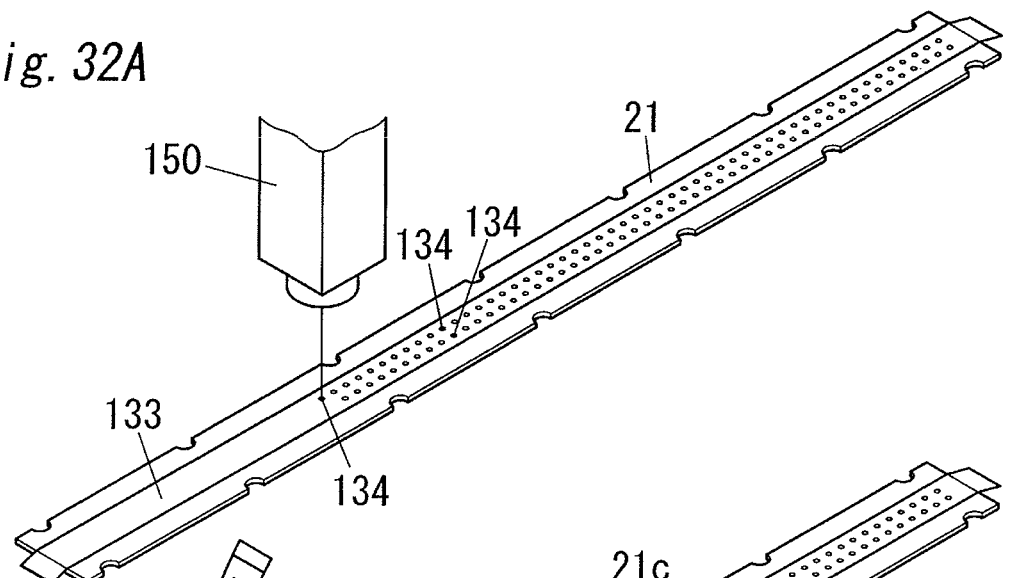
FIG. 32 is an explanatory drawing illustrating a method for manufacturing the mounting board in the light emitting unit of Embodiment 3.
Figure 32B:
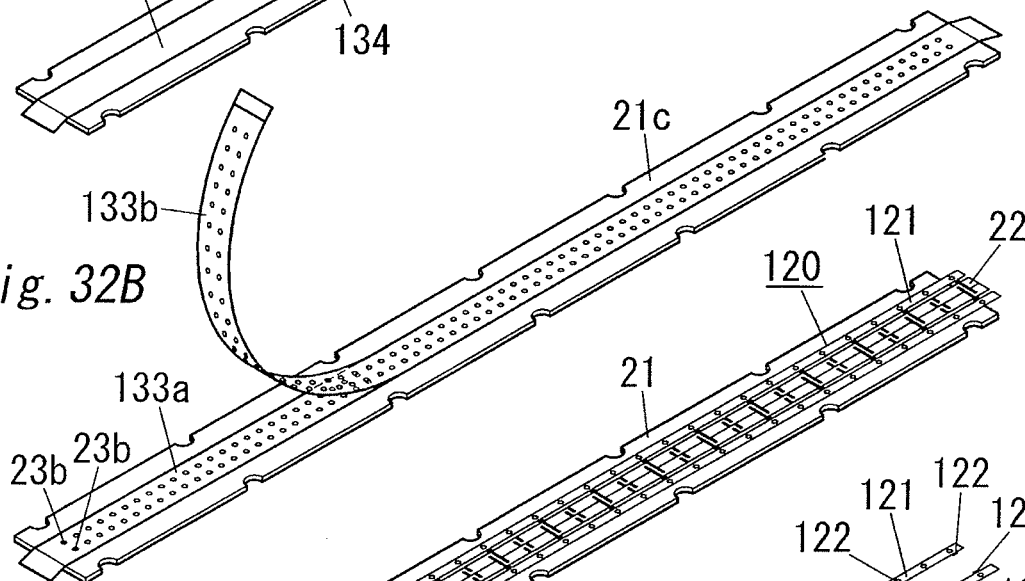
Figure 32C:
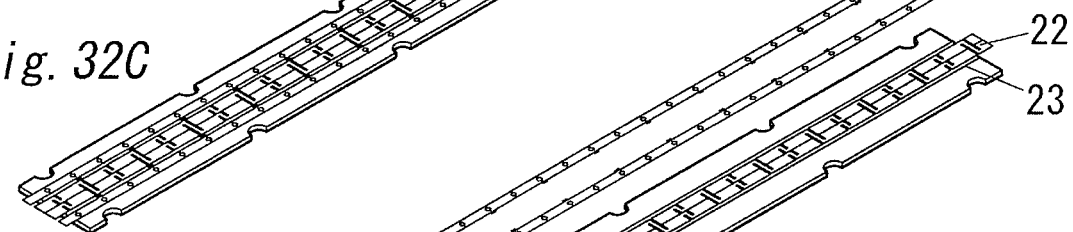
Figure 32D:
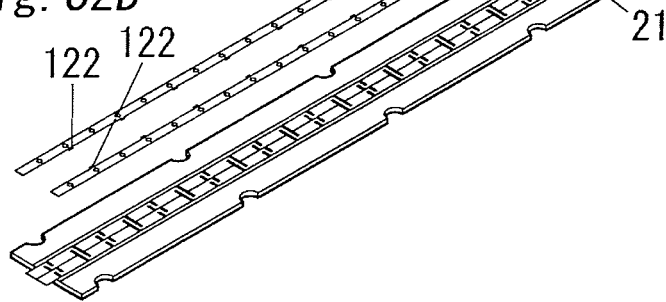

In the lead frame 120, the wiring pattern 22 is supported inside of the outer frame section 121 through the support piece 122 (see FIG. 32D).

Figure 30:
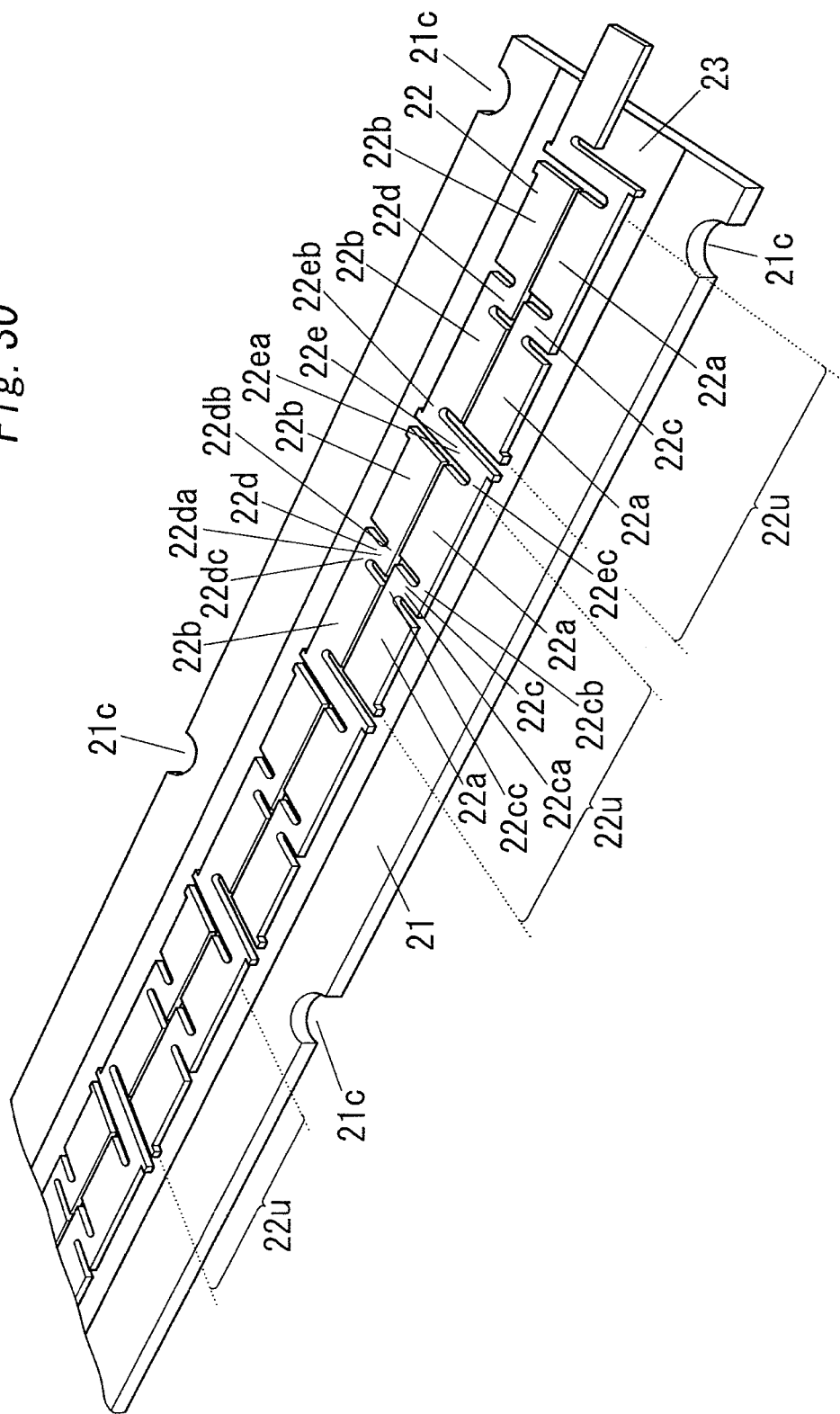
FIG. 30 is a principal perspective view of the mounting board in the light emitting unit of Embodiment 3.

In the wiring pattern 22, a first pattern 22a to which the first electrode 31 of the solid-state light emitting element 3 is connected and a second pattern 22b to which the second electrode 32 is connected are arranged in rows in the width direction of the heat transfer plate 21. Further, in the wiring pattern 22, a predetermined number (for example, 16) of the first patterns 22a and the second patterns 22b is provided and, as shown in FIG. 30, the first patterns 22a and the second patterns 22b are disposed in rows in the longitudinal direction of the heat transfer plate 21. The first pattern 22a and the second pattern 22b are formed in an elongated shape and disposed so that the longitudinal direction thereof matches that of the heat transfer plate 21. Further, in the wiring pattern 22, the first patterns 22a arranged in a row in the longitudinal direction of the heat transfer plate 21 are divided into sets, each set including two first patterns 22a, and the first patterns 22a constituting the set are coupled to each other through a connection piece 22c. Further, in the wiring pattern 22, the second patterns 22b that are arranged in a row in a predetermined number (for example, 16) in the longitudinal direction of the heat transfer plate 21 are divided into sets, each set including two second patterns 22b, and the second patterns 22b forming the set are coupled to each other through a connection piece 22d and electrically connected. The connection pieces 22c, 22d are constituted by linear first portions 22ca, 22da disposed along the width direction of the heat transfer plate 21 and second portions 22cb, 22db and third portions 22cc, 22dc extending in the opposite directions in the longitudinal direction of the heat transfer plate 21 from both ends of the first portions 22ca, 22da in the longitudinal direction. Further, the connection piece 22c is formed to be narrower than the first pattern 22a, and the connection piece 22d is formed to be narrower than the second pattern 22b. In this case, in the wiring pattern 22, one base pattern 22u is constituted by two first patterns 22a forming a set, the connection piece 22c that connects those two first patterns 22a, two second patterns 22b forming a set, and the connection piece 22d that connects those two second patterns 22b. In the above-described lead frame 120, a plurality of base units 22u are arranged along the lengthwise direction of the outer frame section 121. Further, in the wiring pattern 22, in the base patterns 22u adjacent in the longitudinal direction of the heat transfer plate 21, the first pattern 22a of one base pattern 22u and the second pattern 22b of the other base pattern 22u are coupled to each other through a linking piece 22e and electrically connected. The linking piece 22e is formed to be narrower than the first pattern 22a and the second pattern 22b.

In the wiring pattern 22, a parallel circuit can be configured for each base pattern 22u by connecting in parallel a predetermined number (for example, six) of the solid-state light emitting elements 3 that are disposed in rows in the longitudinal direction of the heat transfer plate 21, and the parallel circuits formed for each of the adjacent base patterns 22u can be connected in series. Therefore, power can be supplied to all of the solid-state light emitting elements 3 by supplying power between the first pattern 22a at one end and the second pattern 22b at the other end in the longitudinal direction of the heat transfer plate 21.

The first insulating layer 23 is formed by thermally curing an epoxy resin layer of a thermosetting sheet-shaped adhesive (for example, an adhesive sheet TSA manufactured by Toray Industries, Inc.) in which a plastic film (PET film) is laminated with a B-stage epoxy resin layer (thermosetting resin) that includes a filling material formed of a filler such as silica or alumina and can reduce the viscosity and increase the flowability under heating. An insulating material with a thermal conductivity higher than that of the epoxy resin, which is a thermosetting resin, may be used as the filler. In this case, the epoxy resin layer of the sheet-shaped adhesive features electric insulation ability, a high thermal conductivity, high flowability under heating, and high ability to adhere to a rough surface. Therefore, it is possible to prevent the appearance of gaps between the first insulating layer 23 and the heat transfer plate 21 or the wiring pattern 22, adhesion reliability is increased, and the increase in thermal resistance or the appearance of spread caused by insufficient adhesion can be inhibited. In this case, thermal resistance from each solid-state light emitting element 3 to the wiring pattern 22 can be reduced, spread in thermal resistance can be also reduced, heat radiation ability can be increased and the increase in temperature of the junctions of the solid-state light emitting elements 3 can be inhibited, compared with those attained in the case where a heat radiating sheet in the form of a rubber sheet such as SARCON (registered trade name) is sandwiched between the heat transfer plate 21 and the wiring pattern 22. Therefore, the input power can be increased and the light output can be increased. The thickness of the aforementioned epoxy resin layer is set to 100 µm, but this value is merely exemplary and not limited. For example, the thickness of the epoxy resin layer may be set, as appropriate, within a range of about 50 µm to about 150 µm. The thermal conductivity of the aforementioned epoxy resin layer is preferably equal to or higher than 4 W/m·K. Prior to laminating the wiring pattern 22 and the heat transfer plate 21, the plastic film of the sheet-shaped adhesive is peeled off from the epoxy resin layer. In short, the plastic film is peeled off after the surface on the side opposite to the plastic film in the epoxy resin layer has been fixedly attached to the object.

In this case, when the first insulating layer 23 is formed, a pressure may be applied, as appropriate, in a state in which the heat transfer plate 21, the epoxy resin layer, and the lead frame 120 having the wiring pattern 22 are laminated.

The outer size of the first insulating layer 23 may be set, as appropriate, on the basis of the outer size of the lead frame 120. In this case, the first insulating layer 23 is electrically insulating and thermally conductive and has a function of electrically insulating and a function of thermally joining the heat transfer plate 21 and the wiring pattern 22.

Further, through holes 23b communicating with respective through holes 21b of the heat transfer plate 21 are formed in the first insulating layer 23. Therefore, when the light emitting unit 1 is manufactured, the wires 26 can be passed through the through hole 21b of the heat transfer plate 21 and the through hole 23b of the first insulating layer 23 and bonded to the wiring pattern 22. In this case, when the light emitting unit 1 is manufactured, after the first electrode 31 and the second electrode 32 of the solid-state light emitting element 3 have been connected, through the wires 26, to the first pattern 22a and the second pattern 22b, respectively, the material for the sealing section 36 (see FIG. 27) may be loaded into the through hole 21b and the through hole 23b, for example by using a dispenser, to prevent the wire 26 from coming into contact with the first metal plate, and the sealing section 36 may be formed thereafter.

Incidentally, it is preferred that the wiring pattern 22 be formed of a metal material that has oxidation resistance and corrosion resistance higher than those of the second metal plate and that a surface treated layer (not shown in the figure) with high adhesion to the first insulating layer 23 be formed. When the material for the second metal plate is Cu, it is preferred that, for example, a Ni film, a laminated film of a Ni film and an Au film, or a laminated film of a Ni film, a Pd film and an Au film be formed as the surface treated layer. The surface treated layer may be formed, for example, by a plating method.

The base substrate 24 is formed in an elongated shape (in this case, a narrow rectangular plate). The base substrate 24 is preferably formed of a material that has a smaller difference in linear expansion coefficient with the first metal plate than with the second metal plate. In the present embodiment, the base substrate 24 is formed of a third metal plate made of the same material as that of the first metal plate. Therefore, it is preferred that a metal with a high thermal conductivity, such as aluminum, copper or the like, be used as the material for the third metal plate. However, the material for the third metal plate is not limited to those metals and, for example, stainless steel or steel may be also used. Thermal conductivity of aluminum is about 23 ppm and thermal conductivity of copper is about 17 ppm.

It is preferred that the same material as that of the first insulating layer 23 be used for the second insulating layer 25 interposed between the wiring pattern 22 and the base substrate 24.

Incidentally, depending on thermal capacity of the heat transfer plate 21, when the abovementioned epoxy resin layer is cured by raising the heating temperature thereof to about 170° C., there is a worry that the ability of the heat transfer plate 21 and the wiring pattern 22 to be fixedly attached to each other is degraded. Then, when the curing is performed at a heating temperature reduced to about 150° C., there is a worry that electric insulation between the heat transfer plate 21 and the wiring pattern 22 is degraded. That is, there is a trade-off relationship between the attachment ability and electric insulation ability. Accordingly, in the present embodiment, as described hereinbelow, the epoxy resin layers 123a, 133a (see FIG. 31C and FIG. 32B) of the sheet-shaped adhesives 123, 133 (see FIG. 31B and FIG. 32A) are laminated, one epoxy resin layer 123a is cured at 170° C., thereby ensuring electric insulation ability and thermal conductivity, and the other epoxy resin layer 133a is cured at 150° C. to ensure the attachment ability and thermal conductivity. More specifically, after the one epoxy resin layer 123a has been attached to the heat transfer plate 21, which is an object, at a temperature of 170° C., the other epoxy resin layer 133a and the lead frame 120 may be laminated and this other epoxy resin layer 133a may be cured at a temperature of 150° C. As a result, when the light emitting unit 1 of the present embodiment is manufactured, the requirements relating to the attachment ability and electric insulation ability can be satisfied at the same time regardless of thermal capacity of the heat transfer plate 21.

A method for manufacturing the mounting substrate 2 is explained below in a simple manner with reference to FIG. 31 and FIG. 32.

Figure 31A:
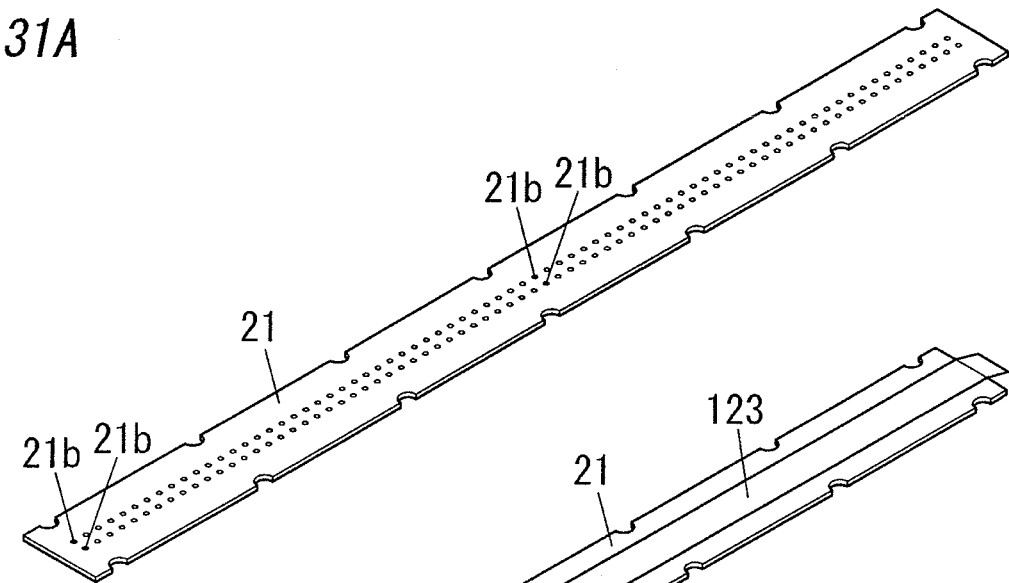
FIG. 31 is an explanatory drawing illustrating a method for manufacturing the mounting board in the light emitting unit of Embodiment 3.

First, the structure shown in FIG. 31A is obtained by forming the through holes 21b in the heat transfer plate 21.

Figure 31B:
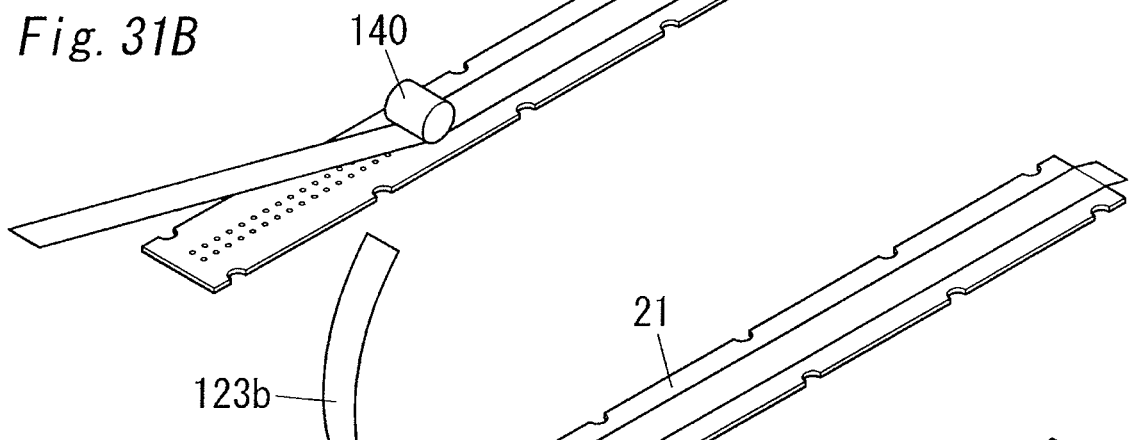

Then, as shown in FIG. 31B, the sheet-shaped adhesive 123 is laminated on the abovementioned other surface side of the heat transfer plate 21 so that the epoxy resin layer 123a comes into contact with the heat transfer plate 21, and the sheet-shaped adhesive 123 is tentatively attached to the heat transfer plate 21 by applying a predetermined pressure (for example, 0.5 MPa) with a round columnar rubber roller 140 and heating to a first predetermined temperature (for example, 110° C. to 120° C.) that is lower than the curing temperature of the epoxy resin layer 123a. The sheet-shaped adhesive 123 is then cut to an appropriate length.

Figure 31C:
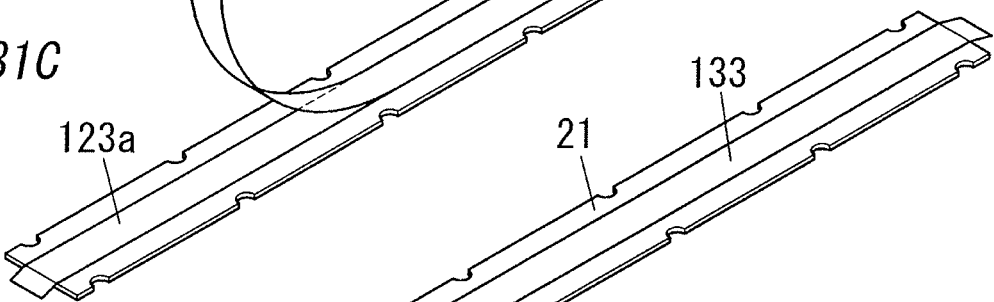
Figure 31D:
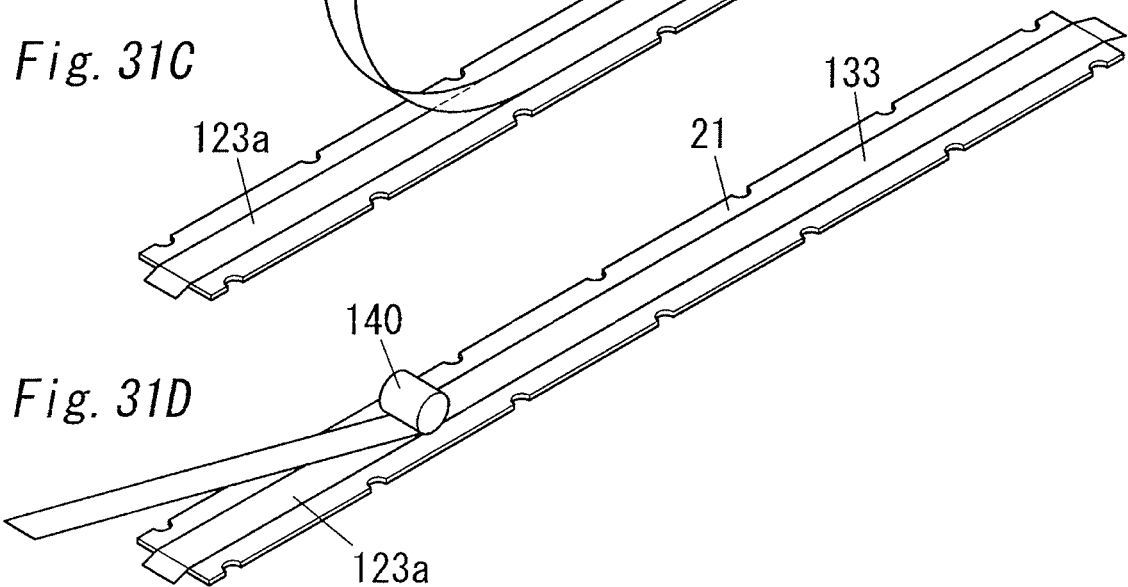

Then, the heat transfer plate 21 to which the sheet-shaped adhesive 123 has been tentatively attached is naturally cooled. The plastic film 123b is then peeled off from the epoxy resin layer 123a as shown in FIG. 31C.

Then, the heat transfer plate 21 to which the epoxy resin layer 123a has been tentatively attached is loaded into a drying furnace (not shown in the figure) and the epoxy resin layer 123a is heated and cured at a temperature (for example, 170° C.) that is equal to or higher than the abovementioned curing temperature, thereby attaching the epoxy resin layer 123a to the heat transfer plate 21.

Then, the sheet-shaped adhesive 133 is laminated on the epoxy resin layer 123a so that the epoxy resin layer 133a comes into contact with the epoxy resin layer 123a, and the sheet-shaped adhesive 133 is tentatively attached to the epoxy resin layer 123a by applying a predetermined pressure (for example, 0.5 MPa) with the round columnar rubber roller 140 and heating to a first predetermined temperature (for example, 110° C. to 120° C.) that is lower than the curing temperature of the epoxy resin layer 133a. The sheet-shaped adhesive 133 is then cut to an appropriate length.

In the laminated structure of the epoxy resin layer 123a and the epoxy resin layer 133a, through holes 134 are formed, for example, with the laser apparatus 150, as shown in FIG. 32A, in the regions corresponding to the through holes 23b of the insulating layer 23. Means for forming the through holes 134 is not limited to the laser apparatus 150, and for example a drill or the like may be also used.

Then, as shown in FIG. 32B, the plastic film 133b is peeled off from the epoxy resin layer 133a.

Then, as shown in FIG. 32C, the lead frame 120 is placed on the epoxy resin layer 133a, an appropriate load is applied, and then the epoxy resin layer 133a is cured inside a drying furnace (not shown in the figure) at a temperature (for example, 150° C.) equal to or higher than the abovementioned curing temperature, thereby fixedly attaching the lead frame 120 and the epoxy resin layer 133a to each other. The first insulating layer 23 is thus formed.

Then, the wiring pattern 22 is cut off from the support piece 122 of the lead frame 120 and the portions of the lead frame 120 other than the wiring pattern 22 are taken out as shown in FIG. 32D.

Figure 28:
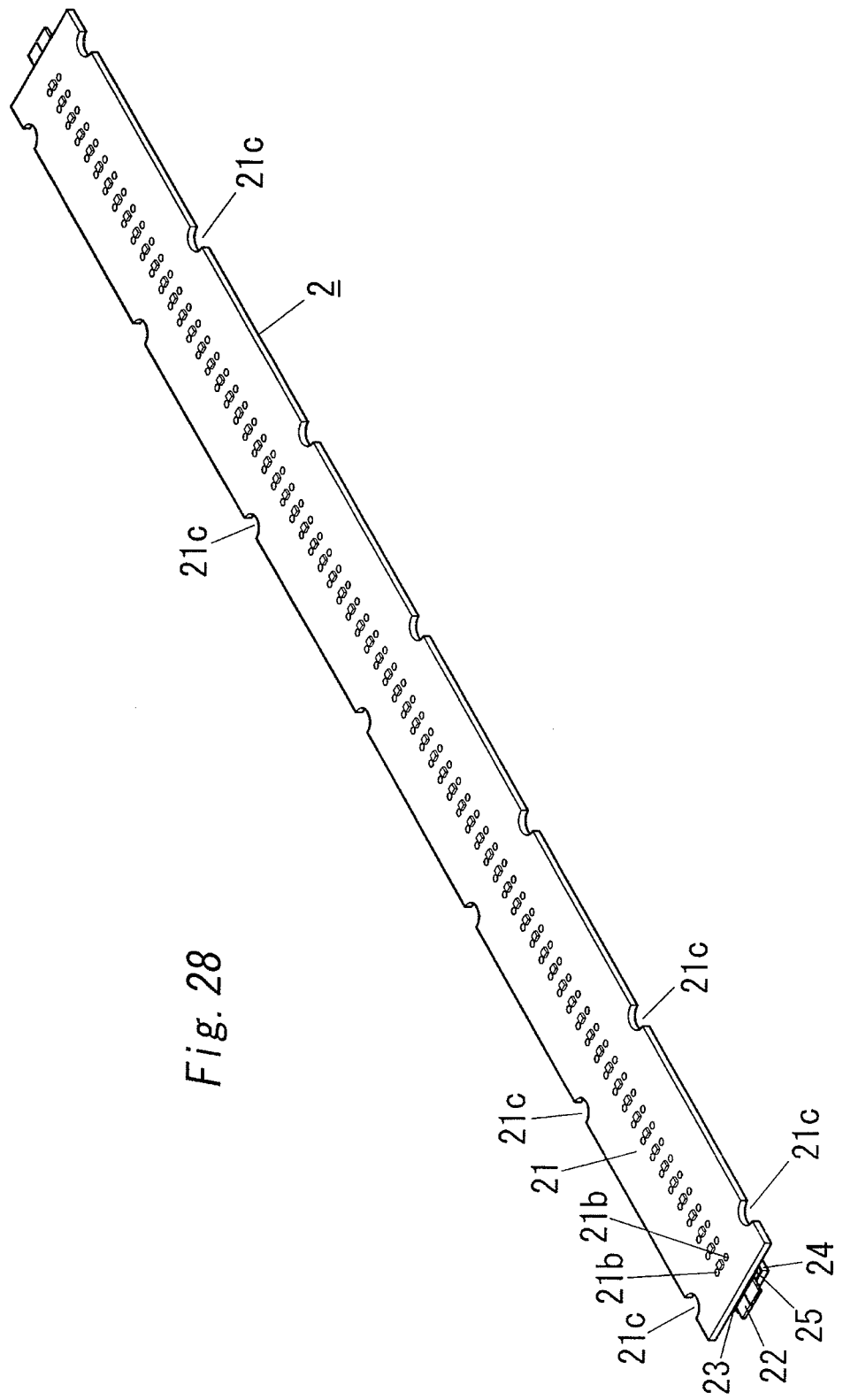
FIG. 28 is a schematic perspective view of the mounting board in the light emitting unit of Embodiment 3.
Figure 29:
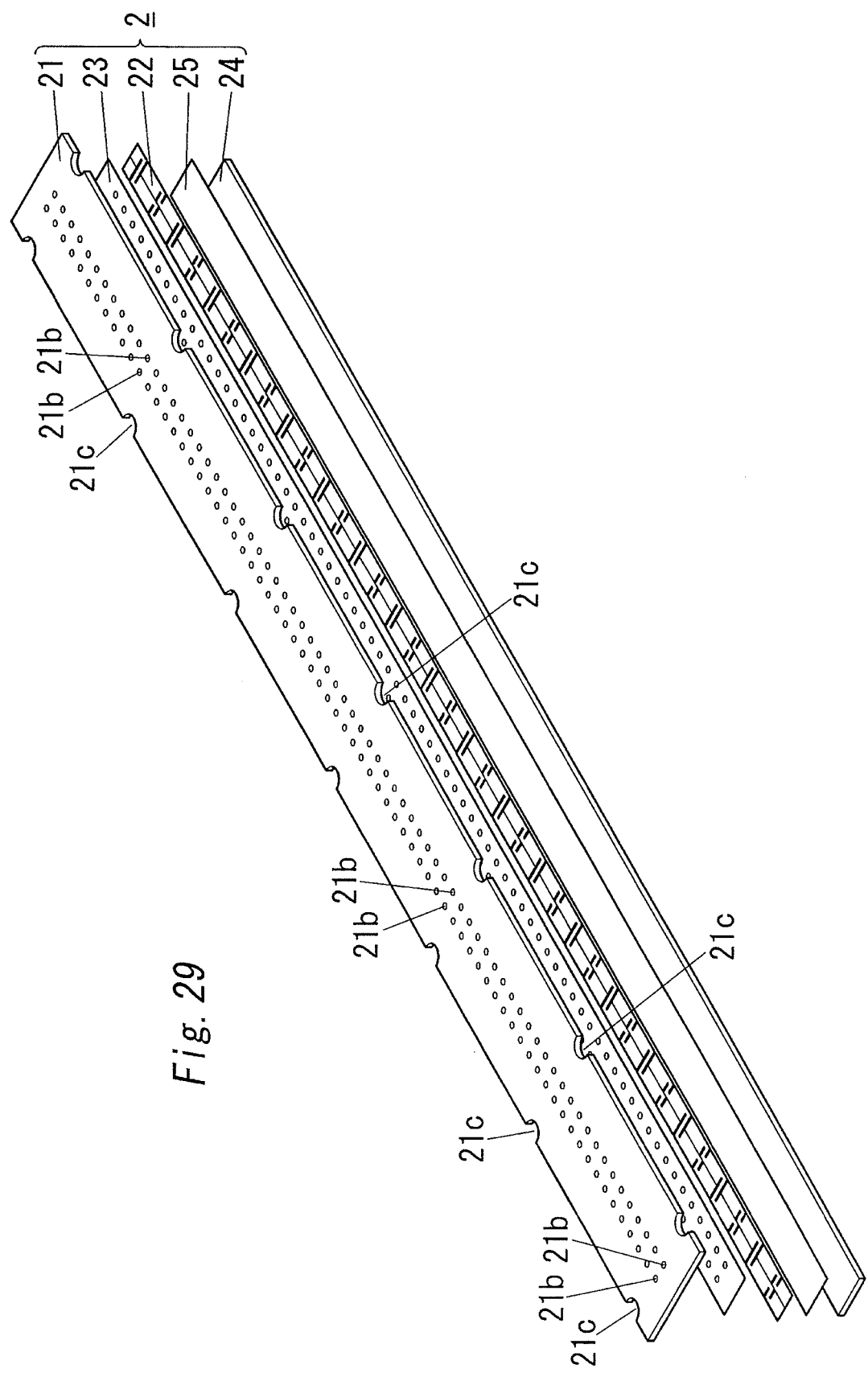
FIG. 29 is a schematic exploded perspective view of the mounting board in the light emitting unit of Embodiment 3.

The mounting substrate 2 shown in FIG. 28 is then obtained by joining the base substrate 24 and the wiring pattern 22 through the second insulating layer 25, in the same manner as the heat transfer plate 21 and the wiring pattern 22 are joined through the first insulating layer 23.

In the manufacture of the light emitting unit 1, the solid-state light-emitting elements 3 may be joined to the above-mentioned one surface side of the mounting substrate 2 and then the first electrode 31 and the second electrode 32 of each solid-state light emitting element 3 may be electrically connected, through the wires 26, to the first pattern 22a and the second pattern 22b, respectively. Then, the sealing section 36 and the color conversion unit 37 may be provided, as necessary, on the above-mentioned one surface side of the mounting substrate 2.

Incidentally, by providing the above-described light emitting unit 1 with the heat transfer plate 21 and the wiring pattern 22 formed by using the lead frame 120, it is possible to reduce cost and increase light output by comparison with the case in which the solid-state light emitting elements 3 are mounted on the metal base printed wiring board. Furthermore, by using the heat transfer plate 21 having a function of a reflecting plate in the light emitting unit 1, it is possible to reduce the light loss in the heat transfer plate 21 and increase the light output. Therefore, in the light emitting unit 1 of the present embodiment, power consumption can be also reduced. In this case, the light emitting unit 1 is used in which the first metal plate of the heat transfer plate 21 is an aluminum plate, an aluminum film of a purity higher than that of the aluminum plate is laminated on the side of the aluminum plate that is opposite to the first insulating layer 23 side, and a reflection increasing film formed of dielectric films of two types that have different refractive indexes is laminated on the aluminum film. As a result, light output can be increased. In particular, when an LED chip is used as the solid-state light emitting element 3 in the light emitting unit 1, the heat generated by the LED chip can be radiated with good efficiency and the light output can be increased. In addition, the utilization efficiency of light emitted from the LED chip can be increased. Further, when the light emitting unit 1 is provided with the color conversion unit 37 (see FIG. 27 or the like), the light emitted from the fluorescent material, which is the wavelength conversion material for the color conversion unit 37, to the heat transfer plate 21 side and the light emitted from the LED chip and scattered by the fluorescent material toward the heat transfer plate 21 side can be reflected and therefore the light utilization efficiency can be increased.

Incidentally, in the above-described light-emitting unit 1, the mounting substrate 2 has an elongated shape and the substantially entire wiring pattern 22 is joined to the first insulating layer 23. Therefore, there is a worry that, for example, the heat transfer plate 21 warps, or the wiring pattern 22 is peeled off from the first insulating layer 23 due to temperature variations during manufacture or use because of the difference in linear thermal expansion coefficient between the first metal plate and the second metal plate. The inventors of the present application provided the above-mentioned connection pieces 22c, 22d and linking piece 22e with curved shapes to relieve the stresses applied to the wiring pattern 22, but it has been found that in test products that are not provided with the base substrate 24 and the second insulating layer 25, warping sometimes occurs in the heat transfer plate 21 due to the difference in linear expansion coefficient between the first metal plate and the second metal plate at a certain length of the heat transfer plate 21 and a certain length of the first pattern 22a and the second pattern 22b.

By contrast, in the light emitting unit 1 of the present embodiment, the above-mentioned base substrate 24 is provided. Further, in the light emitting unit 1 of the present embodiment, the base substrate 24 is formed of the third metal plate and, therefore, the second insulating layer 25 is interposed between the base substrate 24 and the wiring pattern 22 in order to insulate electrically the base substrate 24 from the wiring pattern 22.

As described hereinabove, the light emitting unit 1 of the present embodiment is provided with the mounting substrate 2 and a plurality of solid-state light emitting elements 3 arranged on the abovementioned one surface side of the mounting substrate 2. Further, in the light emitting unit 1, the mounting substrate 2 is provided with the heat transfer plate 21 that is formed of the first metal plate and carries the solid-state light emitting elements 3 on the above-mentioned one surface side, the wiring pattern 22 that is formed of the second metal plate, disposed on the above-mentioned other surface side of the heat transfer plate 21, and electrically connected to the solid-state light emitting elements 3, and the insulating layer 23 interposed between the heat transfer plate 21 and the wiring pattern 22. As a result, in the light emitting unit 1, the heat generated by the solid-state light emitting elements 3 can be transferred efficiently in the transverse direction by the heat transfer plate 21 and radiated and this heat can be also transferred in the thickness direction of the heat transfer plate 21 and radiated. Therefore, in the light emitting unit 1, the heat radiation ability can be increased, the increase in temperature of the solid-state light emitting elements 3 can be inhibited, and the light output can be increased.

Further, in the light emitting unit 1 of the present embodiment, the thermosetting resin of the first insulating layer 23 includes a filler with a thermal conductivity higher than that of the thermosetting resin. Therefore, the heat generated by the solid-state light emitting elements 3 can be radiated with higher efficiency.

Further, in the light emitting unit 1 of the present embodiment, by configuring the solid-state light emitting elements 3 as LED chips, it is possible to transfer the heat generated by the LED chips in the transverse direction by the heat transfer plate 21 and radiate the heat efficiently.

Further, in the light emitting unit 1 of the present embodiment, the first metal plate which serves as a foundation of the heat transfer plate 21 is an aluminum plate, an aluminum film with a purity higher than that of the aluminum plate is laminated on the side of the aluminum plate that is opposite to the first insulating layer 23 side, and a reflection increasing film formed of dielectric films of two types that have different refractive indexes is laminated on the aluminum film. As a result, the light that has been radiated from the LED chips and has fallen on the abovementioned one surface of the heat transfer plate 21 is reflected with good efficiency.

Further, in the light emitting unit 1 of the present embodiment, the heat transfer plate 21 has an elongated shape, the solid-state light emitting elements 3 are arranged along the longitudinal direction of the heat transfer plate 21, and the elongated base substrate 24 is provided that has a smaller difference in linear expansion coefficient with the first metal plate than with the second metal plate and is disposed on the side of the wiring pattern 22 that is opposite to the heat transfer plate 21 side. Therefore, even when the mounting substrate 2 has an elongated shape, warping of the heat transfer plate 21 can be inhibited and warping of the entire light emitting unit 1 can be inhibited. As a result, the yield in production of the light emitting units 1 can be increased and therefore cost thereof can be reduced. In addition product reliability can be increased.

Further, in the light emitting unit 1, the base substrate 24 is formed of the third metal plate made of the same material as that of the first metal plate, and the second insulating layer 25 made of the same material as that of the first insulating layer 23 is interposed between the base substrate 24 and the wiring pattern 22. Therefore, warping of the heat transfer plate 21 can be inhibited more effectively. It is preferred that the size of the base substrate 24 in the longitudinal direction be equal to the size of the heat transfer plate 21 in the longitudinal direction.

Further, in the light emitting unit 1 of the present embodiment, the solid-state light emitting elements 3 are LED chips, the first electrodes 31 and the second electrodes 32 are provided on one surface side in the thickness direction, each of the first electrodes 31 and second electrodes 32 is electrically connected, through the wire 26, to the wiring pattern 22, and the through holes 21b for passing the wires 26 are formed in the heat transfer plate 21. Therefore, the LED chips can be die bonded to the heat transfer plate 21, the heat generated by the LED chips can be easily transferred in the transverse direction of the heat transfer plate 21, and heat radiation ability is increased.

Further, when LED chips are used as the solid-state light emitting elements 3, die bonding to the heat transfer plate 21 may be performed through a sub-mount member that relieves stresses acting upon the LED chips due to the difference in linear expansion coefficient between the solid-state light emitting elements 3 and the heat transfer plate 21. In this case, it is preferred that the sub-mount member be used that is formed to a planar size larger than the chip size of the LED chip. When the LED chip is a GaN blue LED chip and the first metal plate is an aluminum plate, for example, AlN, SiC composite, Si, or CuW can be used as the material for the sub-mount member. Further, it is preferred that in the sub-mount member, a reflective film that reflects light emitted from the LED chip be formed around a jointing section of the LED chip and the sub-mount member (that is, a section that overlaps the LED chip) on the surface of the sub-mount member on the side where the LED chip is to be joined,. When a chip in which electrodes are provided on both surfaces in the thickness direction is used as the LED chip, a conductive pattern that is electrically connected to the first electrodes 31 or second electrodes 32 disposed in the LED chips on the sub-mount member side may be provided at the sub-mount member and the conductive pattern may be electrically connected, through the wires 26, to the first pattern 22a or the second pattern 22b.

Figure 36:
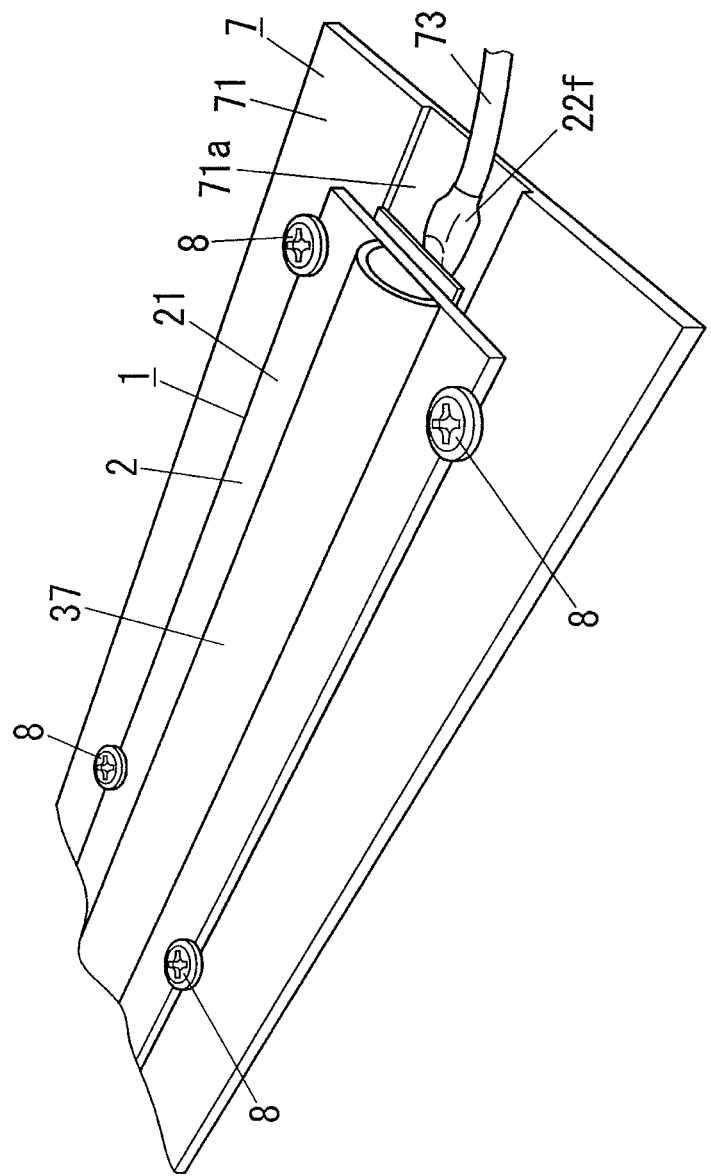
FIG. 36 is a partially broken schematic perspective view of an illuminating apparatus of Embodiment 3.

FIG. 36 illustrates an example of the illuminating apparatus 7 provided with the light emitting unit 1. The illuminating apparatus 7 is an illumination fixture and comprises the light emitting unit 1 and the fixture body 71 that holds the light emitting unit 1.

The fixture body 71 is formed in an elongated shape (in this case, rectangular shape) with a planar size larger than that of the light emitting unit 1, and a recess 71a that accommodates the wiring pattern 22 and the base substrate 24 on the abovementioned other surface side of the heat transfer plate 21 in the light emitting unit 1 is formed along the longitudinal direction of the fixture body 71.

In the illuminating apparatus 7, the light emitting unit 1 is held at the fixture body 71 by attachment jigs 8 constituted by a plurality of resin screws. In this case, in the light emitting unit 1, semicircular notches 21c (see FIG. 25A) are formed substantially equidistantly in the longitudinal direction of the heat transfer plate 21 at each side edge in the width direction of the heat transfer plate 21. Therefore, when the notches 21c in the heat transfer plate 21 of the light emitting unit 1 are formed as semicircles with a radius less than that of the round heads of the screws constituting the attachment jigs 8, the light emitting unit 1 can be held by the screw heads and the fixture body 71. In this illuminating apparatus 7, as shown in FIGS. 62 and 63, stresses applied to the solid-state light emitting elements 3 or joining portions 35 can be reduced by comparison with those of the light emitting diodes 4A to 4L in the illumination fixture L using the configuration in which screw holes 110b for screwing the fixing screws S1 for fixing the printed substrate 110 to the fixture body 103 are provided at both end portions and center portion in the longitudinal direction of the printed substrate 110.

A power supply unit (not shown in the figure) is connected to the light emitting unit 1 through two electric cables 73 connected by soldering or the like to the wiring pattern 22, and the solid-state light emitting elements 3 can be caused to emit light by supplying power from the power supply unit to the light emitting unit 1. In FIG. 36, only one electric cable 73 connected to a first terminal pattern 22f connected to the first pattern 22a at one end side in the longitudinal direction of the heat transfer plate 21 is shown, but one more electric cable 73 is connected to a second terminal pattern (not shown in the figure) connected to the second pattern 22b at the other end side in the longitudinal direction of the heat transfer plate 21. The first terminal pattern 22f and the second terminal pattern are constituted by portions of the wiring pattern 22 formed of the abovementioned lead frame 120.

In the light emitting unit 1, warping of the heat transfer plate 21 can be prevented. Therefore, by reducing the arrangement pitch of the solid-state light emitting elements 3, it is possible to prevent the solid-state light emitting elements 3 from creating a granular emission appearance as spot light sources, and then a light source that looks like a linear light source can be obtained.

In the above-described illuminating apparatus 7 of the present embodiment, the heat radiation ability can be increased and the light output can be also increased by providing the above-described light emitting unit 1.

(Embodiment 4)

Figure 37:
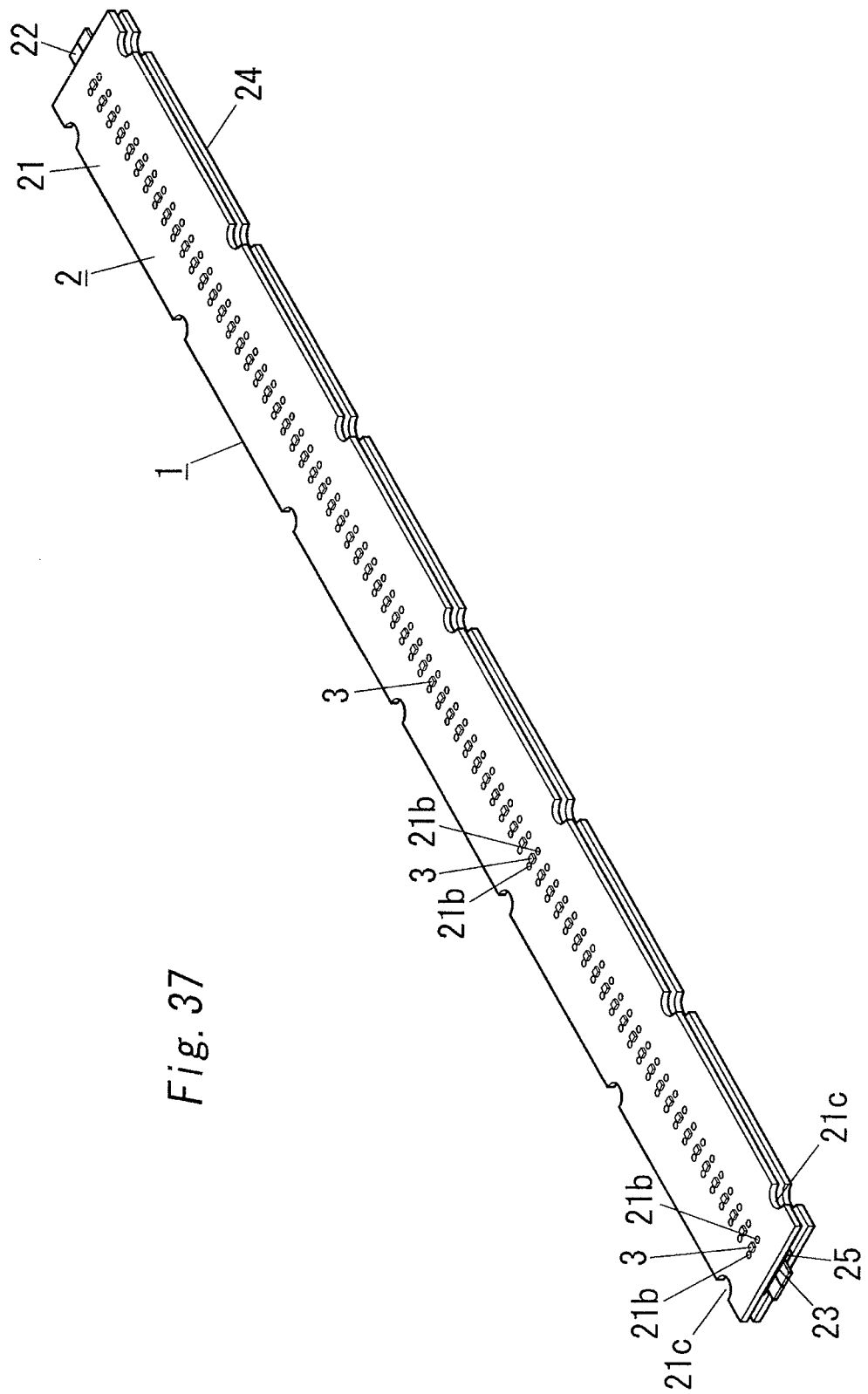
FIG. 37 is a schematic perspective view of the light emitting unit of Embodiment 4.
Figure 38:
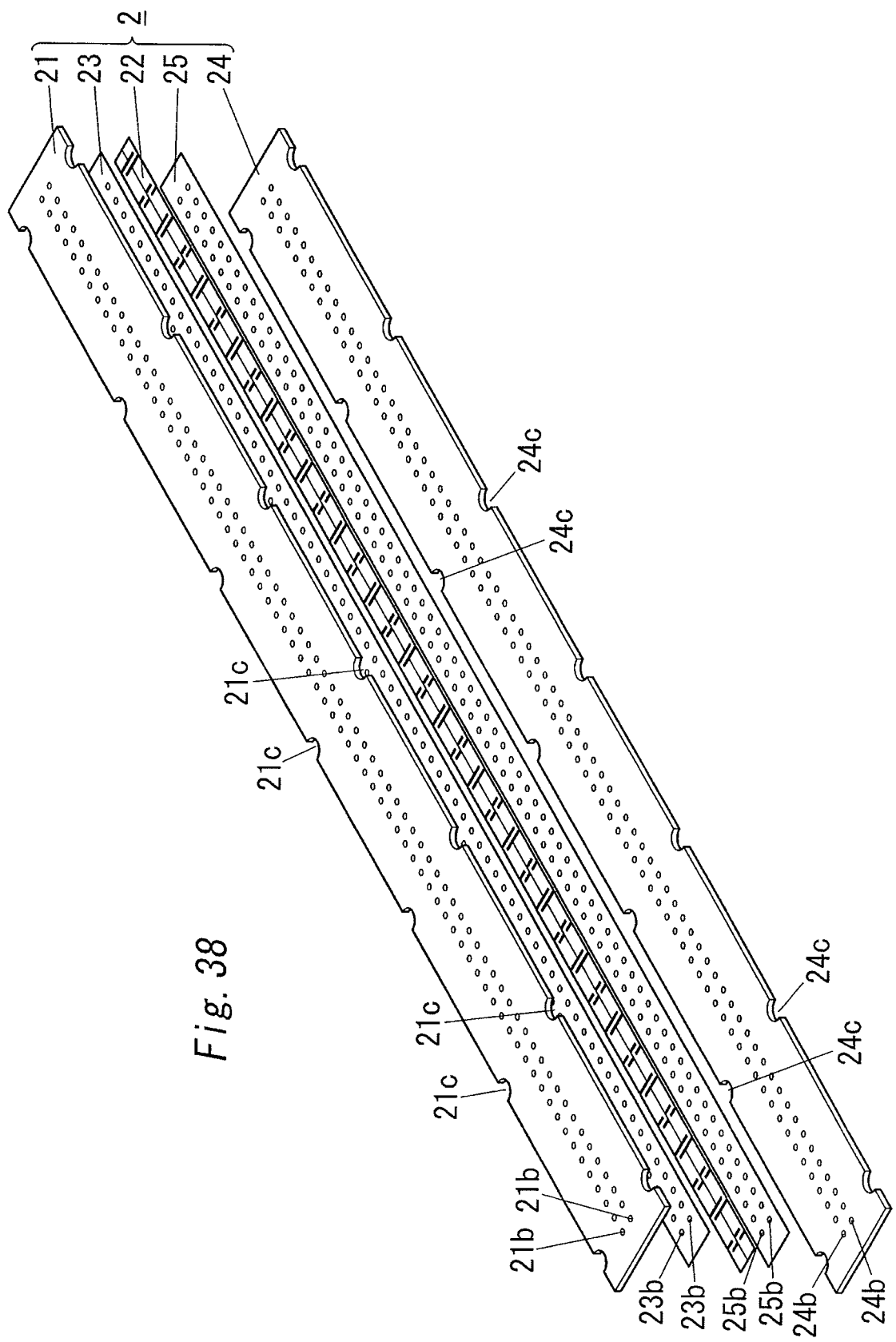
FIG. 38 is a schematic exploded perspective view of the mounting substrate in the light emitting unit of Embodiment 4.

The light emitting unit 1 of the present embodiment is described below with reference to FIG. 37 and FIG. 38.

The basic configuration of the light emitting unit 1 of the present embodiment is substantially identical to that of the light emitting unit of Embodiment 3, the difference therebetween being that the base substrate 24 in the mounting substrate 2 has the same shape as the heat transfer plate 21. The constituent elements same as those of Embodiment 3 are assigned with same reference numerals and the explanation thereof is herein omitted.

In the base substrate 24, through holes 24b are formed in the zones corresponding to the through holes 21b of the heat transfer plate 21, and notches 24c are formed in the zones corresponding to the notches 21c of the heat transfer plate 21. The second insulating layer 25 has a shape identical to that of the first insulating layer 23, and through holes 25b are formed in the zones of the second insulating layer that correspond to the through holes 23b of the first insulating layer 23.

In the light emitting unit 1 of the present embodiment, the heat radiation ability can be increased and the light output can be also increased in the same manner as in the light emitting unit 1 of Embodiment 3. Further, in the light emitting unit 1 of the present embodiment, warping of the elongated heat transfer plate 21 also can be inhibited.

In the light emitting unit 1 of the present embodiment, since the shape of the base substrate 24 made of the same material as that of the heat transfer plate 21 is the same as the shape of the heat transfer plate 21, warping of the light emitting unit 1 can be inhibited more effectively. Further, in the light emitting unit 1 of the present embodiment, components of the heat transfer plate 21 and the base substrate 24 are shared and the cost of the unit can be reduced.

Further, the light emitting unit 1 of the illuminating apparatus 7 explained in Embodiment 3 may be used as the light emitting unit 1 of the present embodiment.

In the light emitting unit 1 of the present embodiment, when the solid-state light emitting elements 3 are also mounted on the side of the base substrate 24 that is opposite to the second insulating layer 25 side, light can be radiated onto both the one surface and the other surface side in the thickness direction of the mounting substrate 2, and the unit can be used as a two-side light emitting unit. In this case, in the light emitting unit 1 of the present embodiment, the base substrate 24 also functions as a heat transfer plate, the heat generated by the solid-state light emitting elements 3 located on the abovementioned one surface side of the mounting substrate 2 is efficiently transferred in the transverse direction of the heat transfer plate 21 and radiated, and the heat generated by the solid-state light emitting elements 3 located on the abovementioned other surface side of the mounting substrate 2 is efficiency transferred in the transverse direction of the base substrate 24 and radiated. When the light emitting unit 1 constitutes a two-side light emitting unit, the base substrate 24 functions as a heat transfer plate similar to the heat transfer plate 21 and also as a reflection plate.

(Embodiment 5)

Figure 39:
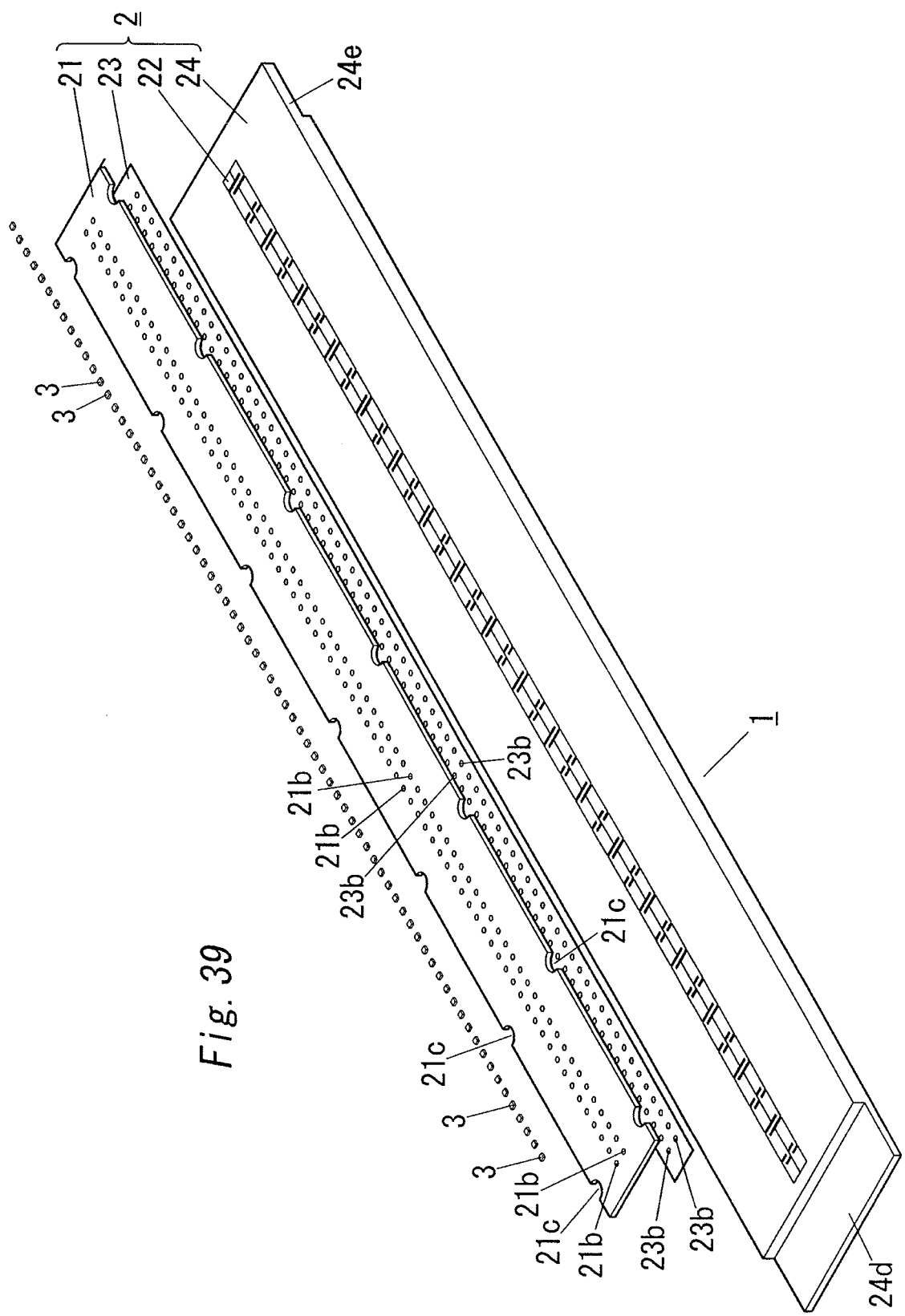
FIG. 39 is a schematic exploded perspective view of the light emitting unit of Embodiment 5.

The light emitting unit 1 of the present embodiment is explained below with reference to FIG. 39.

The basic configuration of the light emitting unit 1 of the present embodiment is substantially identical to that of the light emitting unit of Embodiment 3, the difference therebetween being that the base substrate 24 is formed of a resin substrate in which a resin is mixed with a filler with a thermal conductivity higher than that of the resin. The constituent elements same as those of Embodiment 3 are assigned with same reference numerals and the explanation thereof is herein omitted.

Preferably, the difference in linear expansion coefficient between the resin of the resin substrate and the first metal plate serving as a foundation for the heat transfer plate 21 is small. For example, if the material for the first metal plate is aluminum and the material for the second metal plate is copper, it is preferred that a vinyl ester resin, an unsaturated polyester resin or the like be used as the resin of the resin substrate. Further, for example, magnesium oxide, boron nitride, aluminum hydroxide, glass fibers or the like is preferably used as the filler. The filling ratio of the filler is preferably 60 vol % to 75 vol %, and in this case the thermal conductivity of the resin substrate can be made about 4 W/m·K to about 10 W/m·K.

For example, if a vinyl ester resin is used as the resin of the resin substrate, magnesium oxide is used as the filler material, and the filling ratio of the filler is made 67 vol %, a thermal conductivity of 5 W/m·K and a linear expansion coefficient of about 18 ppm to 22 ppm can be obtained. Further, as described hereinabove, the thermal conductivity of aluminum is about 23 ppm and the thermal conductivity of copper is about 17 ppm.

In the light emitting unit 1 of the present embodiment, heat radiation ability can be increased and the light output can be also increased in the same manner as in the light emitting unit 1 of Embodiment 3. Further, in the light emitting unit 1 of the present embodiment, warping of the elongated heat transfer plate 21 also can be inhibited.

Figure 25:
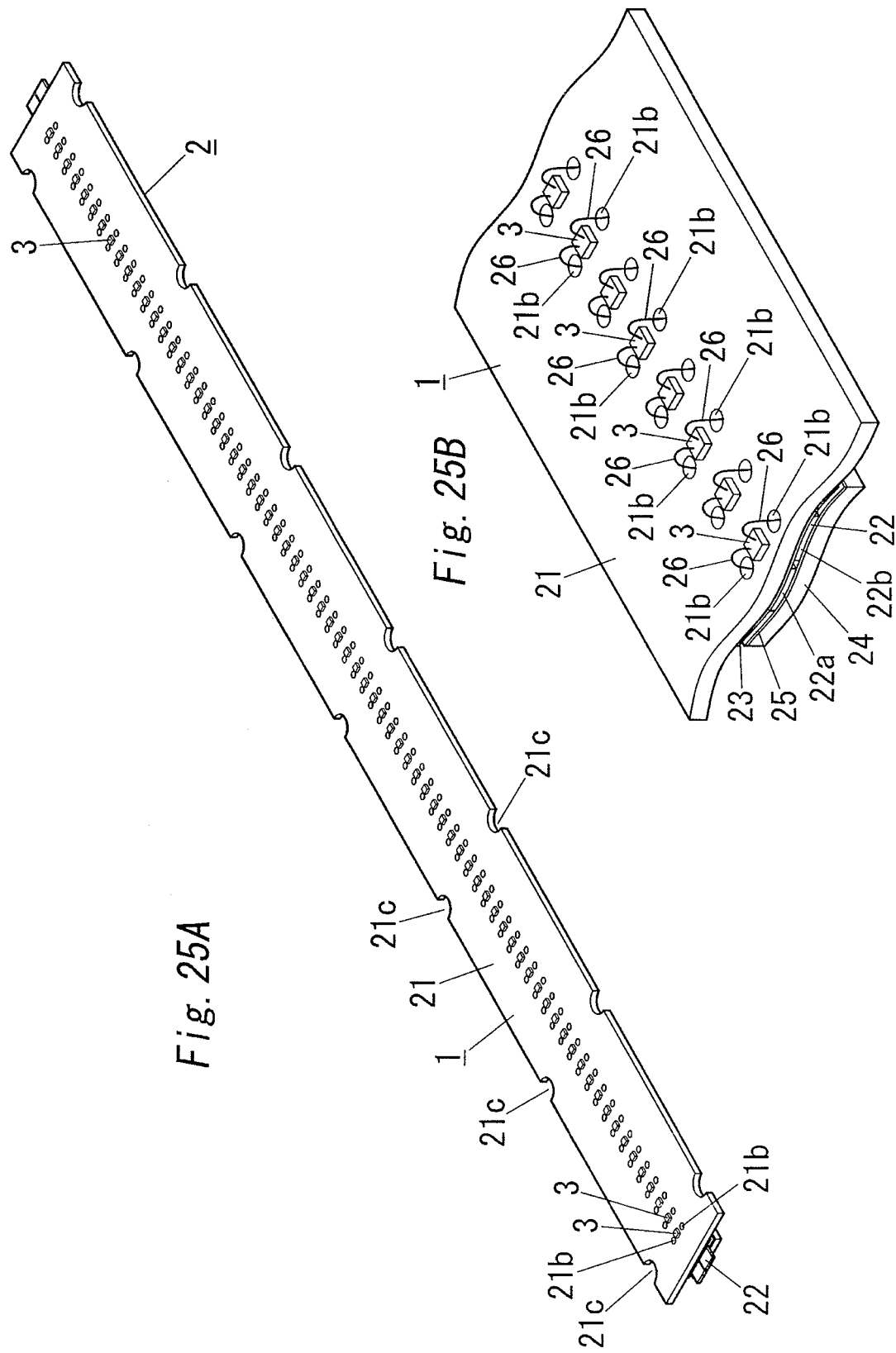
FIG. 25A is a principal schematic perspective view of a light emitting unit of Embodiment 3.
FIG. 25B is a partially broken principal schematic view of the light emitting unit of Embodiment 3.
Figure 26:
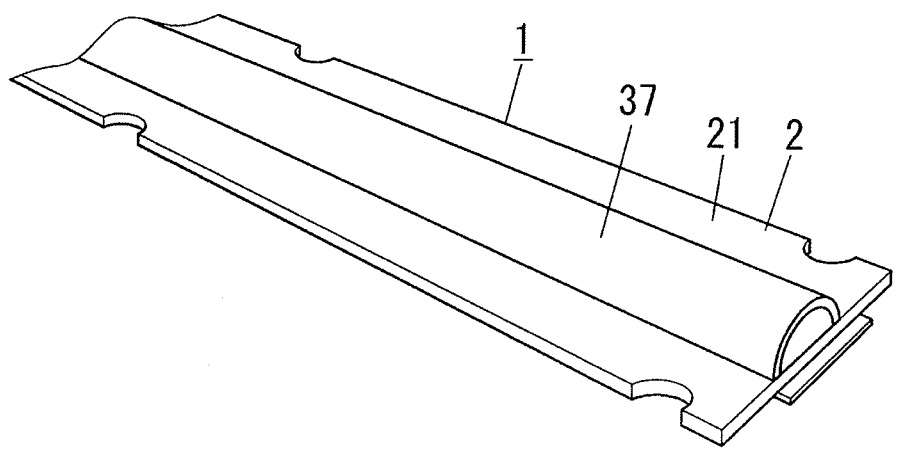
FIG. 26 is a partially broken schematic perspective view of the light emitting unit of Embodiment 3.

In the light emitting unit 1 of the present embodiment, since a resin substrate is used as the base substrate 24, the cost can be reduced by comparison with the case in which the base substrate 24 is formed of the third metal plate made of the same material as that of the first metal plate, as in the light emitting unit 1 shown in FIG. 25 and explained in Embodiment 3, and the second insulating layer 25 is interposed between the wiring pattern 22 and the base substrate 24, In the light emitting unit 1 of the present embodiment, the base substrate 24 and the wiring pattern 22 can be formed at the same time in the manufacturing process, and the unit cost can be reduced due to the reduced production cost.

Figure 40:
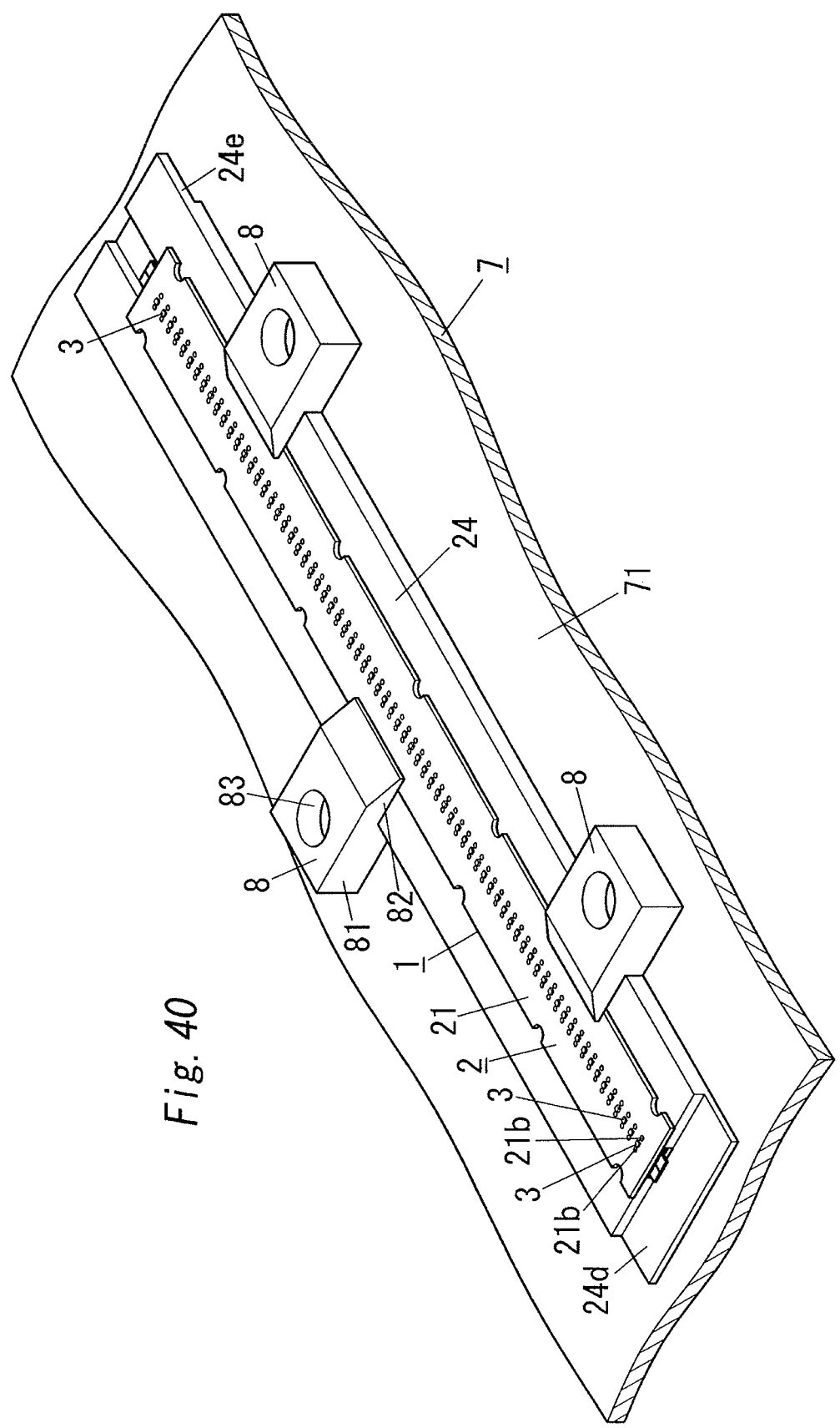
FIG. 40 is a principal schematic perspective view of the illuminating apparatus of Embodiment 5.

An example of the illuminating apparatus 7 provided with the light emitting unit 1 is shown in FIG. 40. The illuminating apparatus 7 is an illumination fixture and comprises the light emitting unit 1 and the fixture body 71 holding the light emitting unit 1.

Incidentally, in the light emitting unit 1, the width dimension of the base substrate 24 is set larger than the width dimension of the heat transfer plate 21. Therefore, even when the fixture body 71 is manufactured from a metal and is electrically conductive, by setting the width dimension of the base substrate 24 as appropriate, it is possible to increase the creeping distance between the heat transfer plate 21 or the wiring pattern 22 and the fixture body 71 and ensure a predetermined creeping distance. In the illuminating apparatus 7 of the present embodiment, when the fixture body 71 is manufactured from a metal, the heat generated by the light emitting unit 1 can be radiated with higher efficiency. When the fixture body 71 is not electrically conductive, it is not necessary to make the width dimension of the base substrate 24 larger than the width dimension of the heat transfer plate 21.

Further, the illuminating apparatus 7 of the present embodiment is provided with a plurality of attachment jigs 8 for attaching the light emitting unit 1 to the fixture body 71. The attachment jigs 8 are made from a synthetic resin and each has a base section 81 that abuts on the fixture body 71 and the side surface of the base substrate 24 along the longitudinal direction, and a holding section 82 extending from the base section 81 and holding the light emitting unit 1 between the holding section and the fixture body 71. The attachment jig 8 shown in FIG. 40 has a through hole 83 for inserting a screw (not shown in the figure) for fixing the attachment jig 8 to the fixture body 71. Further, in the illuminating apparatus 7 of the present embodiment, the holding section 82 of the attachment jig 8 is disposed so as to overlap the side section of the heat transfer plate 21 in the width direction thereof. Therefore, the heat transfer plate 21 can be prevented from warping.

Figure 41:
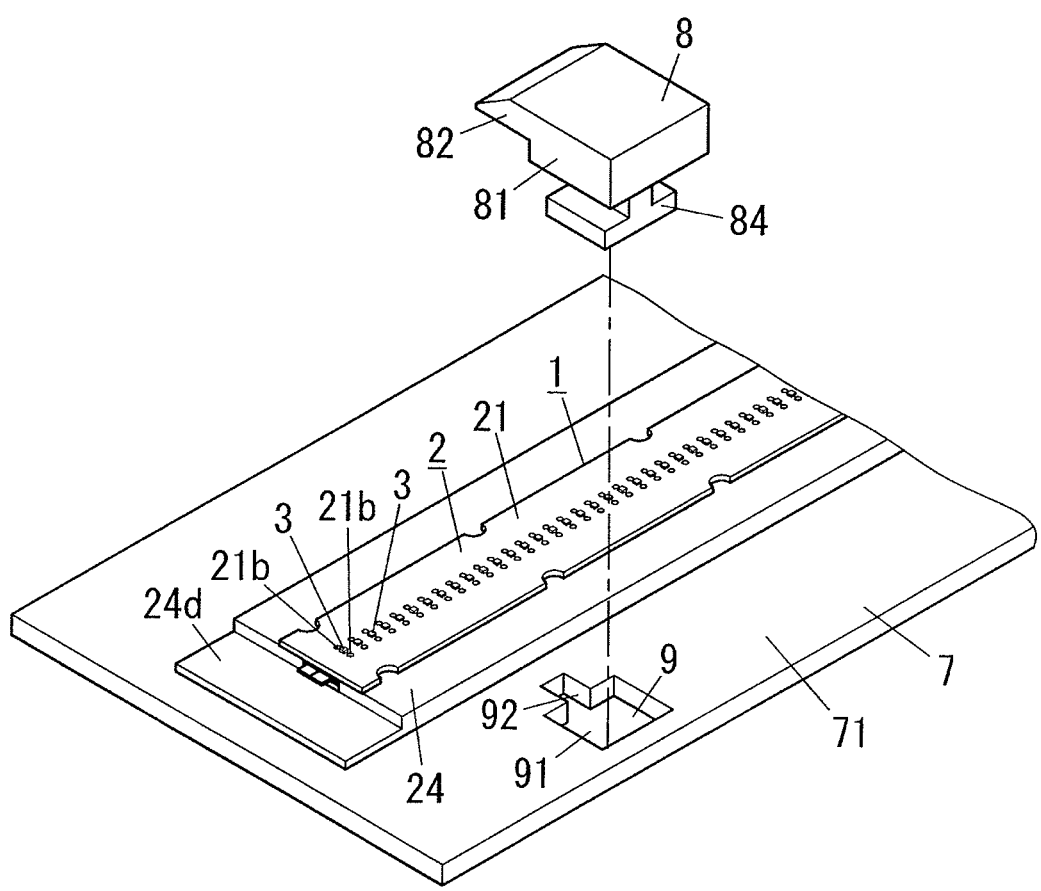
FIG. 41 is a principal schematic exploded perspective view of the illuminating apparatus of Embodiment 5.

It is not necessary for the attachment jig 8 to be fixed to the fixture body 71 with a screw. For example, as shown in FIG. 41, the attachment may be performed by insertion into an attachment hole 9 of the fixture body 71. In the attachment jig 8 shown in FIG. 41, a T-shaped slide piece 84 is provided in the condition of protruding from one surface of the base section 81 on the fixture body 71 side. Meanwhile, the attachment hole 9 of the fixture body 71 is provided with a wide section 91 for inserting the slide piece 84 and a narrow section 92 which has an opening narrower than that of the wide section 91 and is spatially connected to the wide section 91, and thereby the attachment hole 9 is formed in a T-like shape in a planar view. Therefore, in the attachment jig 8, when the slide piece 84 is inserted from the wide section 91 of the attachment hole 9 and slid to the narrow section 92 side, the slide piece 84 is locked by the peripheral portion of the narrow section 92. As a result, in the illuminating apparatus 7, the light emitting unit 1 can be attached to the fixture body 71, without using the screws.

Further, in the light emitting unit 1 of the present embodiment, a first protruding piece 24*d* that is thinner than other sections of the base substrate 24 protrudes from one end surface in the longitudinal direction of the base substrate, and a second protruding piece 24*e* that is thinner than other sections of the base substrate 24 protrudes from the other end surface in the longitudinal direction. In this case, in the first protruding piece 24d, one surface in the thickness direction is flush with the abovementioned one surface of the base substrate 24. Further, in the second protruding piece 24e, one surface in the thickness direction is flush with the abovementioned other surface of the base substrate 24. The base substrate 24 is designed such that the sum total of the thickness dimension of the first protruding piece 24d and the thickness dimension of the second protruding piece 24e is equal to the thickness dimensions of the base substrate 24.

Figure 42A:
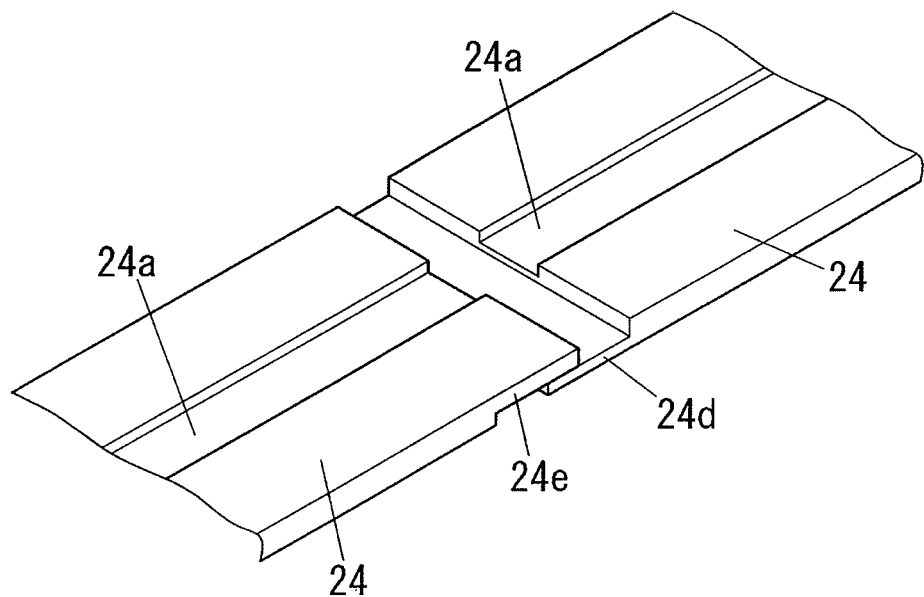
FIG. 42 is a principal explanatory drawing illustrating the illuminating apparatus of Embodiment 5.
Figure 42B:
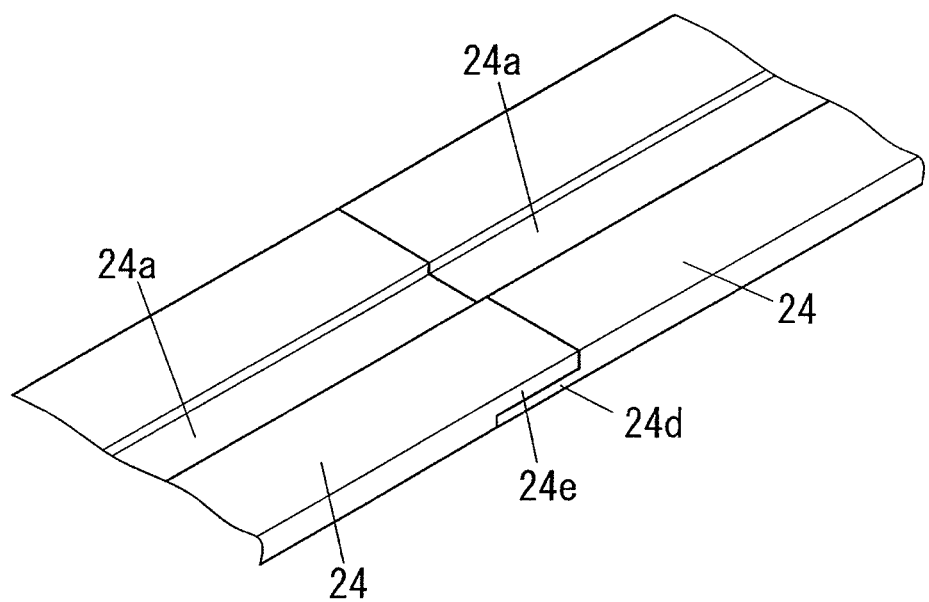

Therefore, when a plurality of light emitting units 1 is arranged in a row on a straight light, the first protruding piece 24d of the base substrate 24 in one light emitting unit 1 of the adjacent light emitting units 1 and the second protruding piece 24e of the base substrate 24 in the other light emitting unit 1 can be disposed so as to overlap as shown in FIG. 42A and FIG. 42B. As a result, in the illuminating apparatus 7 of the present embodiment, the creeping distance between the heat transfer plate 21 or the wiring pattern 22 and the fixture body 71 can be enlarged by comparison with the case in which the end surfaces of the base substrates 24 that are not provided with the first protruding piece 24d or the second protruding piece 24e are abutted onto each other. Further, in the adjacent light emitting units 1, the wiring patterns 22 may be electrically connected to each other by an electric cable (not shown in the figure) for the extended connection or a connector (not shown in the figure). As a result, in the illuminating apparatus 7 provided with a plurality of light emitting units 1, power can be supplied from one power supply unit to a series circuit of the light emitting units 1 and all of the solid-state light emitting elements 3 of each light emitting unit 1 can be caused to emit light.

Figure 43:
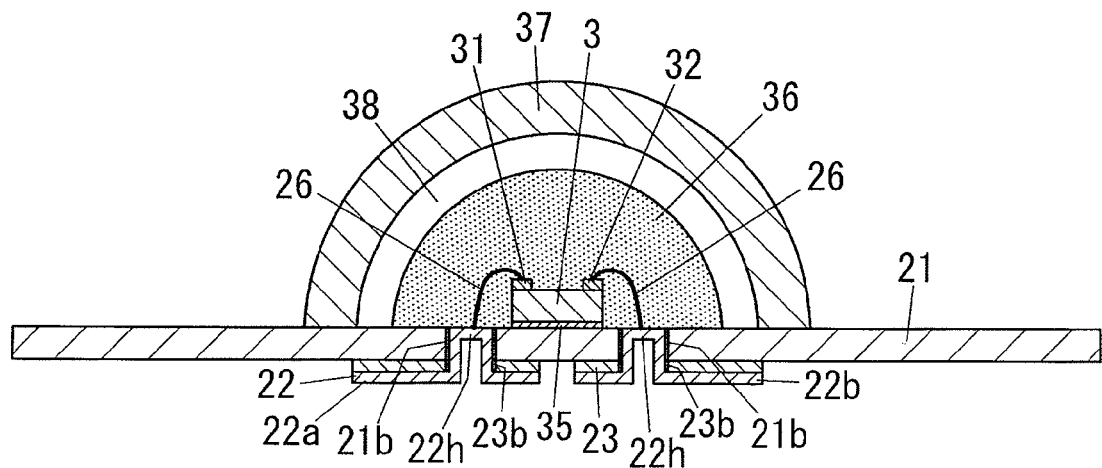
FIG. 43 is a principal schematic cross-sectional view illustrating another configuration example of the light emitting unit of Embodiments 3 to 5.

Incidentally, in Embodiments 3 to 5, the wire 26 is bonded to the wiring pattern 22 disposed on the abovementioned other surface side of the heat transfer plate 21, but it is also possible, as shown in FIG. 43, to provide protruding sections 22h that are inserted into the through holes 23b of the first insulating layer 23 and the through holes 21b of the heat transfer plate 21 in parts of the wiring pattern 22, to thereby bond the wire 26 to an end surface of the protruding sections 22h.

Figure 44:
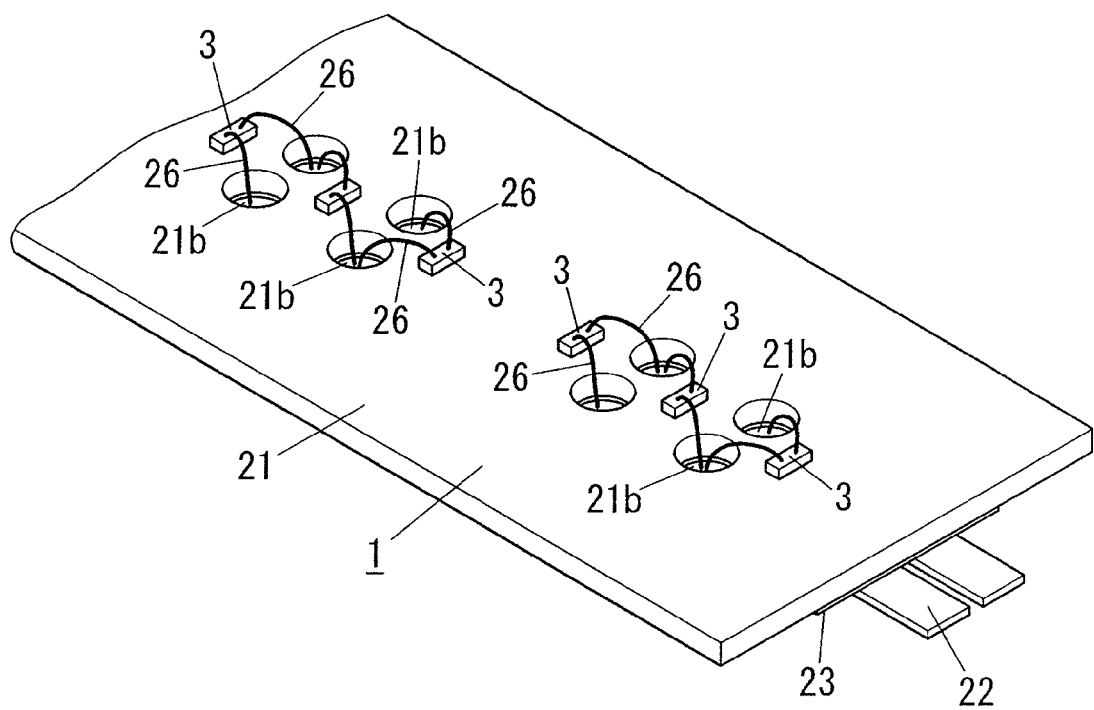
FIG. 44 is a principal schematic perspective view illustrating another configuration example of the light emitting unit of Embodiments 3 to 5.
Figure 47:
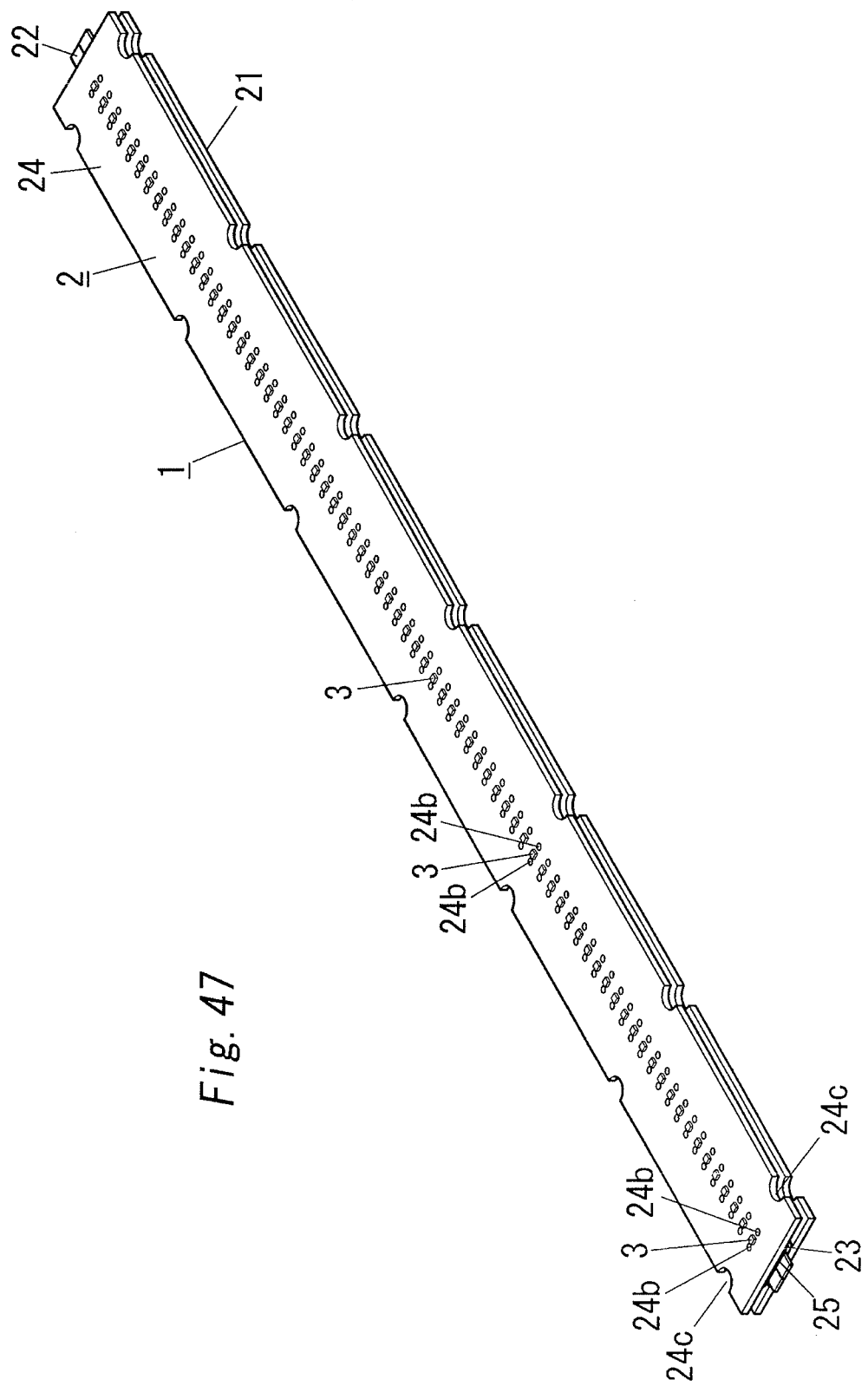
FIG. 47 is a schematic perspective view of the two-face light emitting unit of Embodiment 7.
Figure 48:
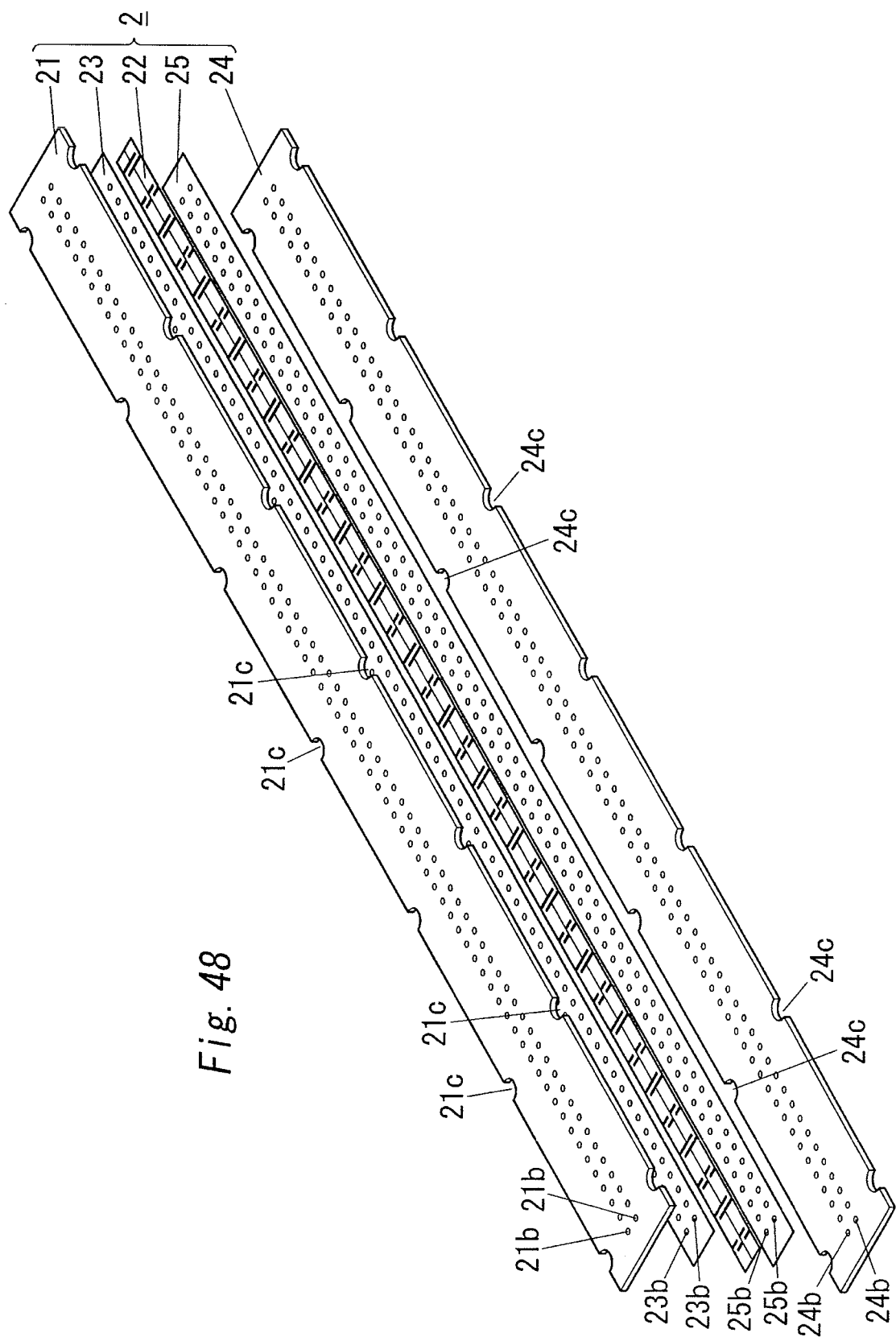
FIG. 48 is a schematic exploded perspective view of the mounting substrate in the two-face light emitting unit of Embodiment 7.

Then, in the light emitting units 1 of Embodiments 3 to 5, the through holes 21b are formed at both sides of the mounting region of the solid-state light emitting elements 3 in the width direction of the heat transfer plate 21. In other words, the solid state light emitting element 3 is mounted on the zone between two through holes 21b arranged in a row in the width direction of the heat transfer palate 21, but such configuration is not limited. For example, as shown in FIG. 44, it is also possible to dispose the solid-state light emitting element 3 between two sets arranged in a row in the longitudinal direction of the heat transfer plate 21 from among a plurality of sets, each of which includes two through holes 21b that are arranged in rows in the width direction of the heat transfer plate 21.

(Embodiment 6)

A light emitting unit 1 of the present embodiment is explained below with reference to FIG. 45.

The basic configuration of the light emitting unit 1 of the present embodiment is substantially identical to that of the light emitting unit of Embodiment 3, the difference therebetween being in the shape of the mounting substrate 2. The constituent elements same as those of Embodiment 3 are assigned with same reference numerals and the explanation thereof is herein omitted.

The light emitting unit 1 of Embodiment 3 can be used, for example, as a light source of the illuminating apparatus 7 (see FIG. 36) formed of an illumination fixture such as a base light, whereas the light emitting unit 1 of Embodiment 1 can be used, for example, as a light source of an illuminating apparatus (not shown in the figure) formed of an illumination fixture such as a down light.

The wiring pattern 22 in the light emitting unit 1 of the present embodiment can be also formed using a lead frame (not shown in the figure). Power from a power supply unit can be supplied to the light emitting unit 1 by connecting electric cables by soldering or the like to the first terminal pattern 22f and the second terminal pattern 22g.

In the light emitting unit 1 of the present embodiment, the heat radiation ability can be increased and the light output can be also increased in the same manner as in the light emitting unit 1 of Embodiment 3.

(Embodiment 7)

The light emitting unit of the present embodiment (referred to hereinbelow as two-side light emitting unit) 1 is described below with reference to FIG. 46 to FIG. 52.

The two-side light emitting unit 1 comprises a pair of heat transfer plates 21, 24 disposed at a distance from each other in the thickness direction and the solid-state light emitting elements 3 mounted on one surface sides of the heat transfer plates 21, 24, being on the side opposite to surface sides of the two heat transfer plates that face each other. Further, the two-side light emitting unit 1 comprises the wiring pattern 22 that is disposed between the two heat transfer plates 21 and 24 and electrically connected to the solid-state light emitting elements 3, and a pair of insulating layers 23, 25 interposed between the heat transfer plate 21 and the wiring pattern 22 and between the heat transfer plate 24 and the wiring pattern, respectively. In this configuration, the heat transfer plates 21, 24 are formed of a first metal plate, and the wiring pattern 22 is formed of the second metal plate. In the present embodiment, the mounting substrate 2 onto which all of the solid-state light emitting elements 3 are to be mounted is constituted by the pair of heat transfer plates 21, 24, the pair of insulating layers 23, 25, and the wiring pattern 22.

Each constituent component of the two-side light emitting unit 1 is described below in greater detail.

The heat transfer plates 21, 24 are formed in an elongated shape (in this configuration, a narrow rectangular plate-like shape). In the heat transfer plates 21, 24, a plurality of solid-state light emitting elements 3 are disposed along the longitudinal direction of the heat transfer plates 21, 24 at the abovementioned one surface sides.

A metal with a high thermal conductivity such as aluminum, copper or the like is preferred as the material for the first metal plate serving as a foundation for each of the heat transfer plates 21, 24. However, the material for the first metal plate is not limited to the aforementioned metals and may be, for example, stainless steel or steel.

It is preferred that the heat transfer plates 21, 24 have the function of a reflective plate, and it is more preferred that aluminum be used as the material for the first metal plate. It is further preferred that the first metal plates of the heat transfer plates 21, 24 be aluminum plates, aluminum films of a purity higher than that of the aluminum plates be laminated on the sides of the aluminum plates that are opposite to the insulating layers 23, 25 sides, and a reflection increasing film formed of dielectric films of two types that have different refractive indexes be laminated on each of the aluminum films. In this case, for example, a SiO2 film and a TiO2 film are preferably used as the dielectric films of two types. When such heat transfer plates 21, 24 are used, the reflectance with respect to the visible light can be made equal to or greater than 95%. For example, MIRO 2 and MIRO (registered trade marks) manufactured by Alanod Co., can be used as the heat transfer plates 21, 24. Aluminum plates that have been surface treated by anodization may be used as the aforementioned aluminum plates. The thickness of the heat transfer plates 21, 24 may be set, as appropriate, for example within a range of about 0.2 mm to about 3 mm.

An LED chip is used as the solid-state light emitting element 3, but such a selection is not limited and, for example, a packaged LED chip may be also used. For example, a laser diode (semiconductor laser) or an organic EL element may be used as the solid-state light emitting element 3.

Figure 49:
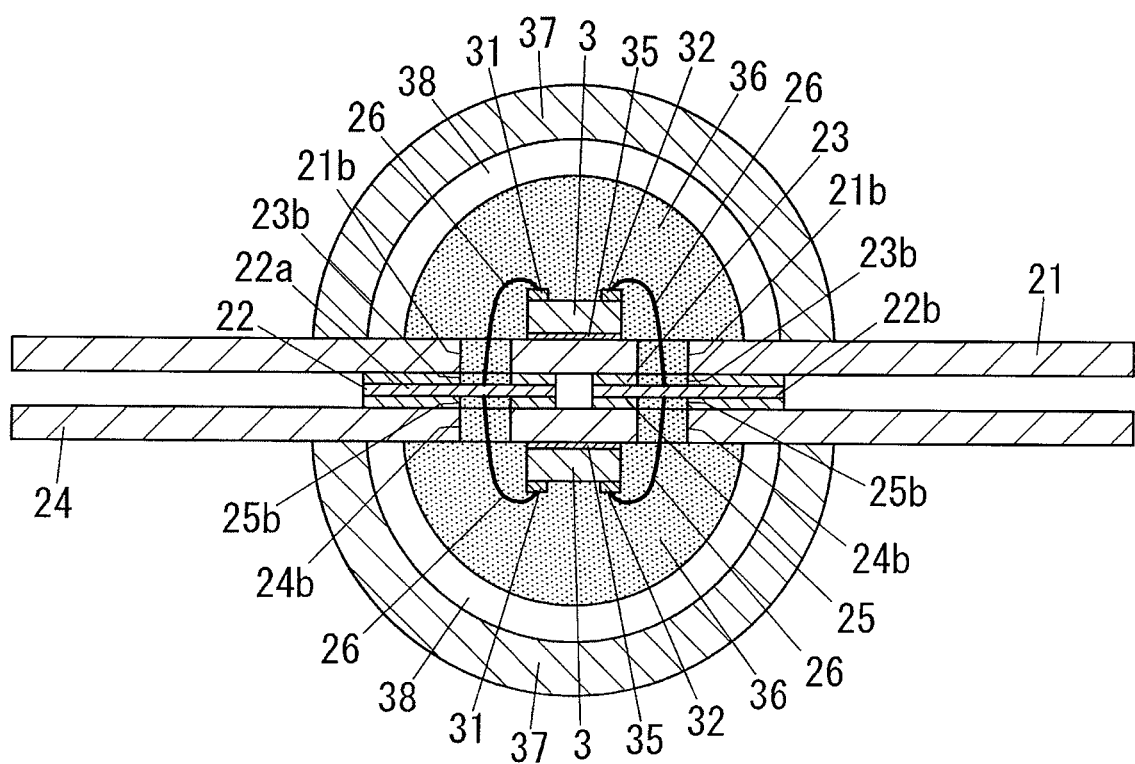
FIG. 49 is a schematic cross-sectional view of the two-face light emitting unit of Embodiment 7.
Figure 50:
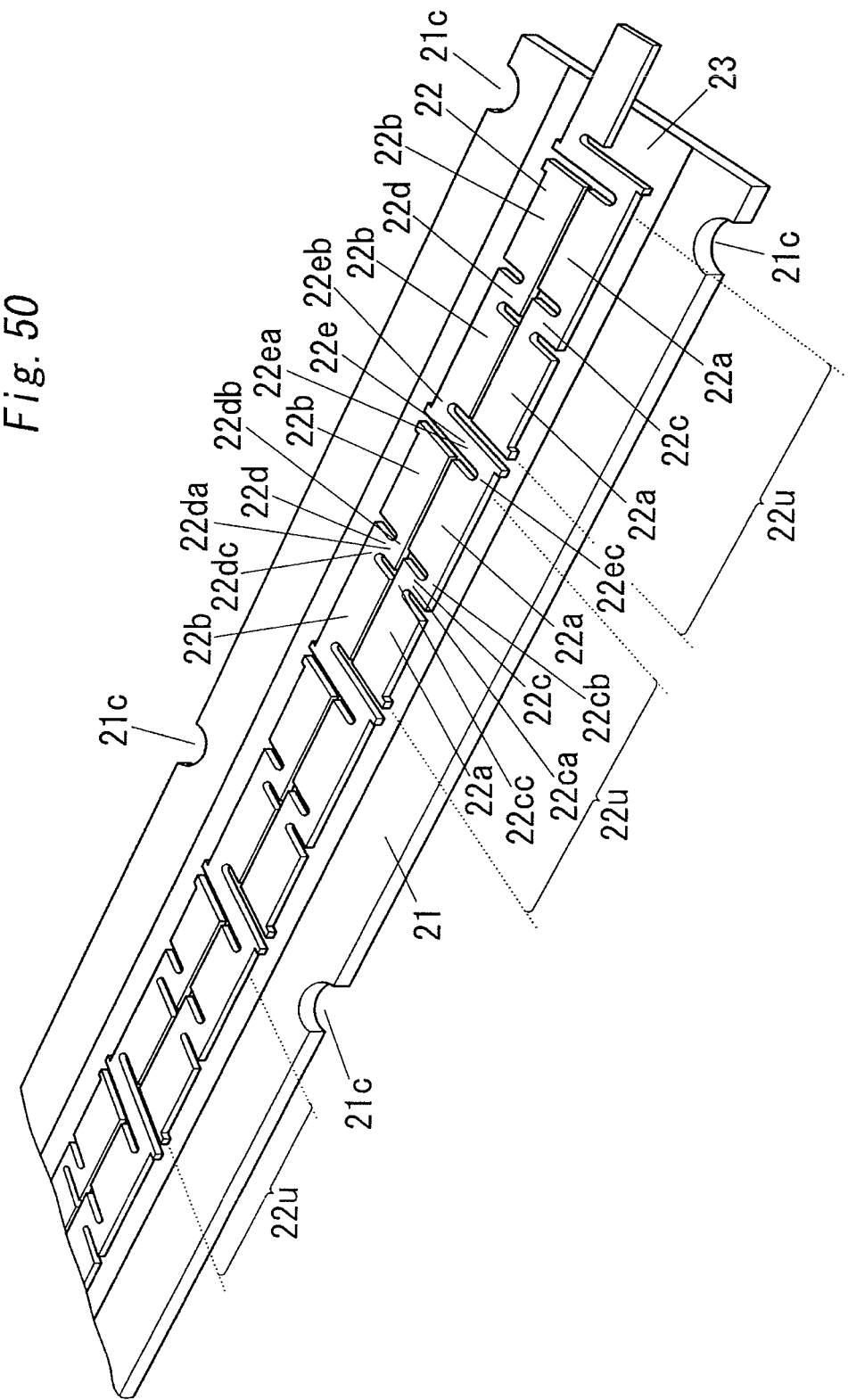
FIG. 50 is a principal perspective view of the mounting substrate in the two-face light emitting unit of Embodiment 7.

In the solid-state light emitting element 3 mounted on each of the heat transfer plates 21, 24, as shown in FIG. 49, a first electrode (anode electrode) 31 and a second electrode (cathode electrode) 32 are provided on one surface side in the thickness direction, and the other surface side in the thickness direction is joined, through a joining section 35, to each of the heat transfer plates 21, 24. In the solid-state light emitting element 3, the first electrode 31 and the second electrode 32 are electrically connected to the wiring pattern 22 through respective wires (bonding wires) 26. In this configuration, through holes 21b, 24b for passing the wires 26 are formed in the heat transfer plates 21, 24. The through holes 21b, 24b are formed at both sides of the mounting region of the solid-state light emitting element 3 in the width direction of the heat transfer plates 21, 24. Each of the through holes 21b, 24b has a round opening shape. The inner diameter of each of the through holes 21b, 24b is set to 0.5 mm, but this value is merely exemplary and is not particularly limited. The shape of each of the through holes 21b, 24b is not necessarily round and may be rectangular or elliptical. When the solid-state light emitting element 3 is an LED chip, the joining section 35 may be formed of a die bond material.

The LED chip is a GaN blue LED chip emitting blue light, and a chip provided with a sapphire substrate as the substrate is used. However, the substrate of the LED chip is not limited to the sapphire substrate and, for example, a GaN substrate, a SiC substrate, or a Si substrate may be used. The structure of the LED chip is not particularly limited.

The size of the LED chips is not particularly limited. For example, the chip size may be 0.3 mm□, 0.45 mm□, or 1 mm□.

The material and emission color of the light emitting layer of the LED chip are not particularly limited. For example, the LED chip is not limited to the blue LED chip and, for example, a violet LED chip, an ultraviolet LED chip, a red LED chip, and a green LED chip may be used.

For example, a die bond material of a silicone system, a die bond material of an epoxy system, or a silver paste can be used as the die bond material.

For example, a gold wire or an aluminum wire can be used as the wire 26.

Incidentally, when an LED chip is used as the solid-state light-emitting element 3, it is preferred that the two-side light emitting unit 1 be provided with sealing sections 36 that seal the solid-state light-emitting elements 3 and the wires 26 at the abovementioned one surface sides of the heat transfer plates 21, 24, as shown for example in FIG. 49. In FIG. 49, a silicone resin that is the first translucent material is used as the material for the sealing section 36. The first translucent material is not limited to the silicone resin and, for example, an epoxy resin, an acrylic resin, glass or the like may be used.

Further, in order to obtain high-output white light when an LED chip is used as the solid-state light-emitting element 3, it is preferred that the two-side light emitting unit 1 comprises color conversion units 37, each of which has a wavelength converting material emitting light of a color different from the emission color of a corresponding LED chip. It is preferred that, for example, a fluorescent material emitting light of a color different from the emission color of the corresponding LED chip when excited by the light emitted from the corresponding LED chip be used as the wavelength converting material for the color conversion units 37 and that a fluorescent material and a second translucent material be included.

The two-side light emitting unit 1 uses, for example, a blue LED chip as the LED chip, and where a yellow fluorescent material is used as the fluorescent material for the color conversion unit 37, white light can be obtained. Thus, in the two-side light emitting unit 1, the blue light emitted from the LED chip and the light emitted from the yellow fluorescent material are emitted through the front surface of the color conversion unit 37 and white light can be obtained. The second translucent material used as the material for the color conversion member 37 is not limited to the silicone resin and may be, for example, an acrylic resin, glass, or an organic-inorganic hybrid material prepared by mixing and bonding organic and inorganic components at a nanometer level or molecular level. Further, the fluorescent material used as the material for the color conversion member 37 is not limited to the yellow fluorescent material. For example, color rendering ability can be increased by using a yellow fluorescent material and a red fluorescent material, or a red fluorescent material and a green fluorescent material. Further, the fluorescent material used as the material for the color conversion unit 37 is not limited to the yellow fluorescent material of one type, and yellow fluorescent materials of two types that have different emission peak wavelengths may be used.

Further, when white light can be radiated by an LED chip itself, when a fluorescent material is dispersed in the sealing section 36, or when the color of light which is wished to be obtained in the light emitting unit 1 is same as the color of light emitted by the LED chip, a configuration can be used that is not provided with the color conversion unit 37.

Figure 53:
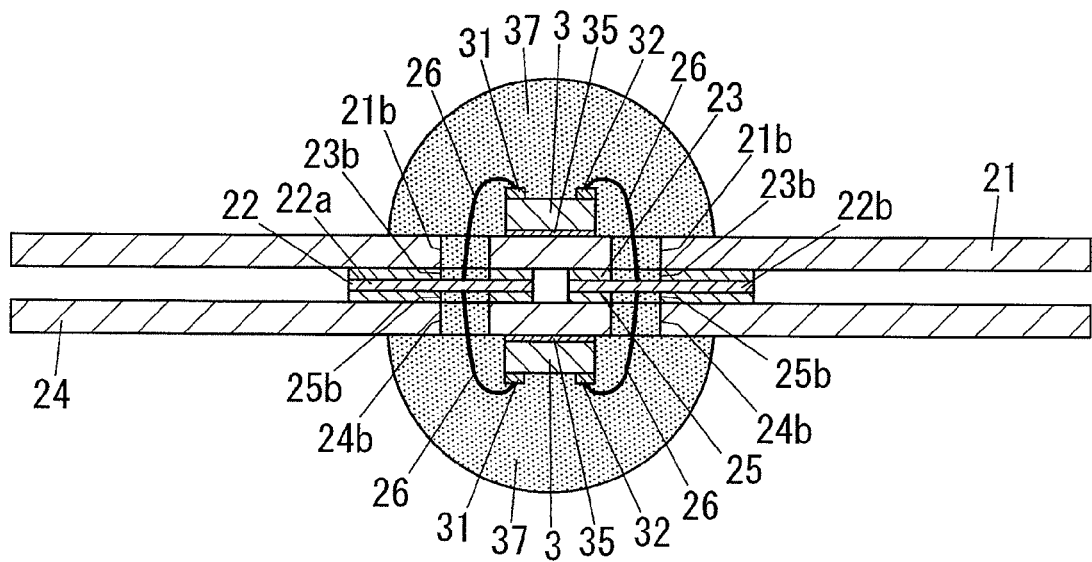
FIG. 53 is a schematic cross-sectional view illustrating another configuration example of the two-face light emitting unit of Embodiment 7.
Figure 54:
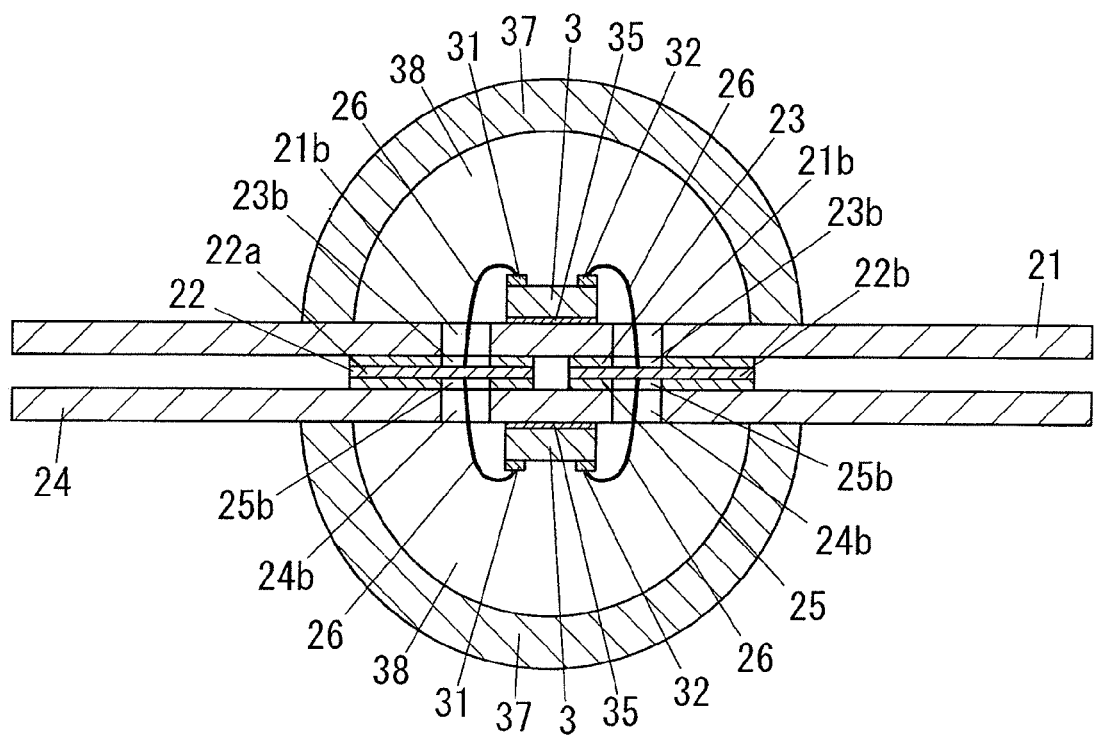
FIG. 54 is a schematic cross-sectional view illustrating yet another configuration example of the two-face light emitting unit of Embodiment 7.
Figure 55:
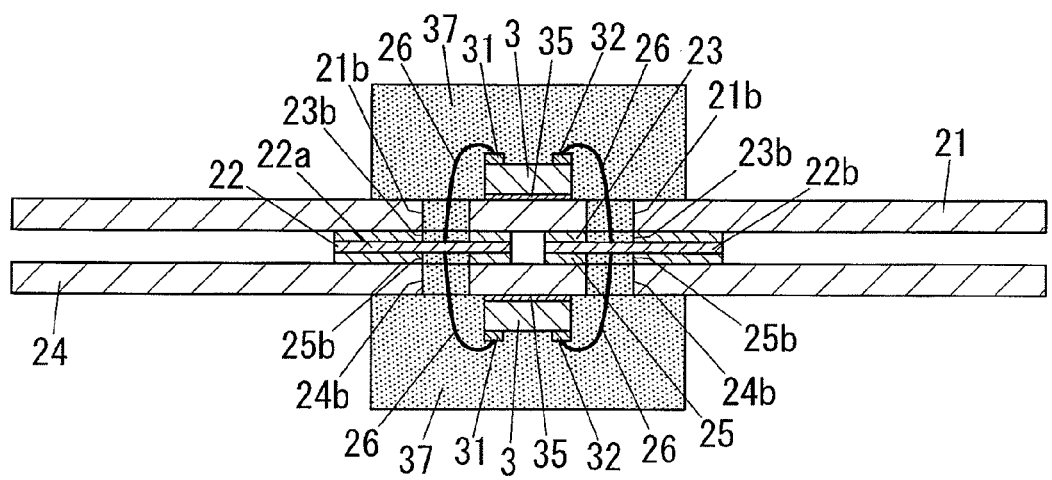
FIG. 55 is a schematic cross-sectional view illustrating another configuration example of the two-face light emitting unit of Embodiment 7.

In the two-side light emitting unit 1, each of the light conversion units 37 is preferably in contact with a corresponding heat transfer plate of the heat transfer plates 21, 24. As a result, in the two-side light emitting unit 1, not only the heat generated by the LED chips, but also the heat generated by the color conversion units 37 can be radiated through the heat transfer plates 21, 24 and the light output can be increased. In the example shown in FIG. 49, each of the color conversion units 37 is formed in a semicylindrical shape and provided in a form such as to surround an LED chip and a sealing section 36 between the color conversion unit and the corresponding heat transfer plate of the heat transfer plates 21, 24 at the abovementioned one surface side of the corresponding heat transfer plate. More specifically, the color conversion unit 37 is provided such that a gas layer (for example, an air layer) 38 is formed between the color conversion unit and the sealing section 36 at the abovementioned one surface side of the heat transfer plate 21. As shown in FIG. 53, in the two-side light emitting unit 1, each of the color conversion units 37 may have a semispherical shape, and the corresponding LED chip, which is the solid-state light emitting element 3, and the wires 26 may be sealed by the color conversion unit 37. Further, as shown in FIG. 54, in the two-side the light emitting unit 1, each of the color conversion units 37 may have a dome-like shape, and the corresponding LED chip, which is the solid-state light emitting element 3, and the wires 26 may be sealed by the color conversion unit 37. Further, as shown in FIG. 55, in the two-side light emitting unit 1, each of the color conversion units 37 may be shaped as a layer, and the corresponding LED chip, which is the solid-state light emitting element 3, and the wires 26 may be sealed by the color conversion unit 37. The color conversion units 37 such as shown in FIG. 49 or FIG. 54 may be used in a molded form, and the end edges of the color conversion units 37 (circumferential edge of the opening) on the sides of the heat transfer plates 21, 24 may be fixedly attached to the heat transfer plates 21, 24 by using, for example, an adhesive (for example, a silicone resin or an epoxy resin), respectively. The color conversion units 37 such as shown in FIG. 53 can be formed, for example, by a molding method. The color conversion units 37 such as shown in FIG. 55 can be formed, for example, by a coating method using a dispenser or a screen printing method.

The wiring pattern 22 is formed of the second metal plate that has a linear expansion coefficient different from that of the heat transfer plates 21, 24, as mentioned hereinabove. In this case, the second metal plate uses the lead frame 120 (see FIG. 52C) formed by punching a metal hoop material with a press.

Copper, which has a comparatively high thermal conductivity among the metals (thermal conductivity of copper is about 398 W/m·K) is preferred as a material for the second metal plate, but copper is not a limiting material and, for example, phosphorus bronze or a copper alloy (for example, 42 Alloy) may be used. It is also preferred that the thickness of the second metal plate be set, for example, within a range of from about 100 μm to about 1500 μm.

Figure 52A:
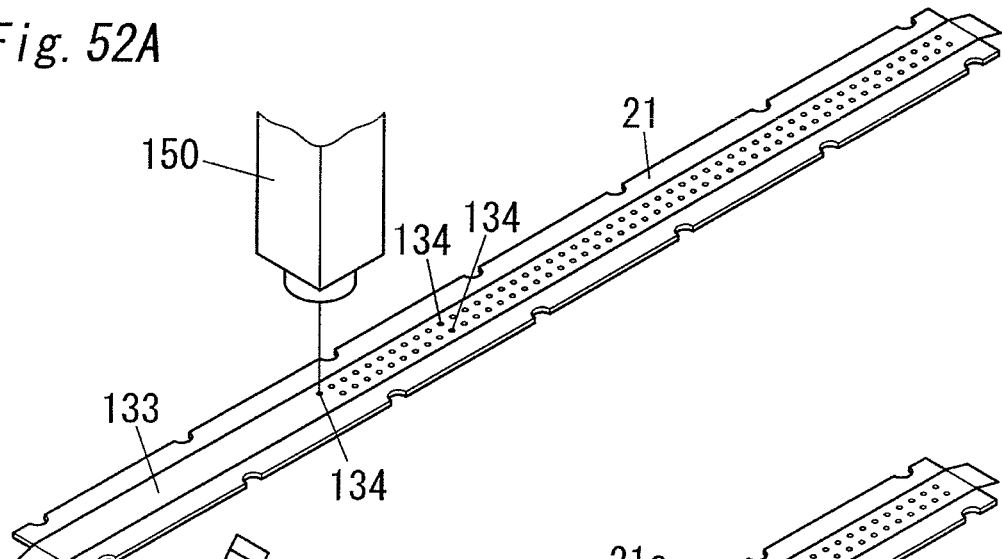
FIG. 52 is an explanatory drawing illustrating a method for manufacturing the mounting substrate in the two-face light emitting unit of Embodiment 7.
Figure 52B:
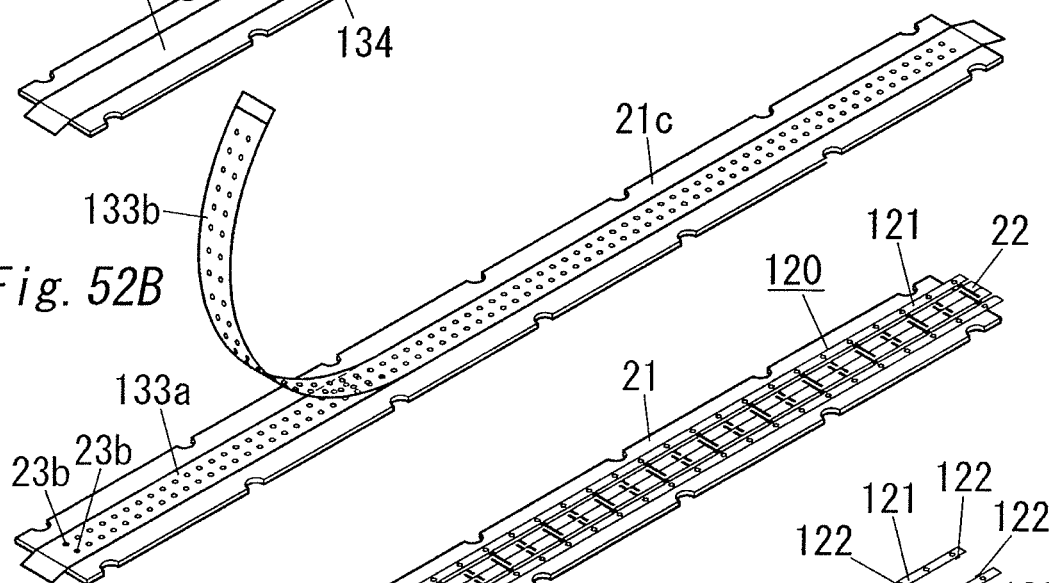
Figure 52C:
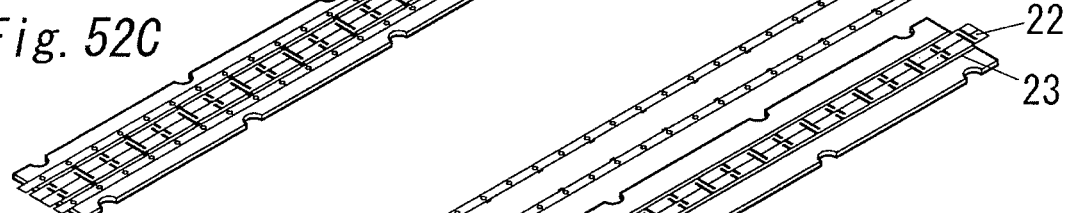
Figure 52D:
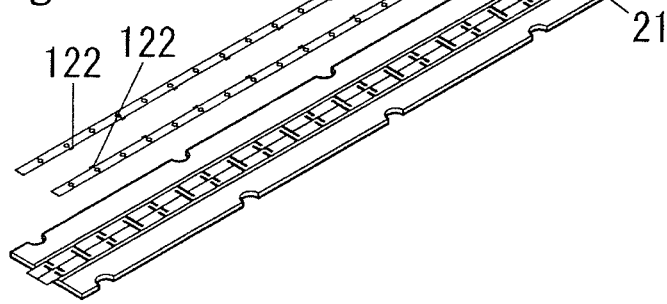

In the lead frame 120, the wiring pattern 22 is supported inside of the outer frame section 121 through the support piece 122 (see FIG. 52D).

In the wiring pattern 22, a first pattern 22a to which the first electrode 31 of the solid-state light emitting element 3 is connected and a second pattern 22b to which the second electrode 32 is connected are arranged in rows in the width direction of the heat transfer plates 21, 24. Further, in the wiring pattern 22, a predetermined number (for example, 16 of each pattern) of the first patterns 22a and the second patterns 22b is provided and the first patterns 22a and the second patterns 22b are disposed in rows in the longitudinal direction of the heat transfer plates 21, 24 (see FIG. 50). The first pattern 22a and the second pattern 22b are formed in an elongated shape and disposed so that the longitudinal direction thereof matches that of the heat transfer plates 21, 24. Further, in the wiring pattern 22, the first patterns 22a arranged in a row in the longitudinal direction of the heat transfer plates 21, 24 are divided into sets, each set including two first patterns, and the first patterns 22a constituting the set are coupled to each other by a connection piece 22c. Further, in the wiring pattern 22, the second patterns 22b that are arranged in a row in a predetermined number (for example, 16) in the longitudinal direction of the heat transfer plates 21, 24 are divided into sets, each set including two second patterns, and the second patterns 22b forming the set are coupled to each other and electrically connected by a connection piece 22d. The connection pieces 22c, 22d are constituted by linear first portions 22ca, 22da disposed along the width direction of the heat transfer plates 21, 24 and second portions 22cb, 22db and third portions 22cc, 22dc extending in the opposite directions in the longitudinal direction of the heat transfer plate 21 from both ends of the first portions 22ca, 22da in the longitudinal direction. Further, the connection piece 22c is formed to be narrower than the first pattern 22a, and the connection piece 22d is formed to be narrower than the second pattern 22b. In this case, in the wiring pattern 22, one base pattern 22u is constituted by two first patterns 22a forming a set, the connection piece 22c that connects those two first patterns 22a, two second patterns 22b forming a set, and the connection piece 22d that connects those two second patterns 22b. In the above-described lead frame 120, a plurality of base units 22u is arranged along the lengthwise direction of the outer frame section 121. Further, in the wiring pattern 22, in the base patterns 22u adjacent in the longitudinal direction of the heat transfer plates 21, 24, the first pattern 22a of one base pattern 22u and the second pattern 22b of the other base pattern 22u are coupled together and electrically connected by the linking piece 22e. The linking piece 22e is formed to be narrower than the first pattern 22a and the second pattern 22b.

In the wiring pattern 22, a parallel circuit can be configured for each base pattern 22u by connecting in parallel a predetermined number (for example, six) of the solid-state light emitting elements 3 that are disposed in rows in the longitudinal direction of the heat transfer plates 21, 24, and the parallel circuits formed for each of the adjacent base patterns 22u can be connected in series. Therefore, power can be supplied to all of the solid-state light emitting elements 3 by supplying power between the first pattern 22a at one end and the second pattern 22b at the other end in the longitudinal direction of the heat transfer plate 21, and between the first pattern 22a at one end and the second pattern 22b at the other end in the longitudinal direction of the heat transfer plate 24.

The insulating layers 23, 25 are formed by thermally curing an epoxy resin layer of a thermosetting sheet-shaped adhesive (for example, an adhesive sheet TSA manufactured by Toray Industries, Inc.) in which a plastic film (PET film) is laminated with a B-stage epoxy resin layer (thermosetting resin) that includes a filling material formed of a filler such as silica or alumina and can reduce the viscosity and increase the flowability under heating. An insulating material with a thermal conductivity higher than that of the epoxy resin, which is a thermosetting resin, may be used as the filler. In this case, the epoxy resin layer of the sheet-shaped adhesive features electric insulation ability, a high thermal conductivity, high flowability under heating, and high ability to adhere to a rough surface. Therefore, it is possible to prevent the appearance of gaps between the first insulating layer 23 and the heat transfer plate 21 or the wiring pattern 22 and between the first insulating layer 25 and the heat transfer plate 24 or the wiring pattern 22, adhesion reliability is increased, and the increase in thermal resistance or the appearance of spread caused by insufficient adhesion can be inhibited. In this case, thermal resistance from each solid-state light emitting element 3 to the wiring pattern 22 can be reduced, spread in thermal resistance can be also reduced, heat radiation ability can be increased and the increase in temperature of the junctions of the solid-state light emitting elements 3 can be inhibited compared with those attained in the case where a heat radiating sheet in the form of a rubber sheet such as SARCON (registered trade name) is sandwiched between the heat transfer plate 21 and the wiring pattern 22 and between the heat transfer plate 24 and the wiring pattern 22. Therefore, the input power can be increased and the light output can be increased. The thickness of the aforementioned epoxy resin layer is set to 100 μm, but this value is merely exemplary and not limited. For example, the thickness of the epoxy resin layer may be set, as appropriate, within a range of about 50 μm to about 150 μm. The thermal conductivity of the aforementioned epoxy resin layer is preferably equal to or higher than 4 W/m·K. Prior to laminating the wiring pattern 22 and the heat transfer plates 21, 24, the plastic film of the sheet-shaped adhesive is peeled off from the epoxy resin layer. In short, the plastic film is peeled off after one surface on the side opposite to the plastic film in the epoxy resin layer has been fixedly attached to the object.

In this case, when the insulating layers 23, 25 are formed, a pressure may be applied, as appropriate, in a state in which the heat transfer plates 21, 24, the epoxy resin layer, and the lead frame 120 having the wiring pattern 22 are laminated.

The outer size of the insulating layers 23, 25 may be set, as appropriate, on the basis of the outer size of the lead frame 120. In this case, the insulating layers 23, 25 are electrically insulating and thermally conductive and have a function of electrically insulating and a function of thermally joining the heat transfer plates 21, 24 and the wiring pattern 22.

Further, through holes 23b, 25b communicating with respective through holes 21b, 24b of the heat transfer plates 21, 24 are formed in the insulating layers 23, 25. Therefore, when the two-side light emitting unit 1 is manufactured, the wires 26 can be passed through the through holes 21b, 24b of the heat transfer plates 21, 24 and the through holes 23b, 25b of the insulating layers 23, 25 and bonded to the wiring pattern 22. In this case, when the two-side light emitting unit 1 is manufactured, after the first electrode 31 and the second electrode 32 of the solid-state light emitting element 3 have been connected by the wires 26 to the first pattern 22a and the second pattern 22b, respectively, the material for the sealing section 36 (see FIG. 49) may be loaded into the through holes 21b, 24b and the through holes 23b, 25b, for example by using a dispenser, to prevent the wires 26 from coming into contact with the first metal plate, and the sealing section 36 may be formed thereafter.

Incidentally, it is preferred that the wiring pattern 22 be formed of a metal material that has oxidation resistance and corrosion resistance higher than those of the second metal plate and that surface treated layers (not shown in the figure) with high adhesion to the insulating layers 23, 25 be formed. When the material for the second metal plate is Cu, it is preferred that, for example, a Ni film, a laminated film of a Ni film and an Au film, or a laminated film of a Ni film, a Pd film, and an Au film be formed as each of the surface treated layers. The surface treated layers may be formed, for example, by a plating method.

Incidentally, depending on thermal capacity of the heat transfer plates 21, 24, when the abovementioned epoxy resin layer is cured by raising the heating temperature thereof to about 170° C., the ability of the heat transfer plates 21, 24 and the wiring pattern 22 to be fixedly attached to each other can be degraded, and when the curing is performed at a heating temperature reduced to about 150° C., electric insulation between the heat transfer plates 21, 24 and the wiring pattern 22 can be degraded. Thus, there is a trade-off relationship between the attachment ability and electric insulation ability. Accordingly, in the present embodiment, as described hereinbelow, the epoxy resin layers 123a, 133a (see FIG. 51C and FIG. 52B) of the sheet-shaped adhesives 123, 133 (see FIG. 51B and FIG. 52A) are laminated, one epoxy resin layer 123a is cured at 170° C., thereby ensuring electric insulation ability and thermal conductivity, and the other epoxy resin layer 133a is cured at 150° C. to ensure the attachment ability and thermal conductivity. More specifically, after the one epoxy resin layer 123a has been attached to the heat transfer plate 21, which is an object, at a temperature of 170° C., the other epoxy resin layer 133a and the lead frame 120 may be laminated and this other epoxy resin layer 133a may be cured at a temperature of 150° C. As a result, when the two-side light emitting unit 1 of the present embodiment is manufactured, the requirements relating to the attachment ability and electric insulation ability can be satisfied at the same time regardless of thermal capacity of the heat transfer plates 21, 24.

A method for joining together the heat transfer plate 21 and the wiring pattern 22 is explained below in a simple manner with reference to FIG. 51 and FIG. 52.

Figure 51A:
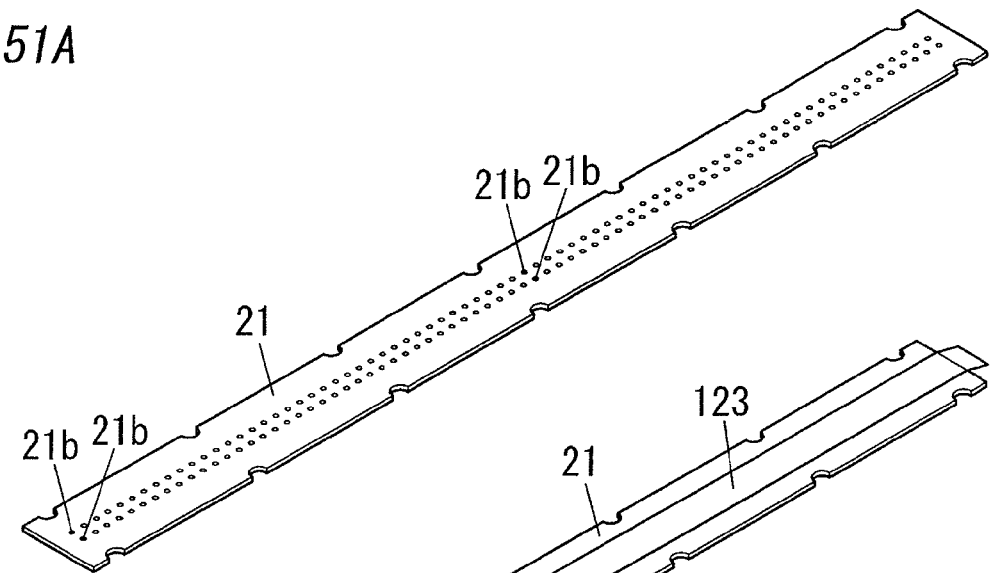
FIG. 51 is an explanatory drawing illustrating a method for manufacturing the mounting substrate in the two-face light emitting unit of Embodiment 7.

First, the structure shown in FIG. 51A is obtained by forming the through holes 21b in the heat transfer plate 21.

Figure 51B:
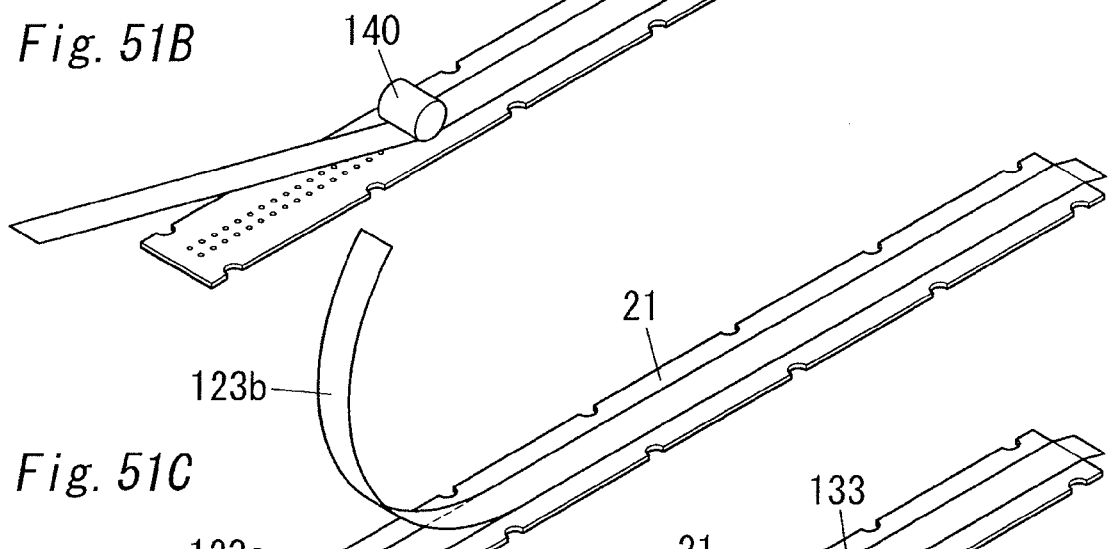

Then, as shown in FIG. 51B, the sheet-shaped adhesive 123 is laminated on the abovementioned other surface side of the heat transfer plate 21 so that the epoxy resin layer 123a comes into contact with the heat transfer plate 21, and the sheet-shaped adhesive 123 is tentatively attached to the heat transfer plate 21 by applying a predetermined pressure (for example, 0.5 MPa) with a round columnar rubber roller 140 and heating to a first predetermined temperature (for example, 110° C. to 120° C.) that is lower than the curing temperature of the epoxy resin layer 123a. The sheet-shaped adhesive 123 is then cut to an appropriate length.

Figure 51C:
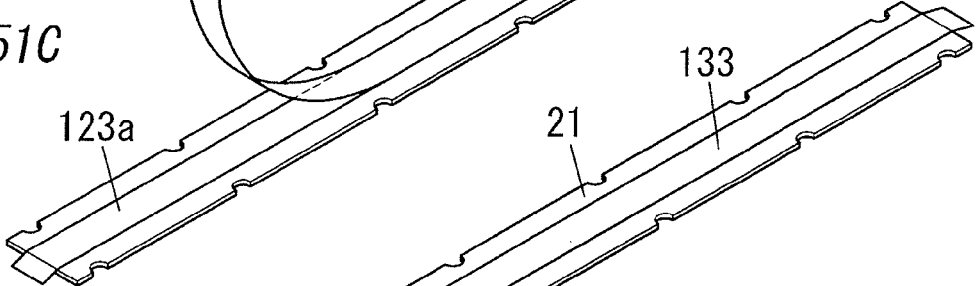
Figure 51D:
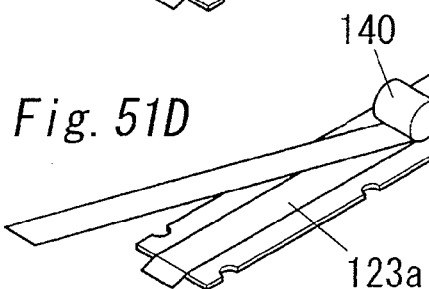

Then, the heat transfer plate 21 to which the sheet-shaped adhesive 123 has been tentatively attached is naturally cooled. The plastic film 123b is then peeled off from the epoxy resin layer 123a as shown in FIG. 51C.

Then, the heat transfer plate 21 to which the epoxy resin layer 123a has been tentatively attached is loaded into a drying furnace (not shown in the figure) and the epoxy resin layer 123a is heated and cured at a temperature (for example, 170° C.) that is equal to or higher than the abovementioned curing temperature, thereby attaching the epoxy resin layer 123a to the heat transfer plate 21.

Then, the sheet-shaped adhesive 133 is laminated on the epoxy resin layer 123a so that the epoxy resin layer 133a comes into contact with the epoxy resin layer 123a, and the sheet-shaped adhesive 133 is tentatively attached to the epoxy resin layer 123a by applying a predetermined pressure (for example, 0.5 MPa) with the round columnar rubber roller 140 and heating to a first predetermined temperature (for example, 110° C. to 120° C.) that is lower than the curing temperature of the epoxy resin layer 133a. The sheet-shaped adhesive 133 is then cut to an appropriate length.

In the laminated structure of the epoxy resin layer 123a and the epoxy resin layer 133a, through holes 134 are formed, for example, with the laser apparatus 150, as shown in FIG. 52A, in the regions corresponding to the through holes 23b of the insulating layer 23. Means for forming the through holes 134 is not limited to the laser apparatus 150, and for example a drill or the like may be also used.

Then, as shown in FIG. 52B, the plastic film 133b is peeled off from the epoxy resin layer 133a.

Then, as shown in FIG. 52C, the lead frame 120 is placed on the epoxy resin layer 133a, an appropriate load is applied, and then the epoxy resin layer 133a is cured inside a drying furnace (not shown in the figure) at a temperature (for example, 150° C.) equal to or higher than the abovementioned curing temperature, thereby fixedly attaching the lead frame 120 and the epoxy resin layer 133a to each other. The insulating layer 23 is thus formed.

Then, the wiring pattern 22 is cut off from the support piece 122 of the lead frame 120 and the portions of the lead frame 120 other than the wiring pattern 22 are taken out as shown in FIG. 52D.

The mounting substrate 2 is then obtained by joining the heat transfer plate 24 and the wiring pattern 22 through the insulating layer 25, in the same manner as the heat transfer plate 21 and the wiring pattern 22 are joined through the insulating layer 23.

In the manufacture of the two-side light emitting unit 1, the solid-state light-emitting elements 3 may be joined to the above-mentioned one surface side of the heat transfer plates 21, 24 and then the first electrode 31 and the second electrode 32 of each solid-state light emitting element 3 may be electrically connected, through the wires 26, to the first pattern 22a and the second pattern 22b, respectively. Then, the sealing section 36 and the color conversion unit 37 may be provided, as necessary, on the abovementioned one surface side of each of the heat transfer plates 21, 24.

As described hereinabove, the two-side light emitting unit 1 of the present embodiment comprises a pair of heat transfer plates 21, 24 formed of the first metal plate and disposed at a distance from each other in the thickness direction, the solid-state light emitting elements 3 mounted on the aforementioned one surface sides of the pair of heat transfer plates 21, 24, being on the side opposite to surface sides of the pair of heat transfer plates that face each other, the wiring pattern 22 that is formed of the second metal plate, disposed between the two heat transfer plates 21 and 24 and electrically connected to the solid-state light emitting elements 3, and a pair of insulating layers 23, 25 interposed between the heat transfer plate 21 and the wiring pattern 22 and between the heat transfer plate 24 and the wiring pattern 22, respectively. As a result, in the two-side light emitting unit 1 of the present embodiment, the heat generated by the solid-state light emitting elements 3 can be transferred efficiently in the transverse direction by the heat transfer plates 21, 24 and radiated. Therefore, in the two-side light emitting unit 1 of the present embodiment, the heat radiation ability can be increased, the increase in temperature of the solid-state light emitting elements 3 can be inhibited, and the light output can be increased.

Further, in the two-side light emitting unit 1 of the present embodiment, by configuring the solid-state light emitting elements 3 as LED chips, it is possible to transfer the heat generated by the LED chips in the transverse direction by the heat transfer plates 21, 24 and radiate the heat efficiently.

Further, in the two-side light emitting unit 1 of the present embodiment, the first metal plates which serve as foundations of the heat transfer plates 21, 24 are aluminum plates, an aluminum film with a purity higher than that of the aluminum plates is laminated on the sides of the aluminum plates opposite those of the insulating layers 23, 25, and reflection increasing films formed of dielectric films of two types that have different refractive indexes are laminated on the aluminum films. As a result, the light that has been radiated from the LED chips and has fallen on the abovementioned one surfaces of the heat transfer plates 21, 24 is reflected with good efficiency. In short, in the two-side light emitting unit 1, by using the plates having the function of a reflecting plate as the heat transfer plates 21, 24, it is possible to reduce the light loss in the heat transfer plates 21, 24 and increase the light output. In particular, when an LED chip is used as the solid-state light emitting element 3 in the two-side light emitting unit 1, the heat generated by the LED chip can be radiated with good efficiency, the light output can be increased and the utilization efficiency of the light emitted from the LED chip can be increased. Further, when the two-side light emitting unit 1 is provided with the color conversion unit 37 (see FIG. 49), the light emitted from the fluorescent material, which is the wavelength conversion material of the color conversion unit 37, to the heat transfer plates 21, 24 sides and the light emitted from the LED chip and scattered by the fluorescent material toward the heat transfer plates 21, 24 sides can be reflected and therefore the light utilization efficiency can be increased.

Further, since the two-side light emitting unit 1 of the present embodiment is provided with the heat transfer plates 21, 24 and the wiring pattern 22 formed using the lead frame 120, the cost can be reduced and the light output can be increased by comparison with those in the case in which the solid-state light emitting elements 3 are mounted on two metal base printed wiring boards.

Further, in the two-side light emitting unit 1 of the present embodiment, the solid-state light emitting element 23 is an LED chip, the first electrode 31 and the second electrode 32 are provided on one surface side in the thickness direction, the first electrode 31 and the second electrode 32 are electrically connected, through wires 26, to the wiring pattern 22, and the through holes 21b, 24b for inserting the wires 26 are formed in the heat transfer plates 21, 24. Therefore, the LED chips can be die bonded to the heat transfer plates 21, 24, the heat generated by the LED chips can be easily transferred in the transverse direction of the heat transfer plates 21, 24, and the heat radiation ability can be increased.

Further, when LED chips are used as the solid-state light emitting elements 3, die bonding to the heat transfer plates 21, 24 may be performed by using a sub-mount member that relieves stresses acting upon the LED chips due to the difference in linear expansion coefficient between the solid-state light emitting elements 3 and the heat transfer plates 21, 24. In this case, it is preferred that the sub-mount member be used that is formed to a planar size larger than the chip size of the LED chip. When the LED chip is a GaN blue LED chip and the first metal plate is an aluminum plate, for example, AlN, SiC composite, Si, or CuW can be used as the material for the sub-mount member. Further, it is preferred that in the sub-mount member, a reflective film that reflects light emitted from the LED chip be formed around a jointing section of the LED chip and the sub-mount member (that is, a section that overlaps the LED chip) on the surface of the sub-mount member on the side where the LED chip is to be joined. When a chip in which electrodes are provided on both surfaces in the thickness direction is used as the LED chip, a conductive pattern that is electrically connected to the first electrodes 31 or second electrodes 32 disposed in the LED chips on the sub-mount member side may be provided at the sub-mount member and the conductive pattern may be electrically connected, through the wires 26, to the first pattern 22a or the second pattern 22b.

Figure 56:
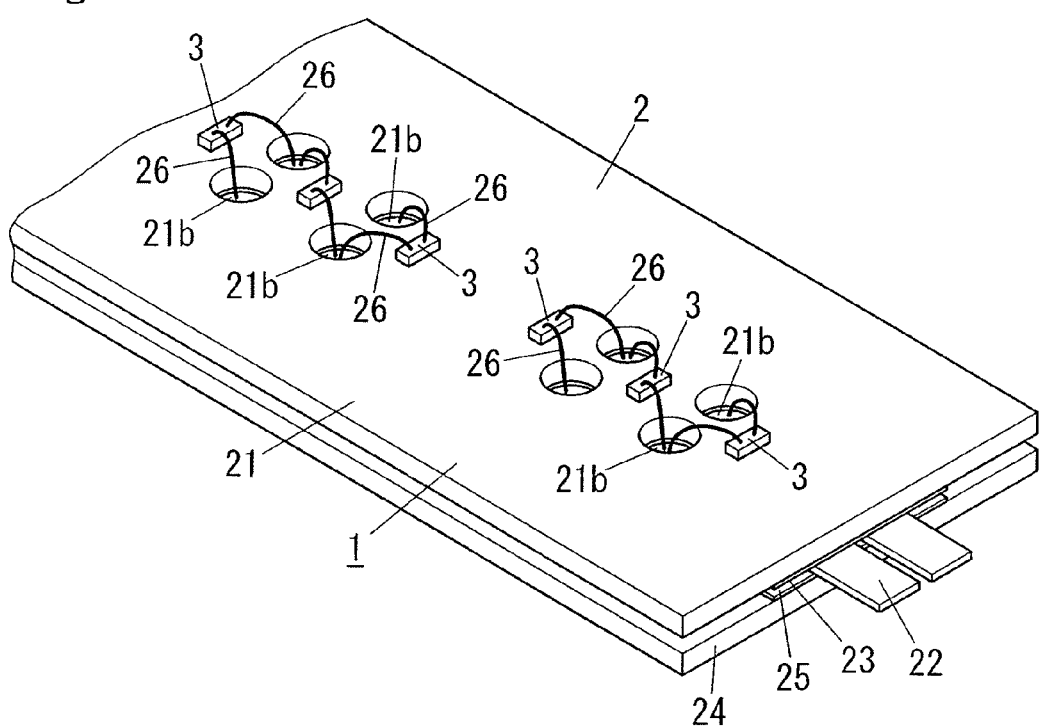
FIG. 56 is a partially broken principal perspective view illustrating yet another configuration example of the two-face light emitting unit of Embodiment 7.

In the above-described two-side light emitting unit 1, the through holes 21b are formed at both sides of the mounting region of the solid-state light emitting elements 3 in the width direction of the heat transfer plate 21. In other words, the solid state light emitting element 3 is mounted on the zone between two through holes 21b arranged in a row in the width direction of the heat transfer palate 21, but such configuration is not limited. For example, as shown in FIG. 56, it is also possible to dispose the solid-state light emitting element 3 between two sets (of the through holes) arranged in a row in the longitudinal direction of the heat transfer plate 21 from among the sets, each of which includes two through holes 21b that are arranged in rows in the width direction of the heat transfer plate 21. The arrangement similar to that shown in FIG. 56 may be also used with respect to the solid-state light emitting elements 3 mounted on the heat transfer plate 24.

Figure 57:
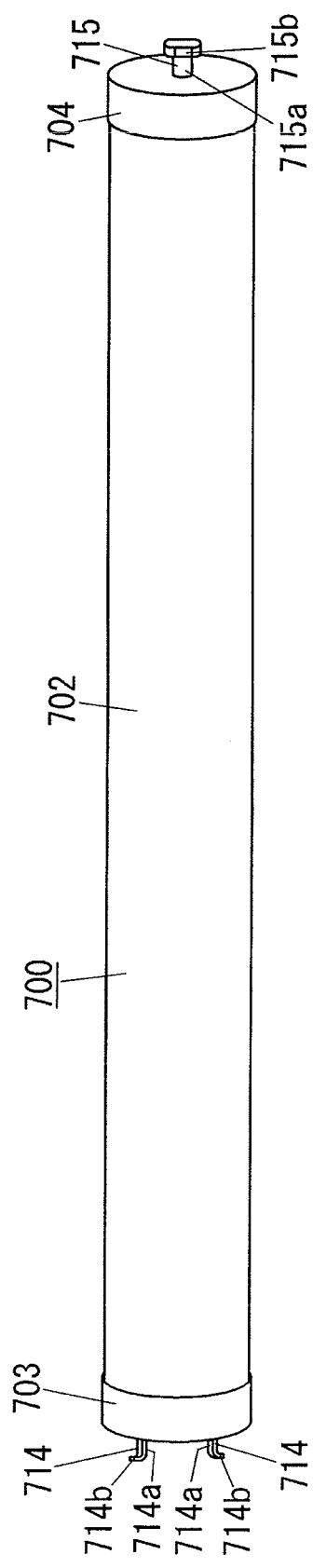
FIG. 57 is a schematic perspective view of the illuminating apparatus of Embodiment 7.

The two-side light emitting unit 1 of the present embodiment can be used as a light source for a variety of illuminating apparatuses. For example, an LED lamp 700 of a straight tube type, such as shown in FIG. 57, can be configured as an example of the illuminating apparatus provided with the two-side light emitting unit 1 of the present embodiment. The Japan Electric Lamp Manufacturers Association issued a standard for "LED lamp systems of a straight tube type with L-shaped pin base GX16t-5 (for general illumination)" (JEL 801) with respect to typical LED lamps of a straight tube type, and the LED lamp 700 of a straight tube type shown in FIG. 57 conforms to the JEL 801 standard.

The LED lamp 700 of a straight tube type shown in FIG. 57, is provided with a straight tubular body 702 formed of a translucent material (for example, glass) and bases 703, 704 provided at one end and the other end of the tubular body 702 in the longitudinal direction, respectively. The above-described two-side light emitting unit 1 (see FIG. 46 etc.) is accommodated inside the tubular body 702.

The base 703 provided at one end of the tubular body 702 in the longitudinal direction is provided with two first lamp pins (terminals) 714 for supplying power to the two-side light emitting unit 1 located inside the tubular body 702 and also for holding at the first lamp socket, from among the first lamp socket and the second lamp socket of an illuminating apparatus. The base 704 at the other end of the tubular body 702 in the longitudinal direction is provided with one second lamp pin (terminal) 715 for grounding and holding in the second lamp socket.

The two first lamp pins 714 protrude from the end surface (first base reference surface) of the base 703 toward the side opposite to the tubular body 702. In this case, the first lamp pin 714 is electrically connected to the wiring pattern 22 of the two-side light emitting unit 1 accommodated inside the tubular body 702.

In each of the first lamp pins 714, a portion protruding from the end surface of the base 703 has a L-like shape and is constituted by a pin main body 714a protruding along the longitudinal direction of the tubular body 702 and a key portion 714b extending from the distal end portion of the pin main body 714a in one diametrical direction of the tubular body 702. In this case, the two key portions 714b protrude in the mutually opposite directions. The first lamp pin 714 is formed by bending a narrow conductive plate.

The second lamp pin 715 protrudes from the end surface (second base reference surface) of the base 704 toward the side opposite to the tubular body 702. In this case, in the second lamp pin 715, a portion protruding from the end surface of the base 704 has a T-like shape and is constituted by a pin main body 715a protruding along the longitudinal direction of the tubular body 702 and a terminal portion 715b that is provided at the distal end of the pin may body 715a and has an elliptical shape in the front view thereof.

Figure 66:
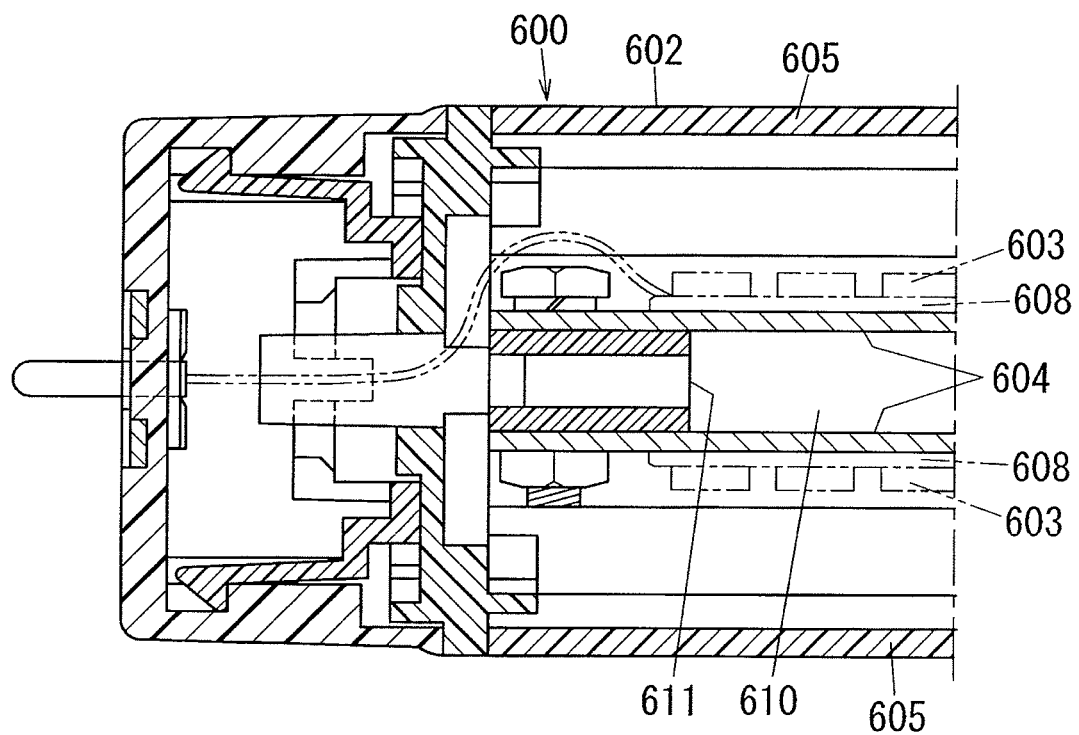
FIG. 66 is a principal cross-sectional view of the illuminating apparatus of the conventional example.
Figure 67:
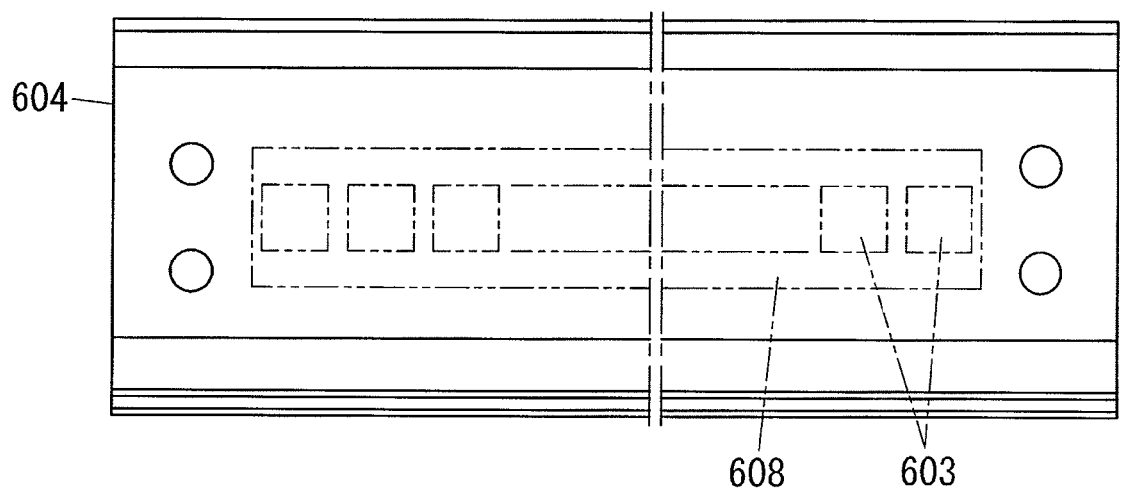
FIG. 67 is a partially cut-out planar view of an attachment substrate in a light-emitting unit body of the conventional example.

In the LED lamp 700 of a straight tube type of the present embodiment, the heat radiation ability can be increased and the light output can be also increased by comparison with those of the conventional LED lamp of a straight tube type and the illuminating apparatus 600 shown in FIG. 66.

The illuminating apparatus provided with the two-side light emitting unit 1 of the present embodiment is not limited to the above-described LED lamp 700 of a straight tube type and may be, for example, an illuminating fixture provided with the fixture body accommodating the two-side light emitting unit 1. In the two-side light emitting unit 1 of this configuration, semicircular notches 21c, 24c are formed substantially equidistantly in the longitudinal direction of the heat transfer plates 21, 24 at both side edges in the width direction of the heat transfer plates 21, 24. Therefore, where the notches 21c, 24c in the heat transfer plates 21, 24 of the two-side light emitting unit 1 are formed as semicircles with a radius less than that of the round head sections of screws for attaching the two-side light emitting unit 1 to the fixture body, the two-side light emitting unit 1 can be held between the head sections of the screws and the fixture body. In such an illuminating apparatus, stresses applied to the solid-state light emitting elements 3 and joining sections 35 can be reduced.

By using the above-described two-side light emitting unit 1 in the illuminating apparatus of the above-described present embodiment, it is possible to increase the heat radiation ability and also increase the light output.

The arrangement of the two-side light emitting unit 1 in the illuminating apparatus is not particularly limited. For example, in the illuminating apparatus, a plurality of two-side light emitting units 1 may be disposed in row on a straight line. In this case, the wiring patterns 22 of the adjacent two-side light emitting units 1 may be electrically connected to each other by an electric cable (not shown in the figure) for extended connection or a connector (not shown in the figure). As a result, in the illuminating apparatus provided with a plurality of two-side light emitting units 1, power can be supplied from one power supply unit to a series circuit of the two-side light emitting units 1 and all of the solid-state light emitting elements 3 of each two-side light emitting unit 1 can be caused to emit light.

(Embodiment 8)

Figure 58:
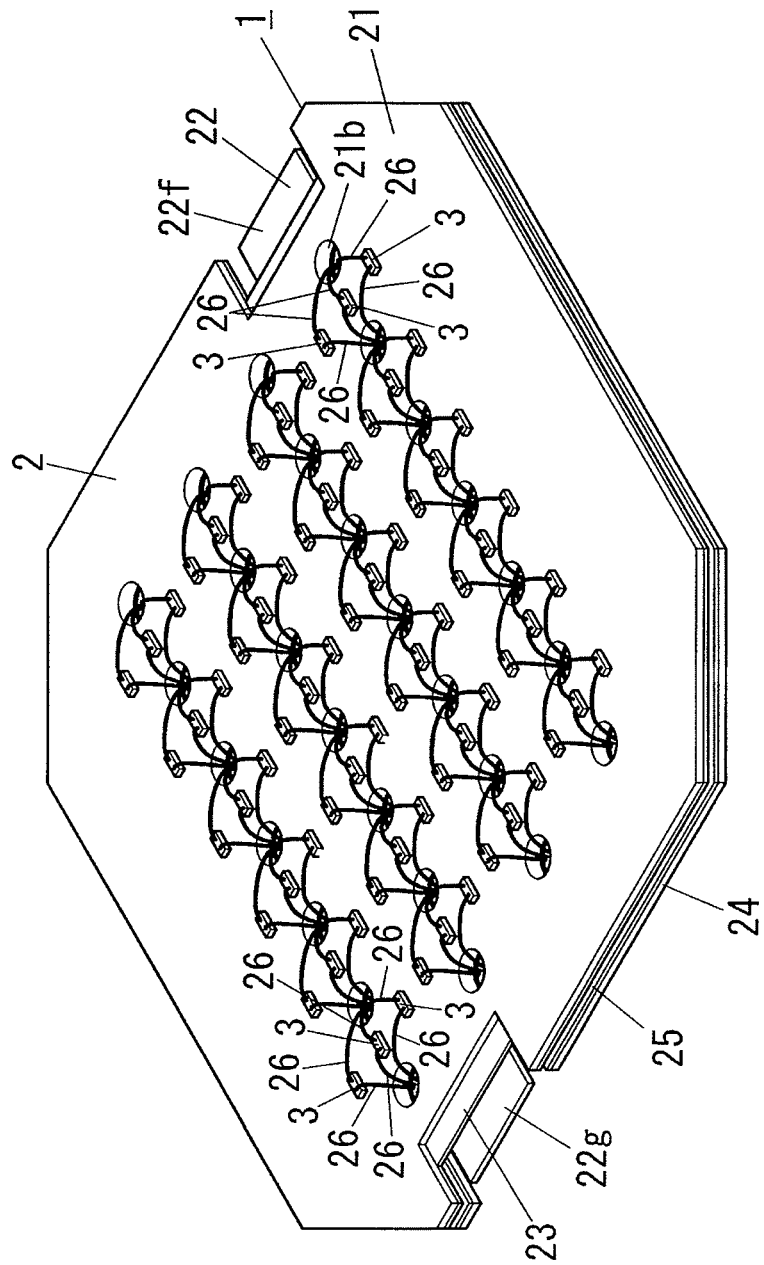
FIG. 58 is a schematic perspective view of the two-face light emitting unit of Embodiment 8.

The two-side light emitting unit 1 of the present embodiment is explained below with reference to FIG. 58. In the present embodiment, the two-side light emitting unit 1 constitutes a light emitting unit.

The basic configuration of the two-side light emitting unit 1 of the present embodiment is substantially identical to that of Embodiment 7, the difference therebetween being in the shape of the mounting substrate 2. The constituent elements same as those of Embodiment 7 are assigned with same reference numerals and the explanation thereof is herein omitted.

In the two-side light emitting unit 1 of the present embodiment, the heat transfer plates 21, 24 have an octagonal shape in the planar view thereof, and a plurality (12×6 in the example shown in the figure) of solid-state light emitting elements 3 are disposed in a two-dimensional array at the abovementioned one surface side of each of the transfer plates 21, 24. In this case, the shape of the transfer plates 21, 24 is not limited to the octagonal shape and may be another polygonal shape, or a round shape or an elliptical shape.

The wiring pattern 22 in the two-side light emitting unit 1 of the present embodiment is also formed using a lead frame (not shown in the figure). Further, in the two-side light emitting unit 1, power can be supplied from a power supply unit by connecting electric cables 63, 63 (see FIG. 59), through soldering or the like, to the first terminal pattern 22f and the second terminal pattern 22g, respectively, of the wiring pattern 22.

In the two-side light emitting unit 1 of the present embodiment, similarly to the two-side light emitting unit 1 of Embodiment 7, heat radiation ability can be increased and the light output can be also increased.

Figure 59:
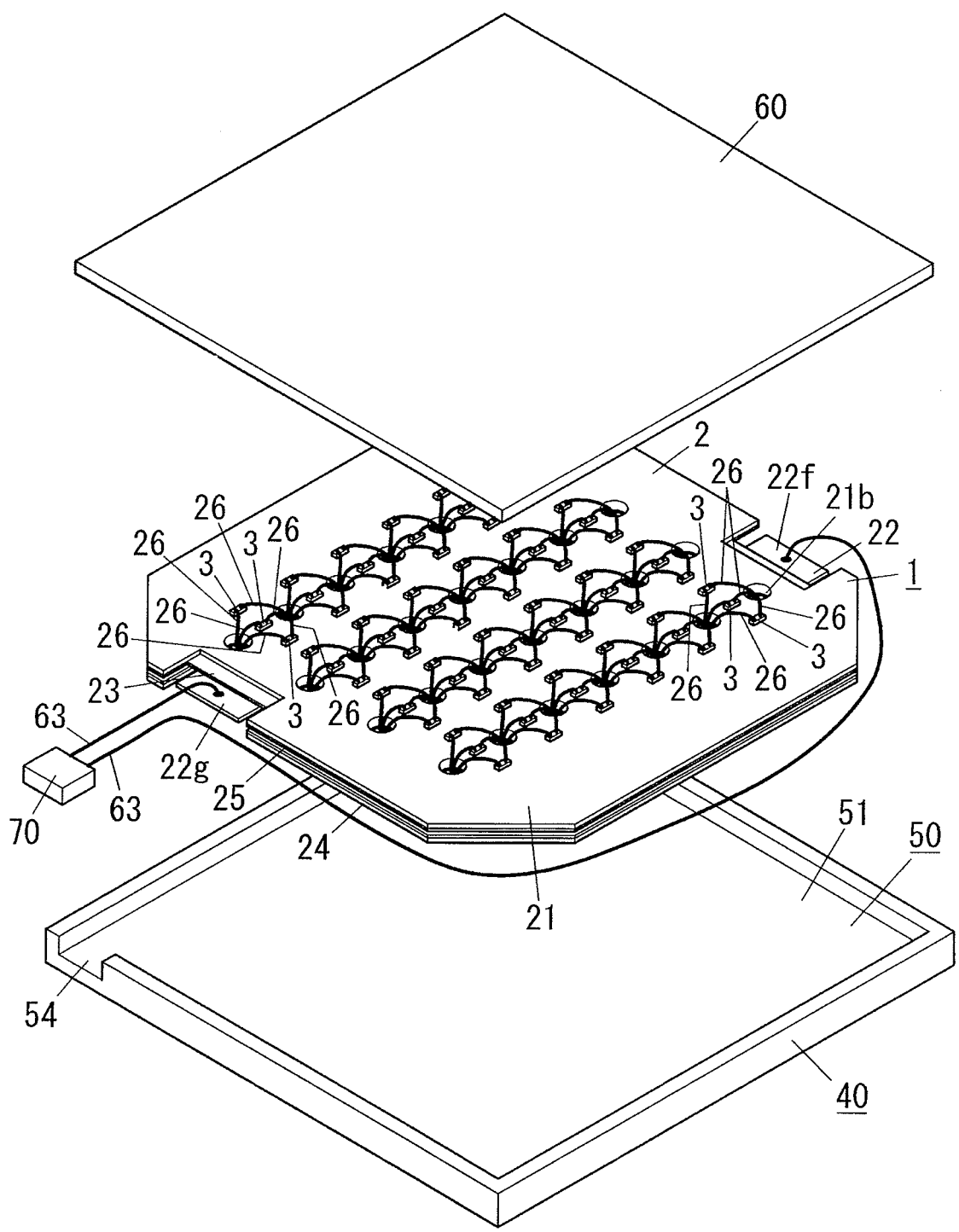
FIG. 59 is a schematic exploded perspective view of the illuminating apparatus of Embodiment 8.

The illuminating fixture 40 configured as shown in FIG. 59 is an example of the illuminating apparatus provided with the above-described two-side light emitting unit 1.

In the illuminating fixture 40 configured as shown in FIG. 59, the fixture body is constituted by a flat first cover member 50 provided with an accommodation recess 51 for accommodating the two-side light emitting unit 1 at one surface in the thickness direction and a second cover member 60 accommodated in the recess 51 of the first cover member 50 so as to cover the two-side light emitting unit 1. Spacers (not shown in the figure) are provided between the two-side light emitting unit 1 and the first cover member 50 and between the two-side light emitting unit 1 and the second cover member 60. A cut-out section 54 for inserting the electric cables 63, 63 for feeding power to the two-side light emitting unit 1 is formed in the first cover member 50. In this configuration, the electric cables 63, 63 are provided with a second connector 70, which is detachably connected to a first connector (not shown in the figure) for the output of a power supply unit (not shown in the figure) provided as separate placement, at the ends opposite those connected to the first terminal pattern 22f and the second terminal pattern 22g of the two-side light emitting unit 1.

For example, the first cover member 50 and the second cover member 60 may be formed entirely from a translucent material, or only a portion for taking out the light emitted from the two-side light emitting unit 1 may be formed of a translucent material. The shape and configuration of the illuminating fixture constituting the illuminating apparatus are not particularly limited. Furthermore, the illuminating apparatus is not limited to the illuminating fixture 40 and may be, for example, a display device.

By providing the above-described two-side light emitting unit 1 in the illuminating apparatus of the present embodiment that is explained hereinabove, it is possible to increase the heat radiation ability and also increase the light output.

The invention claimed is:

1. A light emitting unit comprising: a mounting substrate; and a plurality of solid-state light emitting elements disposed on one surface side of the mounting substrate,
    wherein the mounting substrate is provided with a heat transfer plate which is formed of a first metal plate and in which the solid-state light emitting elements are mounted on one surface side of the heat transfer plate, a wiring pattern which is formed of a second metal plate and disposed on an opposing side of the heat transfer plate from the solid-state light emitting elements and to which the solid-state light emitting elements are electrically connected, and an insulating layer interposed between the heat transfer plate and the wiring pattern,
    wherein the solid-state light emitting elements are LED chips,
    wherein each of the LED chips is provided with a first electrode and a second electrode on one surface side of each of the LED chips in a thickness direction, the first electrode and the second electrode are electrically connected, through wires, to the wiring pattern, and the heat transfer plate is formed with through holes for passing the respective wires therethrough.

2. The light emitting unit according to claim 1, wherein the insulating layer includes a filler in a thermosetting resin, the filler having a thermal conductivity higher than that of the thermosetting resin.

3. The light emitting unit according to claim 1, wherein in the heat transfer plate, the first metal plate is an aluminum plate, an aluminum film with a purity higher than that of the aluminum plate is laminated on a side of the aluminum plate that is opposite to the insulating layer, and a reflection increasing film formed of dielectric films of two types that differ in refractive index is laminated on the aluminum film.

4. The light emitting unit according to claim 1, comprising a color conversion unit that includes a translucent material and a fluorescent material that emits light of a color different from an emission color of the LED chip when excited by light emitted from the LED chip,
    wherein the color conversion unit is in contact with the heat transfer plate.

5. The light emitting unit according to claim 1, wherein the heat transfer plate has an elongated shape, the solid-state light emitting elements are arranged along a longitudinal direction of the heat transfer plate, and an elongated base substrate is provided that has a smaller difference in linear expansion coefficient with the first metal plate than with the second metal plate and is disposed on a side of the wiring pattern that is opposite to the heat transfer plate.

6. The light emitting unit according to claim 5, wherein the base substrate is formed of a resin substrate in which a filler is mixed with a resin, the filler having a thermal conductivity higher than that of the resin.

7. The light emitting unit according to claim 5, wherein the base substrate is formed of a third metal plate made of the same material as that of the first metal plate, and a second insulating layer made of the same material as that of a first insulating layer, which is the insulating layer, is interposed between the base substrate and the wiring pattern.

8. An illuminating apparatus comprising the light emitting unit according to claim 1.

9. The light emitting unit according to claim 1,
    wherein the mounting substrate is provided with, in addition to a first heat transfer plate as the heat transfer plate, a second heat transfer plate formed of the first metal plate and disposed at a distance from the first heat transfer plate in a thickness direction,
    wherein the light emitting unit further comprises, in addition to first solid-state light emitting elements as the solid-state light emitting elements, second solid-state light emitting elements mounted on one surface side of the second heat transfer plate, being on an opposing side of the second heat transfer plate from the first heat transfer plate,
    wherein the mounting substrate is provided with, in addition to a first wiring pattern as the wiring pattern, a second wiring pattern which is formed of the second metal plate, the first and second wiring patterns being disposed between the first and second heat transfer plates, the second solid-state light emitting elements being electrically connected to the second wiring pattern, and
    wherein the mounting substrate is provided with, in addition to a first insulating layer as the insulating layer, a second insulating layer which is interposed between the second wiring pattern and the second heat transfer plate.

10. The light emitting unit according to claim 9, wherein in each of the first and second heat transfer plates, the first metal plate is an aluminum plate, an aluminum film with a purity higher than that of the aluminum plate is laminated on an opposing side of the aluminum plate from a corresponding layer of the first and second insulating layers, and a reflection increasing film formed of dielectric films of two types that differ in refractive index is laminated on the aluminum film.

11. The light emitting unit according to claim 9, further comprising a color conversion unit that includes a translucent material and a fluorescent material that emits light of a color different from an emission color of a corresponding LED chip of the LED chips when excited by light emitted from the corresponding LED chip of the LED chips,
    wherein the color conversion unit is in contact with a corresponding heat transfer plate of the first and second heat transfer plates.

12. An illuminating apparatus comprising the light emitting unit according to claim 9.

* * * * *